(12) United States Patent
Lee et al.

(10) Patent No.: US 12,185,591 B2
(45) Date of Patent: Dec. 31, 2024

(54) DISPLAY DEVICE WITH IMPROVED RELIABILITY AND METHOD OF MANUFACTURING THE DISPLAY DEVICE

(71) Applicant: Samsung Display Co., Ltd., Yongin-si (KR)

(72) Inventors: Gyujeong Lee, Yongin-si (KR); Dongwon Kim, Yongin-si (KR); Sangwoo Kim, Yongin-si (KR); Yongseok Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 444 days.

(21) Appl. No.: 17/564,986

(22) Filed: Dec. 29, 2021

(65) Prior Publication Data
US 2022/0216276 A1   Jul. 7, 2022

(30) Foreign Application Priority Data
Jan. 4, 2021  (KR) .......................... 10-2021-0000447

(51) Int. Cl.
| | |
|---|---|
| *H10K 59/122* | (2023.01) |
| *H10K 50/844* | (2023.01) |
| *H10K 59/12* | (2023.01) |
| *H10K 59/131* | (2023.01) |
| *H10K 71/00* | (2023.01) |

(52) U.S. Cl.
CPC ......... *H10K 59/122* (2023.02); *H10K 50/844* (2023.02); *H10K 59/131* (2023.02); *H10K 71/00* (2023.02); *H10K 59/1201* (2023.02)

(58) Field of Classification Search
None
See application file for complete search history.

(56) References Cited

U.S. PATENT DOCUMENTS

| | | | |
|---|---|---|---|
| 9,276,212 B2 | 3/2016 | Park et al. | |
| 2019/0074459 A1* | 3/2019 | Kim | H10K 59/124 |
| 2020/0203673 A1* | 6/2020 | Kwon | H10K 59/131 |
| 2022/0093698 A1* | 3/2022 | Paek | H10K 59/18 |

FOREIGN PATENT DOCUMENTS

| | | |
|---|---|---|
| CN | 105655360 A | 6/2016 |
| KR | 10-2014-0061898 A | 5/2014 |
| KR | 10-2020-0076148 A | 6/2020 |

* cited by examiner

*Primary Examiner* — Nduka E Ojeh
(74) *Attorney, Agent, or Firm* — Lewis Roca Rothgerber Christie LLP

(57) ABSTRACT

A display device includes a substrate including a display area and a peripheral area outside the display area, an inorganic insulating layer on the substrate, an organic insulating layer on a part of the inorganic insulating layer to expose a first upper surface of the inorganic insulating layer, the first upper surface overlapping the peripheral area, a display element at the display area and including a pixel electrode on the organic insulating layer, a pixel definition layer covering an edge of the pixel electrode and including an opening that overlaps a central portion of the pixel electrode, a first inorganic pattern layer between the organic insulating layer and the pixel definition layer, and a second inorganic pattern layer in contact with the first upper surface of the inorganic insulating layer, wherein the first inorganic pattern layer and the second inorganic pattern layer include a same material.

21 Claims, 53 Drawing Sheets

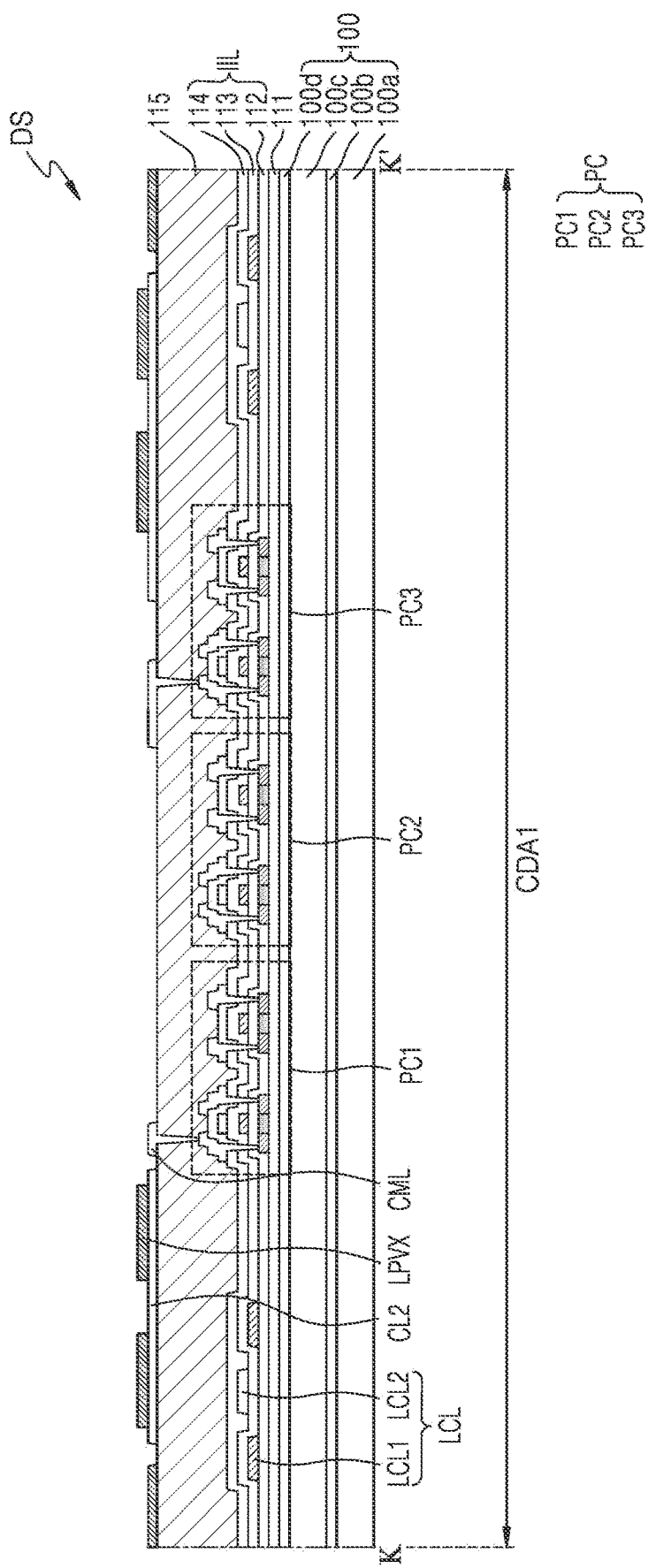

DISPLAY DEVICE WITH IMPROVED RELIABILITY AND METHOD OF MANUFACTURING THE DISPLAY DEVICE

CROSS-REFERENCE TO RELATED APPLICATION

This application claims priority to and the benefit of Korean Patent Application No. 10-2021-0000447, filed on Jan. 4, 2021, in the Korean Intellectual Property Office (KIPO), the entire content of which is incorporated by reference herein.

BACKGROUND

1. Field

One or more embodiments relate to a display device for displaying an image and a method of manufacturing the display device.

2. Description of the Related Art

Electronic devices based on mobility are widely being used. Recently, tablet personal computers are widely used as mobile electronic devices in addition to compact electronic devices such as mobile phones.

Such mobile electronic devices may include display devices to provide various functions, for example, providing visual information such as images and/or videos, to a user. As other components to drive a display device are miniaturized, the portion of the display device in an electronic device is gradually increasing, and a structure capable of being bent at an angle from a flat state has been developed.

SUMMARY

Aspects of one or more embodiments of the present disclosure are directed towards a display device with improved reliability and a method of manufacturing the display device.

Additional aspects will be set forth in part in the description which follows and, in part, will be apparent from the description, or may be learned by practice of the presented embodiments of the disclosure.

According to one or more embodiments, a display device includes a substrate including a display area and a peripheral area outside the display area, an inorganic insulating layer on the substrate, an organic insulating layer on a part of the inorganic insulating layer to expose a first upper surface of the inorganic insulating layer, the first upper surface overlapping the peripheral area, a display element at the display area, the display element including a pixel electrode on the organic insulating layer, a pixel definition layer covering an edge of the pixel electrode, the pixel definition layer including an opening that overlaps a central portion of the pixel electrode, a first inorganic pattern layer between the organic insulating layer and the pixel definition layer, and a second inorganic pattern layer in contact with the first upper surface of the inorganic insulating layer. The first inorganic pattern layer and the second inorganic pattern layer include a same material.

In an embodiment, the inorganic insulating layer may include a first inorganic insulating layer and a second inorganic insulating layer on the first inorganic insulating layer. The display device further including a wiring overlapping the second inorganic pattern layer, the wiring being between the first inorganic insulating layer and the second inorganic insulating layer.

In an embodiment, the second inorganic pattern layer may extend from the first upper surface of the inorganic insulating layer to an upper surface of the organic insulating layer.

In an embodiment, the display area may include a front display area, a first side surface display area extending in a first direction from the front display area, a second side surface display area extending in a second direction crossing the first direction from the front display area, and a corner display area between the first side surface display area and the second side surface display area. The first inorganic pattern layer may be in the corner display area.

In an embodiment, the organic insulating layer may be a lower organic insulating layer. The display device may further comprise an upper organic insulating layer on the lower organic insulating layer, the upper organic insulating layer having a hole overlapping the corner display area. The first inorganic pattern layer may include an upper inorganic pattern layer on the upper organic insulating layer, the upper inorganic pattern layer including a protruding tip that protrudes in a direction toward a center of the hole.

In an embodiment, the display device may further include an encapsulation layer on the display element, the encapsulation layer including an inorganic encapsulation layer and an organic encapsulation layer. The inorganic encapsulation layer is in contact with the protruding tip.

In an embodiment, the first inorganic pattern layer may further include a lower inorganic pattern layer between the lower organic insulating layer and the upper organic insulating layer. The lower inorganic pattern layer may be exposed by the hole.

The display device may further include a pad in the peripheral area, the pad including a pad electrode that is on the inorganic insulating layer. The organic insulating layer includes a pad opening portion that overlaps the pad electrode. The inorganic insulating layer, in the peripheral area, is in contact with any one of the organic insulating layer, the pad electrode, and the second inorganic pattern layer.

In an embodiment, the pad may include a first pad and a second pad. The display device further includes a display circuit board electrically connected to the first pad, and a driving portion electrically connected to the second pad.

The display device may further include a pad wiring electrically connected to the pad, the pad wiring extending to an edge of the peripheral area. The second inorganic pattern layer overlaps the pad wiring and may be on the edge of the peripheral area.

The display device may further include a driving circuit in the peripheral area and including a driving circuit thin film transistor, and an encapsulation layer on the display element, extending toward the peripheral area to overlap at least a part of the driving circuit, and including an inorganic encapsulation layer and an organic encapsulation layer. The organic insulating layer includes a valley hole that overlaps the second inorganic pattern layer. The organic encapsulation layer fills the valley hole.

According to one or more embodiments, a display device includes a substrate including a display area and a peripheral area outside the display area, the display area including a front display area, a first side surface display area extending in a first direction from the front display area, a second side surface display area extending in a second direction crossing the first direction from the front display area, and a corner display area between the first side surface display area and the second side surface display area, an inorganic insulating layer on the substrate, an organic insulating layer on a part of the inorganic insulating layer to expose a first upper surface of the inorganic insulating layer, the first upper surface overlapping the peripheral area, a first inorganic pattern layer on the organic insulating layer, a display element at the corner display area, the display element on the first inorganic pattern layer, and a second inorganic pattern layer in contact with the first upper surface of the inorganic insulating layer. The first inorganic pattern layer and the second inorganic pattern layer include a same material.

In an embodiment, the inorganic insulating layer may include a first inorganic insulating layer and a second inorganic insulating layer on the first inorganic insulating layer. The display device further including a wiring overlapping the second inorganic pattern layer, the wiring being between the first inorganic insulating layer and the second inorganic insulating layer.

In an embodiment, the organic insulating layer may be a lower organic insulating layer. The display device may further comprise an upper organic insulating layer on the lower organic insulating layer, the upper organic insulating including a hole that overlaps the corner display area. The first inorganic pattern layer may include an upper inorganic pattern layer including a protruding tip that protrudes in a direction toward a center of the hole.

The display device may further include an encapsulation layer on the display element, the encapsulation layer including an inorganic encapsulation layer and an organic encapsulation layer. The inorganic encapsulation layer is in contact with the protruding tip.

In an embodiment, the first inorganic pattern layer may further include a lower inorganic pattern layer between the lower organic insulating layer and the upper organic insulating layer. The lower inorganic pattern layer may be exposed by the hole.

In an embodiment, the corner display area may include a first corner display area and a second corner display area between the first corner display area and the front display area. The display device further including a driving circuit that overlaps the second corner display area and the peripheral area, the driving circuit may include a driving circuit thin film transistor. The display element overlaps the driving circuit.

In an embodiment, the organic insulating layer may include a valley hole that overlaps the second inorganic pattern layer. The driving circuit may include a first driving circuit and a second driving circuit that are spaced from each other with the valley hole therebetween.

In an embodiment, the corner display area may include a first corner display area and a second corner display area between the first corner display area and the front display area. The substrate may include a body portion that overlaps the front display area and the second corner display area and a plurality of extension portions that may extend from the body portion, the plurality of extension portions overlapping the first corner display area. Edges of the plurality of extension portions that neighbor each other may be spaced from each other and face each other.

In an embodiment, the first side surface display area, the second side surface display area, and the corner display area may be bent.

The display device may further include a pad that is in the peripheral area, the pad may include a pad electrode on the inorganic insulating layer. The organic insulating layer includes a pad opening portion that exposes the pad electrode. The inorganic insulating layer, in the peripheral area, may be in contact with any one of the organic insulating layer, the pad electrode, and the second inorganic pattern layer.

The display device may further include a pad wiring that is electrically connected to the pad, the pad wiring may extend to an edge of the peripheral area. The second inorganic pattern layer overlaps the pad wiring, the second inorganic pattern layer may extend to the edge of the peripheral area.

According to one or more embodiments, a method of manufacturing a display device includes preparing a display substrate, the display substrate including a substrate including a display area and a peripheral area outside the display area and an inorganic insulating layer on the substrate, forming an organic insulating layer on a part of the inorganic insulating layer to expose a first upper surface of the inorganic insulating layer, the first upper surface overlapping the peripheral area, forming an inorganic layer on the organic insulating layer to overlap the display area and the peripheral area, forming, by at least partially removing the inorganic layer, a first inorganic pattern layer that overlaps the display area and a second inorganic pattern layer that overlaps the first upper surface of the inorganic insulating layer, and forming a display element at the display area.

In an embodiment, the forming the first inorganic pattern layer and the second inorganic pattern layer may include forming a photoresist pattern on the inorganic layer, the photoresist pattern overlapping the first upper surface of the inorganic insulating layer, and etching the inorganic layer.

In an embodiment, the display substrate may further include a pad and a test pad which are with the first upper surface of the inorganic insulating layer therebetween, the pad and the test pad overlapping the peripheral area. The pad and the test pad may be electrically connected to each other through a pad wiring. The method further including inspecting lighting of the display element through the test pad, and removing the test pad by cutting the display substrate along a cutting line crossing the first upper surface of the inorganic insulating layer.

In an embodiment, the display area may include a front display area, a first side surface display area extending in a first direction from the front display area, a second side surface display area extending in a second direction crossing the first direction from the front display area, and a corner display area between the first side surface display area and the second side surface display area. The organic insulating layer may be a lower organic insulating layer. The method may further include forming an upper organic insulating layer on the lower organic insulating layer and forming a hole of the upper organic insulating layer, the hole overlapping the corner display area. The first inorganic pattern layer may include an upper inorganic pattern layer that overlaps the corner display area, the upper inorganic pattern layer may be on the upper organic insulating layer.

In an embodiment, the first inorganic pattern layer may further include a lower inorganic pattern layer that overlaps the corner display area, the first inorganic pattern layer may be between the lower organic insulating layer and the upper organic insulating layer. The hole may expose at least a part of the lower inorganic pattern layer.

The method may further include forming an encapsulation layer on the display element, the encapsulation layer including an inorganic encapsulation layer and an organic encapsulation layer. The upper inorganic pattern layer is in contact with the inorganic encapsulation layer.

The method may further include bending the corner display area, and bonding a cover window to the corner display area.

In an embodiment, the display substrate may further include a driving circuit that may include a driving circuit thin film transistor, the driving circuit in the peripheral area. The organic insulating layer may include a valley hole that overlaps the first upper surface of the inorganic insulating layer. The driving circuit may include a first driving circuit and a second driving circuit that are spaced from each other with the valley hole therebetween. The method further including forming the second inorganic pattern layer in the valley hole.

BRIEF DESCRIPTION OF THE DRAWINGS

The above and other aspects and features of certain embodiments of the disclosure will be more apparent from the following description taken in conjunction with the accompanying drawings, in which:

FIGS. 18A-18I are cross-sectional views of a method of manufacturing a display device according to an embodiment;

DETAILED DESCRIPTION

Figure 1:
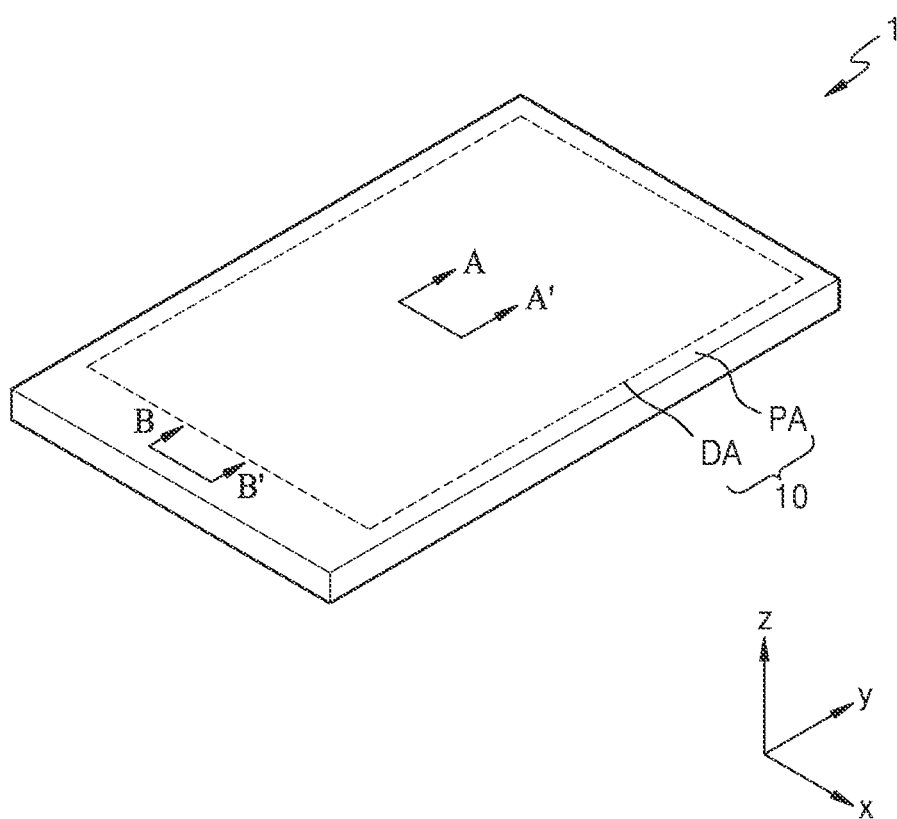
FIG. 1 is a schematic perspective view of a display device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. Further, the use of "may" when describing embodiments of the present disclosure refers to "one or more embodiments of the present disclosure".

As the disclosure allows for various changes and numerous embodiments, embodiments will be illustrated in the drawings and described in more detail in the written description. Features of the disclosure and methods of accomplishing the same may be understood more readily by reference to the following detailed description of embodiments and the accompanying drawings. However, this is not intended to limit the disclosure to particular modes of practice, and it is to be appreciated that all changes, equivalents, and substitutes that do not depart from the spirit and technical scope of the disclosure are encompassed in the disclosure.

Hereinafter, embodiments will be described in more detail with reference to the accompanying drawings. To clearly describe the present embodiments, irrelevant portions to the description may be omitted, and in the description with reference to the drawings, the same or corresponding constituents may be indicated by the same reference numerals and redundant descriptions thereof may not be repeated.

In an embodiment below, terms such as "first" and "second" are used herein merely to describe a variety of elements, but the elements are not limited by the terms. Such terms are used only for the purpose of distinguishing one element from another element.

In an embodiment below, an expression used in the singular encompasses the expression of the plural, unless it has a clearly different meaning in the context.

In an embodiment below, it will be further understood that the terms "comprises" and/or "comprising" used herein specify the presence of stated features or components, but do not preclude the presence or addition of one or more other features or components.

In an embodiment below, it will be understood that when a component, such as a layer, a film, a region, or a plate, is referred to as being "on" another component, the component can be directly on the other component or one or more intervening components may also be present.

Sizes of components in the drawings may be exaggerated for convenience of explanation. For example, because sizes and thicknesses of components in the drawings are arbitrarily illustrated for convenience of explanation, the following embodiments are not limited thereto.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

When a certain embodiment may be implemented differently, a specific process order may be performed differently from the described order. For example, two consecutively described processes may be performed substantially at the same time or performed in an order opposite to the described order.

In an embodiment below, it will be understood that when a layer, region, or component is referred to as being "connected to" another layer, region, or component, it can be directly connected to the other layer, region, or component or indirectly connected to the other layer, region, or component via one or more intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via one or more intervening layers, regions, or components.

A display device, which is a device for displaying videos or still images, may be used as a display screen of various products including not only portable electronic devices such as mobile phones, smart phones, tablet personal computers, mobile communication terminals, electronic notebooks, e-books, portable multimedia players (PMPs), navigation devices, ultra-mobile personal computers (UMPCs), and the like, but also televisions, laptop computers, monitors, signboards, internet of things (IOT) device, and the like. Furthermore, a display device according to an embodiment may be used in wearable devices such as smart watches, watch phones, glasses-type displays, and head mounted displays (HMDs), and the like. Furthermore, a display device according to an embodiment may be used as a display for an instrument panel of a vehicle, a center information display (CID) arranged on a dashboard or center fascia of a vehicle, a room mirror display in replacement of a side mirror of a vehicle, or a display placed on the back of the front seat as an entertainment device for the rear seat of a vehicle.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic perspective view of a display device 1 according to an embodiment.

Referring to FIG. 1, the display device 1 may include a display panel 10. The display panel 10 may include an organic light-emitting display panel using an organic light-emitting diode OLED (see FIG. 2) including an organic light-emitting layer. Alternatively, the display panel 10 may include a light-emitting diode display panel using a light-emitting diode (LED). The size of the LED may be a micro scale or a nano scale. For example, the LED may include a micro LED. Alternatively, the LED may include a nanorod LED. The nanorod LED may include gallium nitride (GaN). In an embodiment, a color conversion layer may be disposed on the nanorod LED. The color conversion layer may include quantum dots. Alternatively, the display panel 10 may include a quantum-dot light-emitting display panel using a quantum-dot light-emitting diode including a quantum-dot light-emitting layer. Alternatively, the display panel 10 may include an inorganic light-emitting display panel using an inorganic light-emitting element including an inorganic semiconductor. In the following description, a case in which the display panel 10 is an organic light-emitting display panel using the organic light-emitting diode OLED as a display element is primarily described in more detail.

The display panel 10 may include a display area DA and a peripheral area PA. A plurality of pixels may be arranged in the display area DA. The display area DA may provide an image by using light emitted from the pixels.

The peripheral area PA may be where no image is provided. For example, a plurality of pixels may not be arranged in the peripheral area PA. The peripheral area PA may be around (e.g., at least partially surround) the display area DA. In an embodiment, the display area DA may be entirely surrounded by the peripheral area PA. A driving portion for providing an electrical signal or power to the pixels arranged in the display area DA and the like may be arranged in the peripheral area PA. Furthermore, the peripheral area PA may include a pad area where a pad is disposed.

Figure 2:
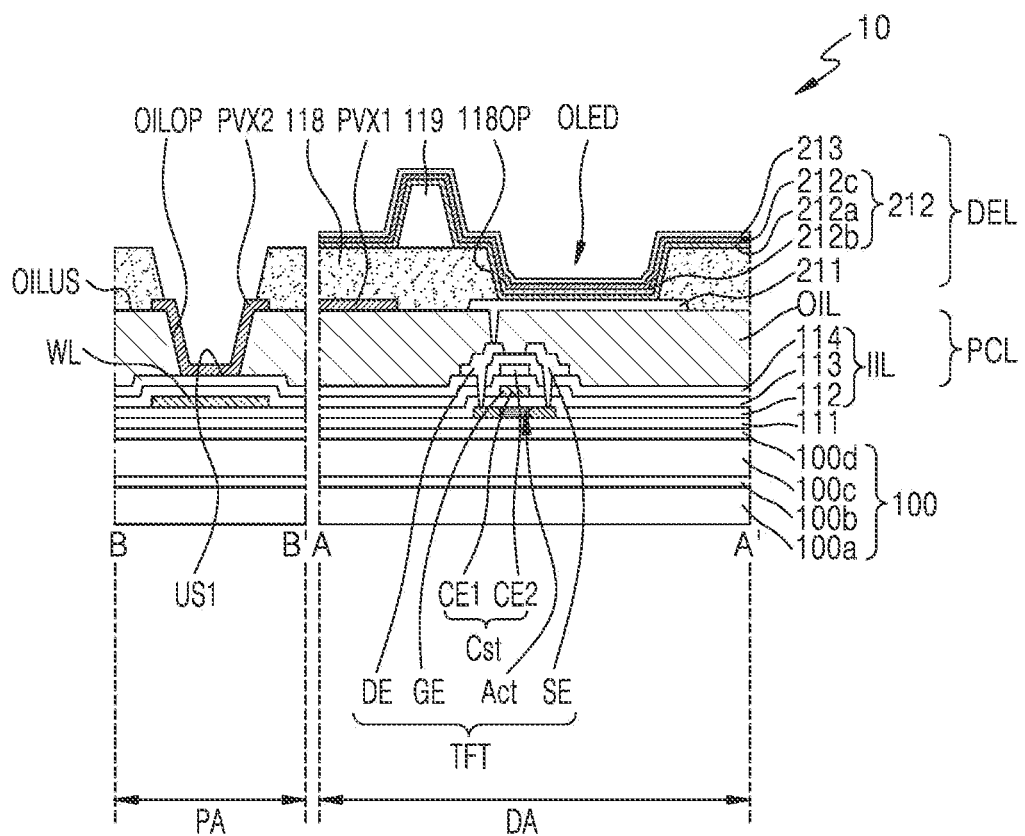
FIG. 2 is a schematic cross-sectional view of a display panel of FIG. 1 taken along the line A-A' and the line B-B'.

FIG. 2 is a schematic cross-sectional view of the display panel 10 of FIG. 1 taken along the line A-A' and the line B-B'.

Referring to FIG. 2, the display panel 10 may include a substrate 100 and a multilayer film on the substrate 100. The display panel 10 may include the display area DA and the peripheral area PA, and the display area DA and the peripheral area PA may be defined in the substrate 100 and/or the multilayer film. In the following description, a case in which the display area DA and the peripheral area PA are defined in the substrate 100 is primarily described in more detail. In other words, the substrate 100 may include the display area DA and the peripheral area PA.

The display panel 10 may include the substrate 100, a buffer layer 111, a pixel circuit layer PCL, a display element layer DEL, a first inorganic pattern layer PVX1, and a second inorganic pattern layer PVX2.

In an embodiment, the substrate 100 may include a first base layer 100a, a first barrier layer 100b, a second base layer 100c, and a second barrier layer 100d. In an embodiment, the first base layer 100a, the first barrier layer 100b, the second base layer 100c, and the second barrier layer 100d may be stacked (e.g., sequentially stacked) in or to form the substrate 100. In another embodiment, the substrate 100 may include glass.

At least one of the first base layer 100a or the second base layer 100c may include polymer resin such as polyethersulfone, polyarylate, polyetherimide, polyethylene naphthalate, polyethylene terephthalate, polyphenylene sulfide, polyimide, polycarbonate, cellulose triacetate, cellulose acetate propionate, and the like.

The first barrier layer 100b and the second barrier layer 100d, which are barrier layers for preventing or reducing infiltration of external foreign materials, may be a single layer or multiple layers (i.e., a multilayer) including an inorganic material such as a silicon nitride ($SiN_x$), a silicon oxide ($SiO_2$), and/or a silicon oxynitride (SiON), and the like.

The buffer layer 111 may be disposed on the substrate 100. The buffer layer 111 may include an inorganic insulating material such as $SiN_x$, SiON, and $SiO_2$, and may be a single layer or multiple layers including the above-described inorganic insulating material.

The pixel circuit layer PCL may be disposed on the buffer layer 111. The pixel circuit layer PCL may include an inorganic insulating layer IIL, a thin film transistor TFT, a storage capacitor Cst, a wiring WL, and an organic insulating layer OIL. The thin film transistor TFT may include a semiconductor layer Act, a gate electrode GE, a source electrode SE, and a drain electrode DE. The storage capacitor Cst may include a lower electrode CE1 and an upper electrode CE2.

The inorganic insulating layer IIL may be disposed on the substrate 100. In an embodiment, the inorganic insulating layer IIL may be disposed on the buffer layer 111. The inorganic insulating layer IIL may include a first gate insulating layer 112, a second gate insulating layer 113, and an interlayer insulating layer 114.

In an embodiment, the thin film transistor TFT and the storage capacitor Cst may be disposed on the display area DA. The semiconductor layer Act may include polysilicon. Alternatively, the semiconductor layer Act may include amorphous silicon, an oxide semiconductor, an organic semiconductor, and the like. The semiconductor layer Act may include a channel region, and a drain region and a source region, which are disposed at respective sides of the channel region.

The gate electrode GE may overlap the channel region. The gate electrode GE may include a low-resistance metal material. The gate electrode GE may include a conductive material including molybdenum (Mo), aluminum (Al), copper (Cu), titanium (Ti), and/or the like, and may be formed in a single layer or multiple layers including the above material.

The first gate insulating layer 112 between the semiconductor layer Act and the gate electrode GE may include an inorganic insulating material such as $SiO_2$, $SiN_x$, SiON, an aluminum oxide ($Al_2O_3$), a titanium oxide ($TiO_2$), a tantalum oxide ($Ta_2O_5$), a hafnium oxide ($HfO_2$), and/or a zinc oxide ($ZnO_x$, such as ZnO and/or $ZnO_2$).

The second gate insulating layer 113 may cover the gate electrode GE. The second gate insulating layer 113, similar to the first gate insulating layer 112, may include an inorganic insulating material such as $SiO_2$, $SiN_x$, SiON, $Al_2O_3$, $TiO_2$, $Ta_2O_5$, $HfO_2$, and/or ZnO (such as ZnO and/or $ZnO_2$).

The upper electrode CE2 of the storage capacitor Cst may be disposed on the second gate insulating layer 113. The upper electrode CE2 may overlap the gate electrode GE thereunder. In this case, the gate electrode GE of the thin film transistor TFT and the upper electrode CE2, which overlap each other with the second gate insulating layer 113 therebetween, may form the storage capacitor Cst. Accordingly, the gate electrode GE of the thin film transistor TFT may function as the lower electrode CE1 of the storage capacitor Cst.

As such, the storage capacitor Cst and the thin film transistor TFT may overlap each other. In some embodiments, the storage capacitor Cst may not overlap the thin film transistor TFT.

The upper electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be a single layer or multiple layers of the above-described material.

The interlayer insulating layer 114 may cover the upper electrode CE2. The interlayer insulating layer 114 may include $SiO_2$, $SiN_x$, SiON, $Al_2O_3$, $TiO_2$, $Ta_2O_5$, $HfO_2$, or ZnO (such as ZnO and/or $ZnO_2$), and the like. The interlayer insulating layer 114 may be a single layer or multiple layers including the above-described inorganic insulating material.

The drain electrode DE and the source electrode SE each may be located on the interlayer insulating layer 114. The drain electrode DE and the source electrode SE may include a material that is conductive (e.g., exhibiting superior conductivity). The drain electrode DE and the source electrode SE may include a conductive material including Mo, Al, Cu, Ti, and/or the like, and may be formed in a single layer or multiple layers including the above material. In an embodiment, the drain electrode DE and the source electrode SE may have a multilayer structure of Ti/Al/Ti.

The organic insulating layer OIL may be disposed on the inorganic insulating layer IIL. In an embodiment, the organic insulating layer OIL may be disposed on the thin film transistor TFT. The organic insulating layer OIL may cover the drain electrode DE and the source electrode SE. The organic insulating layer OIL may include an organic material. For example, the organic insulating layer OIL may include an organic insulating material such as a general purpose polymer such as polymethylmethacrylate (PMMA) or polystyrene (PS), a polymer derivative with a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof.

The display element layer DEL may be disposed on the pixel circuit layer PCL. The display element layer DEL may include the organic light-emitting diode OLED as a display element. The organic light-emitting diode OLED may be connected (e.g., electrically connected) to the drain electrode DE or the source electrode SE through a contact hole of the organic insulating layer OIL.

The organic light-emitting diode OLED may include a pixel electrode 211, an intermediate layer 212, and a counter electrode 213. The pixel electrode 211 may be on the organic insulating layer OIL. The pixel electrode 211 may include a conductive oxide such as an indium tin oxide (ITO), an indium zinc oxide (IZO), a zinc oxide (ZnO), an indium oxide ($In_2O_3$), an indium gallium oxide (IGO), or an aluminum zinc oxide (AZO). In another embodiment, the pixel electrode 211 may include a reflective film including Ag, Mg, Al, Pt, Pd, Au, Ni, Nd, Ir, Cr, or a compound thereof. In another embodiment, the pixel electrode 211 may further include a film formed of ITO, IZO, ZnO, or $In_2O_3$ above/below the above-described reflective film.

A pixel definition layer 118 having an opening 118OP that overlaps a central portion of the pixel electrode 211 may be disposed on the pixel electrode 211. The pixel definition layer 118 may cover an edge of the pixel electrode 211. The pixel definition layer 118 may include an organic insulating material and/or an inorganic insulating material. The opening 118OP may define an emission area of light emitted from the organic light-emitting diode OLED. For example, the width of the opening 118OP may correspond to the width of the emission area.

A spacer 119 may be disposed on the pixel definition layer 118. The spacer 119 may prevent or reduce damage to the substrate 100 and/or a multilayer film on the substrate 100 in a method of manufacturing a display device. A mask sheet may be used in a method of manufacturing a display panel. In this case, the mask sheet may enter the inside of the opening 118OP of the pixel definition layer 118 or may closely adhere to the pixel definition layer 118. The spacer 119 may prevent or reduce defects in which a part of the substrate 100 and the multilayer film is damaged or broken by the mask sheet during deposition of a deposition material on the substrate 100.

The spacer 119 may include an organic material such as polyimide. Alternatively, the spacer 119 may include an inorganic insulating material such as $SiN_X$ or $SiO_2$, or include an organic insulating material and an inorganic insulating material.

In an embodiment, the spacer 119 may include a material different from that of the pixel definition layer 118. In another embodiment, the spacer 119 may include the same material as that of the pixel definition layer 118. In this case, the pixel definition layer 118 and the spacer 119 may be formed together in a mask process using a halftone mask and the like.

The intermediate layer 212 may be disposed on the pixel definition layer 118. The intermediate layer 212 may include a light-emitting layer 212b disposed in the opening 118OP of the pixel definition layer 118. The light-emitting layer 212b may include a polymer or low-molecular weight organic material that emits light of a color.

A first functional layer 212a and a second functional layer 212c may be disposed below and above the light-emitting layer 212b, respectively. The first functional layer 212a may include, for example, a hole transport layer (HTL), or a hole transport layer and a hole injection layer (HIL). The second functional layer 212c, as an element disposed above the light-emitting layer 212b, may be optional. The second functional layer 212c may include an electron transport layer (ETL) and/or an electron injection layer (EIL). The first functional layer 212a, the second functional layer 212c, and/or the counter electrode 213 may be common layers that entirely cover the substrate 100.

The counter electrode 213 may include a conductive material having a low work function. For example, the counter electrode 213 may include a (semi-) transparent layer including Ag, Mg, Al, Pt, Pd, Au, Ni, Nd, Ir, Cr, lithium (Li), Ca, or an alloy thereof. Alternatively, the counter electrode 213 may further include a layer such as ITO, IZO, ZnO or $In_2O_3$ on a (semi-)transparent layer including the above-described material.

In some embodiments, a capping layer may be further disposed on the counter electrode 213. The capping layer may include lithium fluoride (LiF), an inorganic material, and/or an organic material.

The first inorganic pattern layer PVX1 may be disposed between the organic insulating layer OIL and the pixel definition layer 118. In an embodiment, the first inorganic pattern layer PVX1 may overlap the display area DA. In an embodiment, the first inorganic pattern layer PVX1 may be disposed between the organic insulating layer OIL and the pixel electrode 211. In this case, the first inorganic pattern layer PVX1 may overlap the pixel electrode 211. The first inorganic pattern layer PVX1 may be an element for improving the reliability of the display panel 10. For example, the first inorganic pattern layer PVX1 may be disposed on a wiring connected (e.g., electrically connected) to the organic light-emitting diode OLED to protect the wiring. In another example, the first inorganic pattern layer PVX1 may induce disconnection between the first functional layer 212a and/or the second functional layer 212c. The first functional layer 212a and the second functional layer 212c may include an organic material.

When the first functional layer 212a and/or the second functional layer 212c extend toward the peripheral area PA, external foreign material and/or moisture may infiltrate into the organic light-emitting diode OLED through the first functional layer 212a and/or the second functional layer 212c. In an embodiment, the first inorganic pattern layer PVX1 may protect the organic light-emitting diode OLED by inducing the disconnection between the first functional layer 212a and/or the second functional layer 212c. In another example, the first inorganic pattern layer PVX1 may include a function other than the above-described function.

The first inorganic pattern layer PVX1 may be formed by entirely forming an inorganic layer on the organic insulating layer OIL and then patterning the inorganic layer. The first inorganic pattern layer PVX1 may be a single layer or multilayer film including an inorganic material such as $SiN_X$, $SiO_2$, and/or SiON, and the like.

The buffer layer 111 and the inorganic insulating layer IIL may be disposed in the peripheral area PA. In an embodiment, the wiring WL may be disposed in the peripheral area PA. In an embodiment, the wiring WL may be disposed between the first gate insulating layer 112 and the second gate insulating layer 113. In another embodiment, the wiring WL may be disposed between the second gate insulating layer 113 and the interlayer insulating layer 114. For example, when the inorganic insulating layer IIL includes a first inorganic insulating layer and a second inorganic insulating layer, the wiring WL may be disposed between the first inorganic insulating layer and the second inorganic insulating layer. In some embodiments, the wiring WL may be disposed between the buffer layer 111 and the inorganic insulating layer IIL.

In an embodiment, the wiring WL and the gate electrode GE may include the same material. The wiring WL may include a conductive material including Mo, Al, Cu, Ti, and/or the like, and may be formed in a single layer or multiple layers including the above material. In another embodiment, the wiring WL and the upper electrode CE2 may include the same material. The wiring WL may include Al, Pt, Pd, Ag, Mg, Au, Ni, Nd, Ir, Cr, Ca, Mo, Ti, W, and/or Cu, and may be a single layer or multiple layers of the above-described material.

The organic insulating layer OIL may be disposed on a part of the inorganic insulating layer IIL (e.g., only a part of the upper surface of the inorganic insulating layer IIL) so that an upper surface of the inorganic insulating layer IIL is exposed in the peripheral area PA by the organic insulating layer OIL. In an embodiment, a first upper surface US1 of the inorganic insulating layer IIL may overlap the peripheral area PA. The first upper surface US1 of the inorganic insulating layer IIL may be an upper surface of the inorganic insulating layer IIL that does not overlap the organic insulating layer OIL.

In an embodiment, the organic insulating layer OIL may include an opening portion OILOP of the organic insulating layer OIL, and the first upper surface US1 of the inorganic insulating layer IIL may be exposed through the opening portion OILOP of the organic insulating layer OIL. In another embodiment, the first upper surface US1 of the inorganic insulating layer IIL may be disposed at an edge of the display panel 10. When the organic insulating layer OIL is not disposed at the edge of the display panel 10, the first upper surface US1 of the inorganic insulating layer IIL may be exposed.

The second inorganic pattern layer PVX2 may be in contact with the first upper surface US1 of the inorganic insulating layer IIL. In an embodiment, the second inorganic pattern layer PVX2 may be in direct contact with the inorganic insulating layer IIL. In other words, an intervening element may not be provided between the second inorganic pattern layer PVX2 and the inorganic insulating layer IIL.

The second inorganic pattern layer PVX2 may cover (e.g., may entirely cover) the first upper surface US1 of the inorganic insulating layer IIL. In an embodiment, the second inorganic pattern layer PVX2 may extend from the first upper surface US1 of the inorganic insulating layer IIL to an upper surface OILUS of the organic insulating layer OIL. In another embodiment, the second inorganic pattern layer PVX2 may not extend from the first upper surface US1 of the inorganic insulating layer IIL to the upper surface OILUS of the organic insulating layer OIL. The second inorganic pattern layer PVX2 may protect the inorganic insulating layer IIL and/or the wiring WL in the peripheral area PA. For example, the second inorganic pattern layer PVX2 may overlap the wiring WL.

The second inorganic pattern layer PVX2 and the first inorganic pattern layer PVX1 may include the same material. The second inorganic pattern layer PVX2 may be a single layer or multilayer film including an inorganic material such as $SiN_x$, $SiO_2$, and/or SiON, and the like. The second inorganic pattern layer PVX2 and the first inorganic pattern layer PVX1 may be formed by patterning the same inorganic layer.

In an embodiment, the pixel definition layer 118 may be disposed on the organic insulating layer OIL in the peripheral area PA. In an embodiment, the second inorganic pattern layer PVX2 (e.g., a portion of the second inorganic pattern layer PVX2) may extend between the organic insulating layer OIL and the pixel definition layer 118.

FIGS. 3A-3G are cross-sectional views of a method of manufacturing a display device according to an embodiment. In FIGS. 3A-3G, the same reference symbols as those of FIG. 2 denote the same members, and repetitive descriptions thereof may not be repeated.

Figure 3A:
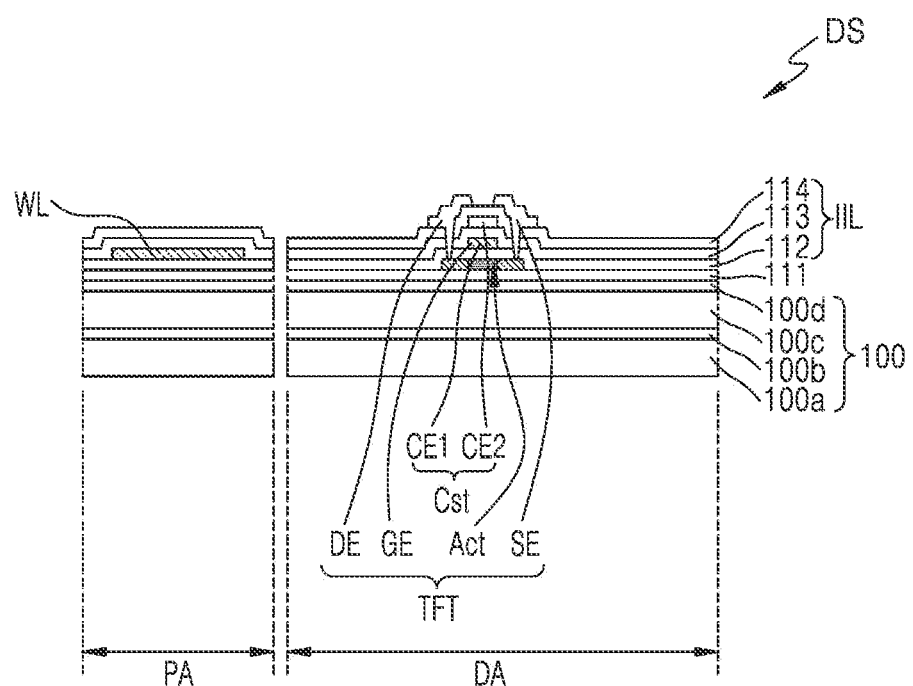
FIGS. 3A-3G are cross-sectional views of a method of manufacturing a display device according to an embodiment.

Referring to FIG. 3A, a display substrate DS may be prepared. The display substrate DS may be a display device being manufactured. The display substrate DS may include the substrate 100, the buffer layer 111, the thin film transistor TFT, the storage capacitor Cst, the wiring WL, and the inorganic insulating layer IIL. The thin film transistor TFT may include the semiconductor layer Act, the gate electrode GE, the drain electrode DE, and the source electrode SE. The storage capacitor Cst may include the lower electrode CE1 and the upper electrode CE2.

The substrate 100 may include the display area DA and the peripheral area PA. The peripheral area PA may be disposed outside the display area DA. The buffer layer 111 may be disposed on the substrate 100. The inorganic insulating layer IIL may be disposed on the substrate 100. In an embodiment, the inorganic insulating layer IIL may be disposed on the buffer layer 111. In an embodiment, the inorganic insulating layer IIL may include the first gate insulating layer 112, the second gate insulating layer 113, and the interlayer insulating layer 114.

In an embodiment, the semiconductor layer Act may be disposed between the buffer layer 111 and the first gate insulating layer 112. The gate electrode GE may overlap the semiconductor layer Act, and may be disposed between the first gate insulating layer 112 and the second gate insulating layer 113. The upper electrode CE2 may be disposed between the second gate insulating layer 113 and the interlayer insulating layer 114. The drain electrode DE and the source electrode SE may be disposed on the interlayer insulating layer 114.

The wiring WL may be disposed in the peripheral area PA. In an embodiment, the wiring WL may be disposed between the first gate insulating layer 112 and the second gate insulating layer 113. In another embodiment, the wiring WL may be disposed between the second gate insulating layer 113 and the interlayer insulating layer 114. For example, when the inorganic insulating layer IIL includes a first inorganic insulating layer and a second inorganic insulating layer, the wiring WL may be disposed between the first inorganic insulating layer and the second inorganic insulating layer. In some embodiments, the wiring WL may be disposed between the buffer layer 111 and the inorganic insulating layer IIL.

Figure 3B:
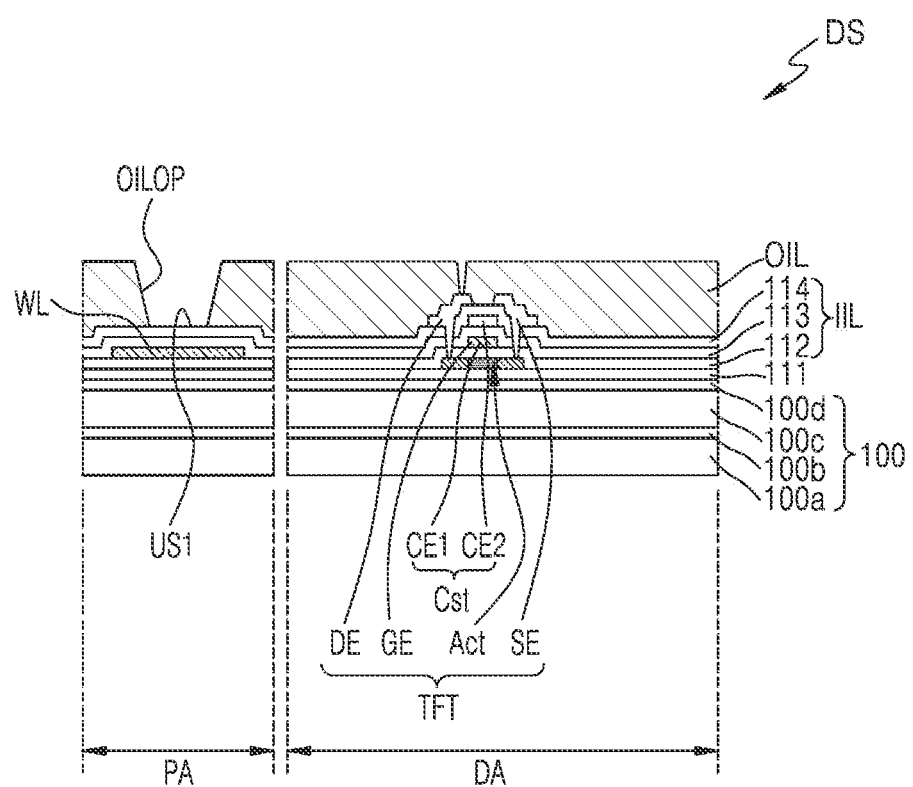

Referring to FIG. 3B, the organic insulating layer OIL may be formed on the inorganic insulating layer IIL. The organic insulating layer OIL may be formed such that the first upper surface US1 of the inorganic insulating layer IIL (e.g., the first upper surface US1 overlapping the peripheral area PA) is exposed by the organic insulating layer OIL. For example, the first upper surface US1 of the inorganic insulating layer IIL may not overlap the organic insulating layer OIL.

In an embodiment, the first upper surface US1 of the inorganic insulating layer IIL may be exposed through the opening portion OILOP of the organic insulating layer OIL. In another embodiment, the first upper surface US1 of the inorganic insulating layer IIL may be disposed at the edge of the display panel or display substrate DS.

The organic insulating layer OIL may be formed by applying an organic material to an upper surface of the inorganic insulating layer IIL and performing a photocuring process and a patterning process. In an embodiment, the opening portion OILOP of the organic insulating layer OIL may be formed through the patterning process. Furthermore, a contact hole exposing the drain electrode DE or the source electrode SE may be formed.

Figure 3C:
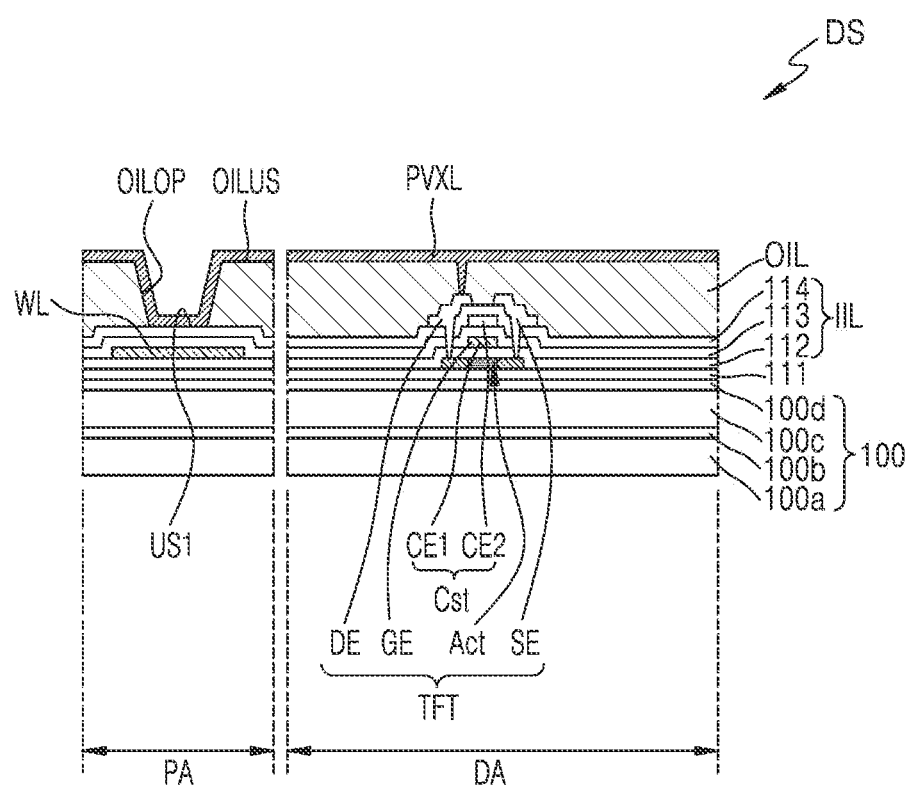

Referring to FIG. 3C, an inorganic layer PVXL may be formed. The inorganic layer PVXL may overlap the display area DA and the peripheral area PA. The inorganic layer PVXL may be formed on the organic insulating layer OIL.

In an embodiment, the inorganic layer PVXL may be formed on the first upper surface US1 of the inorganic insulating layer IIL. As the inorganic layer PVXL is formed on the surface (e.g., the entire surface) of the display substrate DS, the inorganic layer PVXL may be formed on the first upper surface US1 of the inorganic insulating layer IIL. The inorganic layer PVXL may extend from the first upper surface US1 of the inorganic insulating layer IIL to the upper surface OILUS of the organic insulating layer OIL.

The inorganic layer PVXL may be in direct contact with the inorganic insulating layer IIL. In other words, an intervening element may not be provided between the inorganic layer PVXL and the inorganic insulating layer IIL. The inorganic layer PVXL may be a single layer or multilayer film including an inorganic material such as $SiN_x$, $SiO_2$, and/or SiON, and the like.

In an embodiment, the inorganic layer PVXL may be formed by chemical vapor deposition (CVD). In another embodiment, the inorganic layer PVXL may be formed by plasma enhanced chemical vapor deposition (PECVD). In another embodiment, the inorganic layer PVXL may be formed by physical vapor deposition (PVD). For example, the inorganic layer PVXL may be formed by sputtering or evaporation. In another embodiment, the inorganic layer PVXL may be formed by atomic layer deposition.

Figure 3D:
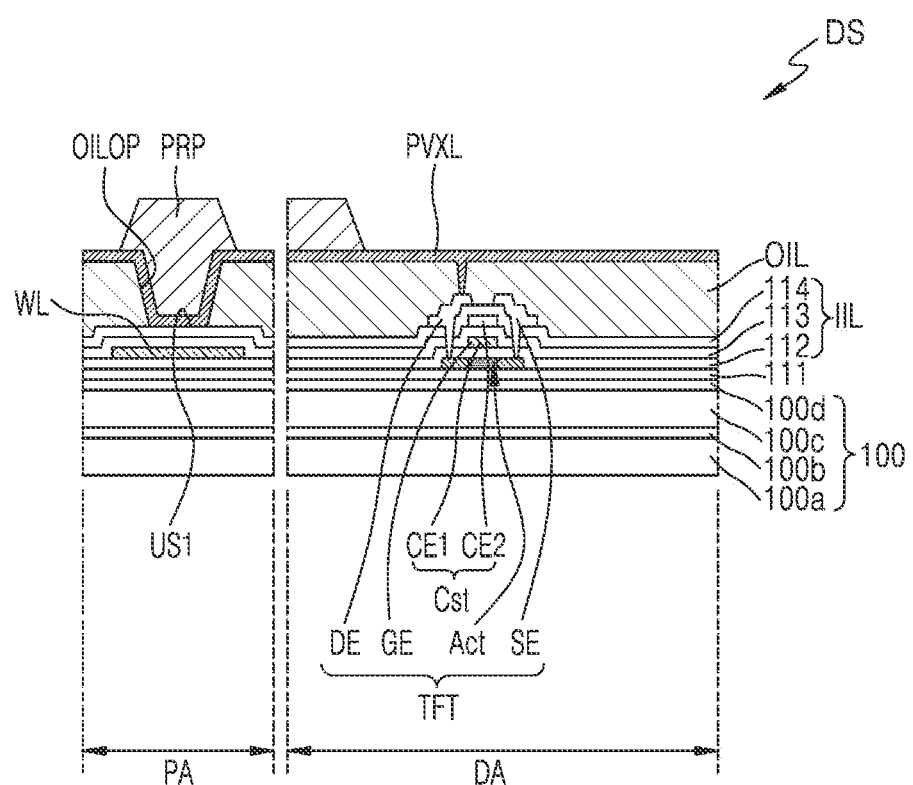

Referring to FIG. 3D, a photoresist pattern PRP may be formed on the inorganic layer PVXL. The photoresist pattern PRP may overlap the peripheral area PA. The photoresist pattern PRP may overlap the first upper surface US1 of the inorganic insulating layer IIL.

In an embodiment, the photoresist pattern PRP may include a plurality of photoresist patterns PRP. Any one of the plurality of photoresist patterns PRP may overlap the first upper surface US1 of the inorganic insulating layer IIL. Another one of the plurality of photoresist patterns PRP may overlap the display area DA.

The photoresist pattern PRP may be formed by applying a photoresist solution to the inorganic layer PVXL by various suitable methods such as spin coating, slit-coating, spray or dipping, and the like. In an embodiment, the photoresist solution may include a positive type photoresist. The positive type photoresist may be removed later in a process of developing a light exposed area. In an embodiment, the photoresist solution may include a negative type photoresist. The negative type photoresist is characteristic in that an area other than the exposed area is removed.

Then, the photoresist pattern PRP may be formed through an exposure process and a development process of the photoresist solution.

Then, the inorganic layer PVXL may be at least partially removed. In an embodiment, at least part of the inorganic layer PVXL may be removed in an etching process. For example, the area of the inorganic layer PVXL that is exposed without being overlapped with the photoresist pattern PRP may be removed. The etching may include dry etching.

Figure 3E:
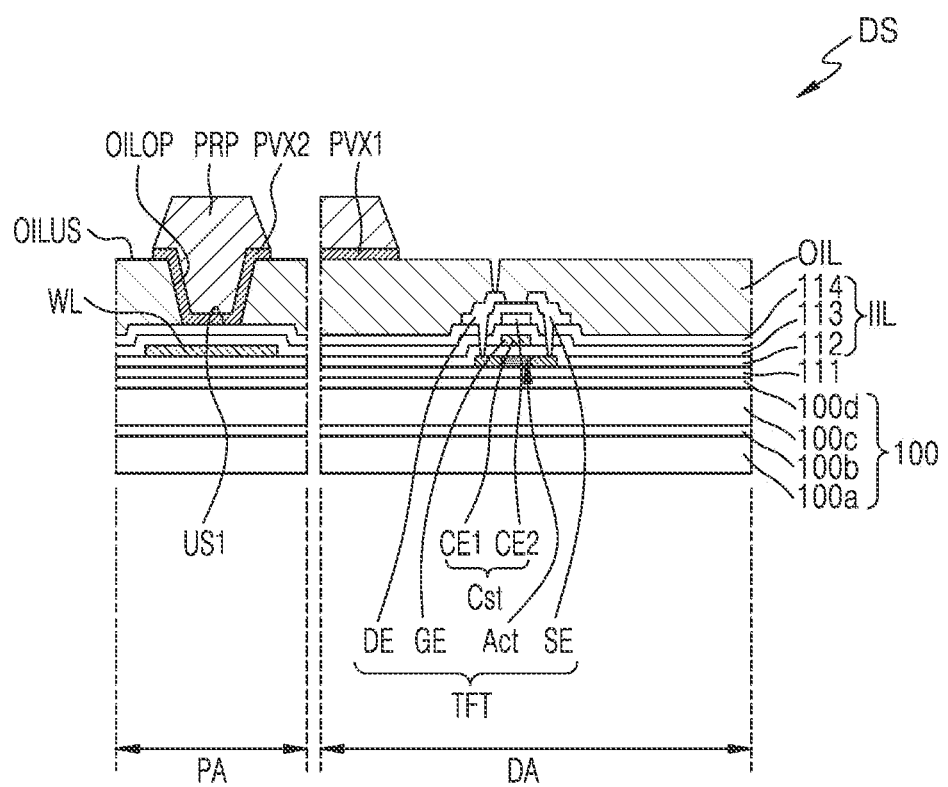

Referring to FIG. 3E, the first inorganic pattern layer PVX1 and the second inorganic pattern layer PVX2 may be formed. In an embodiment, the first inorganic pattern layer PVX1 may overlap the display area DA. The second inorganic pattern layer PVX2 may overlap the first upper surface US1 of the inorganic insulating layer IIL at the peripheral area PA. The first inorganic pattern layer PVX1 and the second inorganic pattern layer PVX2, which may be formed by being etched from the same inorganic layer (e.g., the inorganic layer PVXL), may include the same inorganic material. For example, the first inorganic pattern layer PVX1 and the second inorganic pattern layer PVX2 may be formed by at least partially removing the inorganic layer (e.g., the inorganic layer PVXL).

The second inorganic pattern layer PVX2 may be in contact with the first upper surface US1 of the inorganic insulating layer IIL. In an embodiment, the second inorganic pattern layer PVX2 may cover (e.g., may entirely cover) the first upper surface US1 of the inorganic insulating layer IIL. In an embodiment, the second inorganic pattern layer PVX2 may extend from the first upper surface US1 of the inorganic insulating layer IIL to the upper surface OILUS of the organic insulating layer OIL. In another embodiment, the second inorganic pattern layer PVX2 may not extend from the first upper surface US1 of the inorganic insulating layer IIL to the upper surface OILUS of the organic insulating layer OIL.

As the photoresist pattern PRP overlaps the first upper surface US1 of the inorganic insulating layer IIL, the second inorganic pattern layer PVX2 between the photoresist pattern PRP and the first upper surface US1 of the inorganic insulating layer IIL may not be removed. Furthermore, as the photoresist pattern PRP and/or the second inorganic pattern layer PVX2 is disposed on the inorganic insulating layer IIL, the inorganic insulating layer IL may not be removed. For example, as the photoresist pattern PRP and/or the second inorganic pattern layer PVX2 overlap a portion of the inorganic insulating layer IIL, the portion of the inorganic insulating layer IIL may not be removed. Accordingly, damage to the wiring WL disposed in the peripheral area PA may be prevented or reduced.

Figure 3F:
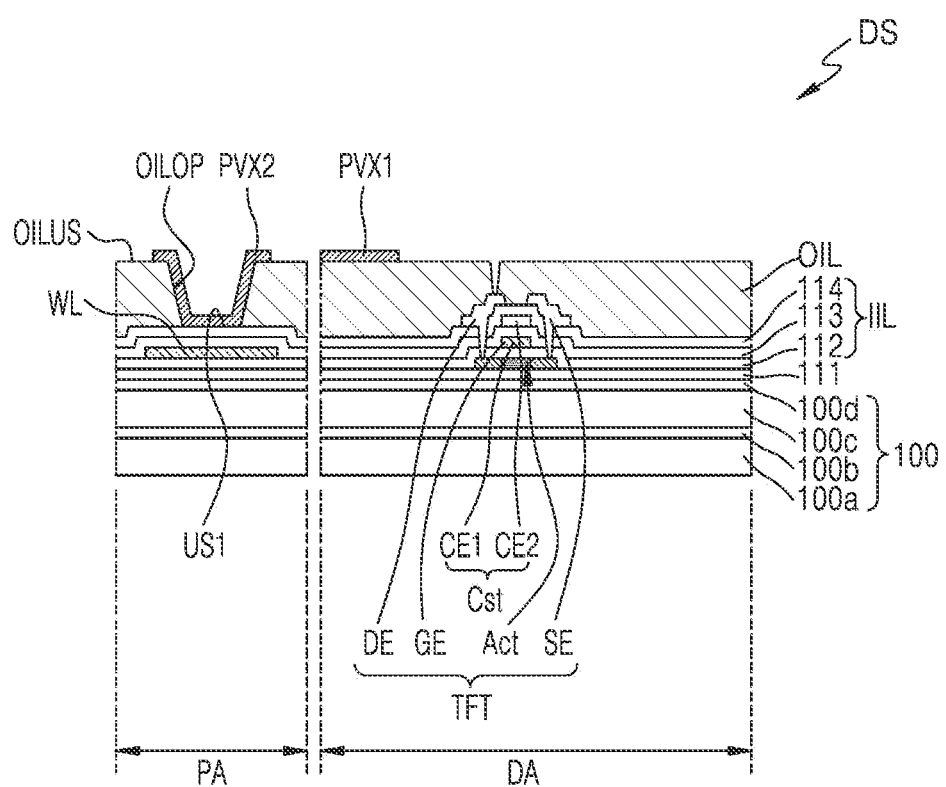

Referring to FIG. 3F, the photoresist pattern PRP may be removed. The photoresist pattern PRP may be removed through a development process.

Figure 3G:
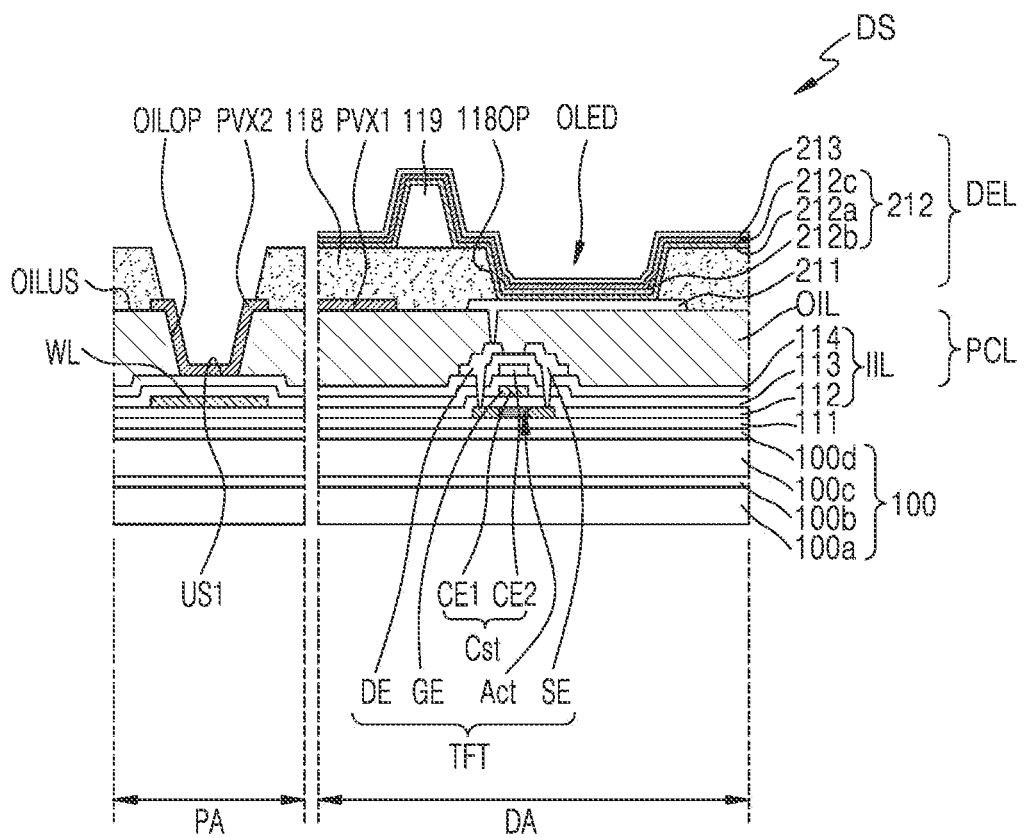

Referring to FIG. 3G, the display element layer DEL may be formed. In an embodiment, an organic light-emitting diode OLED may be formed as a display element at or overlapping the display area DA. The organic light-emitting diode OLED may include the pixel electrode 211, the intermediate layer 212, and the counter electrode 213.

In an embodiment, the pixel electrode 211 may be formed in the display area DA. In some embodiments, the pixel electrode 211 may overlap the first inorganic pattern layer PVX1. In this case, the pixel electrode 211 may be formed on the first inorganic pattern layer PVX1.

The pixel definition layer 118 including the opening 118OP that overlaps the central portion of the pixel electrode 211 may be formed on the pixel electrode 211. In an embodiment, the spacer 119 may be formed on the pixel definition layer 118.

Then, the intermediate layer 212 and the counter electrode 213 may be formed (e.g., sequentially formed).

Figure 4:
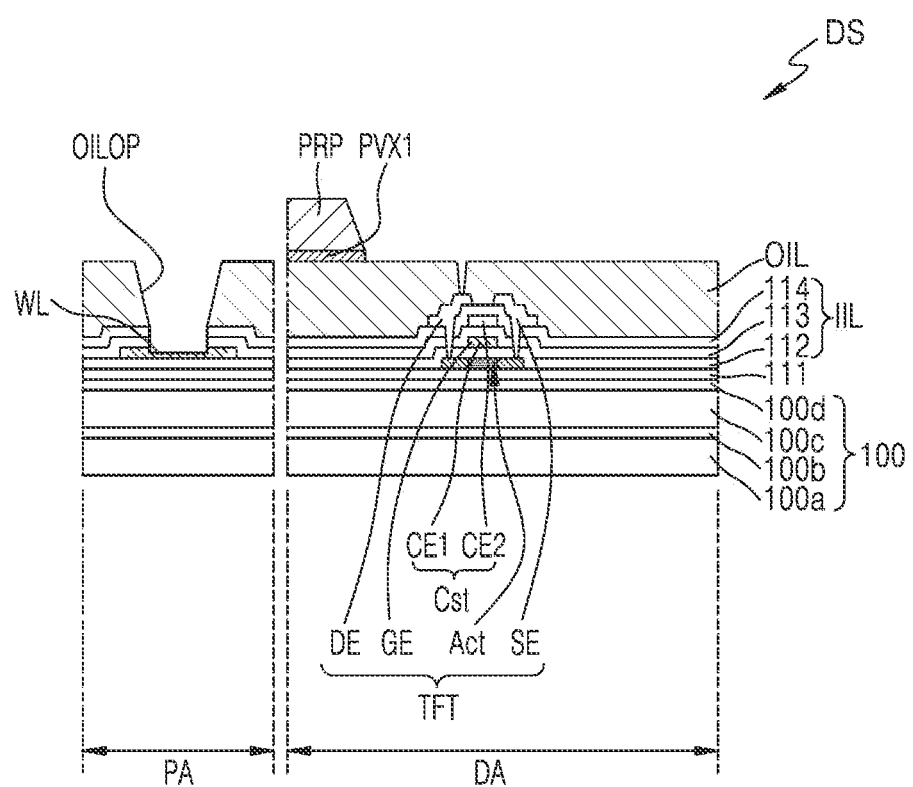
FIG. 4 is a cross-sectional view of a comparative example for comparison to an embodiment according to the present disclosure.

FIG. 4 is a cross-sectional view of a comparative example for comparison to an embodiment according to the present disclosure. In FIG. 4, the same reference symbols as those of FIG. 3E denote the same members, and repetitive descriptions thereof may not be repeated.

Referring to FIG. 4, when the first inorganic pattern layer PVX1 is formed by etching an inorganic layer (e.g., an inorganic layer PVXL), the organic insulating layer OIL may be disposed not to overlap part of the inorganic insulating layer IIL. Furthermore, the photoresist pattern PRP may not be disposed in the peripheral area PA. In this case, when the first inorganic pattern layer PVX1 is formed, the inorganic insulating layer IIL including a material that is the same as or similar to the material of the inorganic layer (e.g., the inorganic layer PVXL) may be etched.

When the inorganic insulating layer IIL is etched, the wiring WL disposed in the peripheral area PA may be damaged. Accordingly, the reliability of the display device may be reduced or deteriorated.

According to an embodiment of the present disclosure, when the first inorganic pattern layer PVX1 is formed, the second inorganic pattern layer PVX2 may be formed on the first upper surface US1 of the inorganic insulating layer IL. In this case, as the photoresist pattern PRP is disposed on the first upper surface US1 of the inorganic insulating layer IIL and/or the second inorganic pattern layer PVX2, damage caused by etching or overetching the inorganic insulating layer IIL and/or the wiring WL may be prevented or reduced.

An embodiment of the display device 1 including the first inorganic pattern layer PVX1 and the second inorganic pattern layer PVX2 is described below in more detail.

Figure 5:
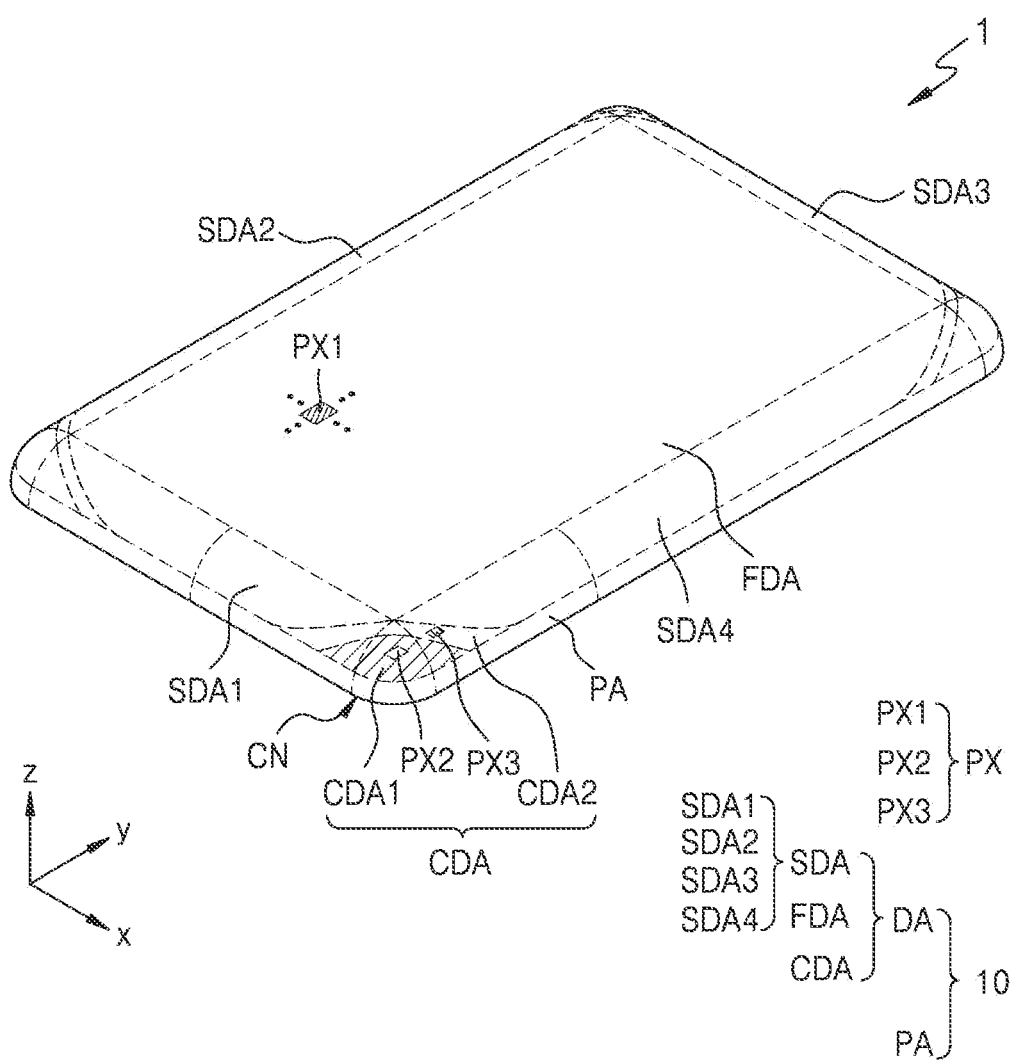
FIG. 5 is a schematic perspective view of a display device according to an embodiment.
Figure 6A:
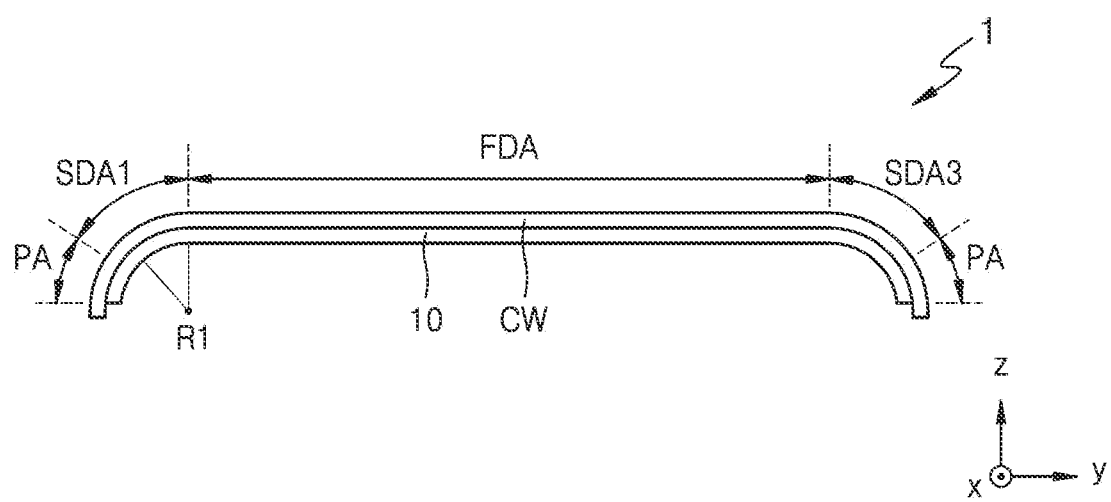
FIGS. 6A-6C are schematic cross-sectional views of a display device according to an embodiment.
Figure 6B:
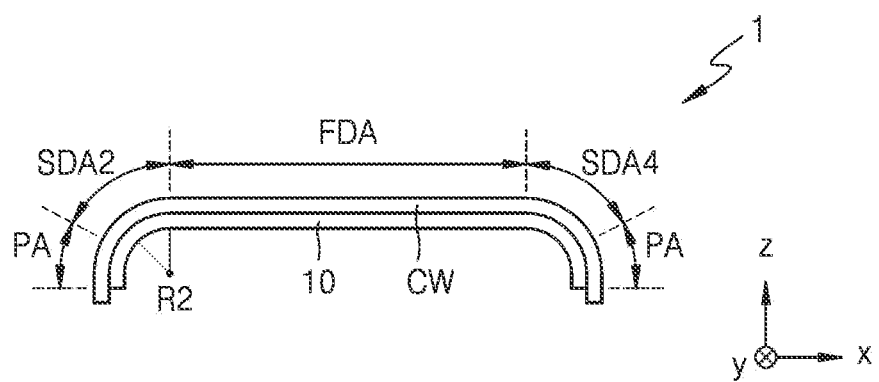
Figure 6C:
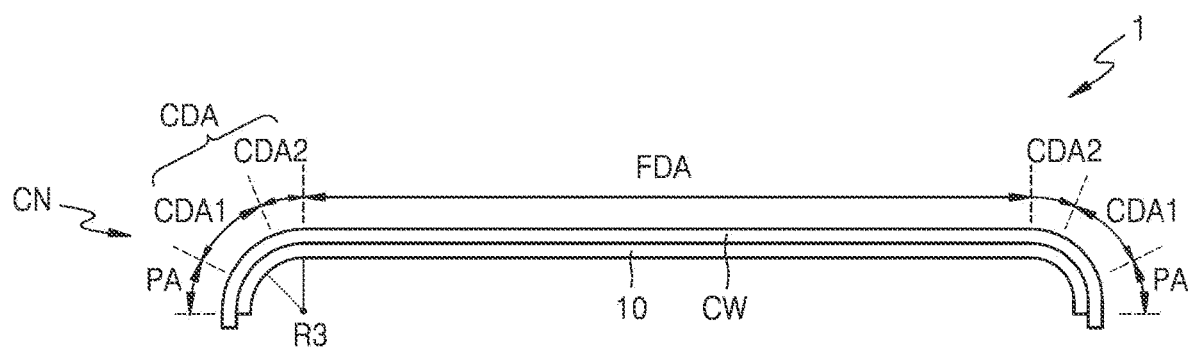

FIG. 5 is a schematic perspective view of a display device 1 according to an embodiment. FIGS. 6A-6C are schematic cross-sectional views of a display device 1 according to an embodiment. FIG. 6A is a cross-sectional view of the display device 1 of FIG. 1 taken along a y direction. FIG. 6B is a cross-sectional view of the display device 1 of FIG. 1 taken along an x direction. FIG. 6C is a cross-sectional view of the display device 1 of FIG. 1 in which corner display areas CDA are disposed at respective sides of a front display area FDA.

Referring to FIG. 5 and FIGS. 6A-6C, the display device 1 may have a long side in a first direction and a short side in a second direction. The first direction and the second direction may be directions crossing each other. For example, the first direction and the second direction may form an acute angle with each other. In another example, the first direction and the second direction may form an obtuse angle or a right angle with each other. In the following description, a case in which the first direction, for example, the y direction or a −y direction, and the second direction, for example, the x direction or a −x direction, form a right angle with each other is primarily described in more detail.

In another embodiment, in the display device 1, the length of a side in the first direction, for example, the y direction or the −y direction, and the length of a side in the second direction, for example, the x direction or the −x direction, may be the same. In another embodiment, the display device 1 may have a short side in the first direction, for example, the y direction or the −y direction, and a long side in the second direction, for example, the x direction or the −x direction.

A portion where the long side in the first direction, for example, the y direction or the −y direction, and the short side in the second direction, for example, the x direction or the −x direction meet, may be rounded to have a certain curvature.

The display device 1 may include the display panel 10 and a cover window CW. In this case, the cover window CW may perform a function to protect the display panel 10.

The cover window CW may include a flexible window. The cover window CW may be bent (e.g., easily bent) according to an external force without generation of cracks and the like, thereby protecting the display panel 10. The cover window CW may include glass, sapphire, or plastic. The cover window CW may include, for example, tempered glass such as ultrathin glass (UTG) or a transparent polyimide such as a colorless polyimide (CPI). In an embodiment, the cover window CW may have a structure in which a polymer layer having flexibility is disposed at one surface of a glass substrate, or alternatively, may be configured with a polymer layer only.

The display panel 10 may be disposed below the cover window CW. In some embodiments, the display panel 10 may adhere to the cover window CW by using a transparent adhesive member such as an optically clear adhesive (OCA) film.

The display panel 10 may include the display area DA for displaying an image and the peripheral area PA around (e.g., surrounding) the display area DA. A plurality of pixels PX may be disposed in the display area DA, and an image may be displayed through the pixels PX. Each of the pixels PX may include sub-pixels. For example, each of the pixels PX may include a red sub-pixel, a green sub-pixel, and a blue sub-pixel. Alternatively, each of the pixels PX may include a red sub-pixel, a green sub-pixel, a blue sub-pixel, and a white sub-pixel.

The display area DA may include the front display area FDA, a side surface display area SDA, and the corner display area CDA. The pixels PX disposed in each of the front display area FDA, the side surface display area SDA, and the corner display area CDA may display an image. In an embodiment, the pixels PX of the front display area FDA, the side surface display area SDA, and the corner display area CDA may provide an independent image. In another embodiment, the pixels PX of the front display area FDA, the side surface display area SDA, and/or the corner display area CDA may respectively provide parts of an image.

A first pixel PX1 including a display element may be disposed in the front display area FDA as a flat display area. In an embodiment, the front display area FDA may provide most of an image.

The pixel PX including a display element may be disposed in the side surface display area SDA. Accordingly, the side surface display area SDA may display an image (e.g., may display an image using a plurality of pixels PX in the side surface display area SDA). In an embodiment, the side surface display area SDA may include a first side surface display area SDA1, a second side surface display area SDA2, a third side surface display area SDA3, and a fourth side surface display area SDA4. In some embodiments, at least one of the first side surface display area SDA1, the second side surface display area SDA2, the third side surface display area SDA3, or the fourth side surface display area SDA4 may be omitted.

The first side surface display area SDA1 and the third side surface display area SDA3 may be connected to the front display area FDA in the first direction, for example, the y direction or the −y direction. For example, the first side surface display area SDA1 may be connected to the front display area FDA in the −y direction, and the third side surface display area SDA3 may be connected to the front display area FDA in the y direction. In an embodiment, the first side surface display area SDA1 and the third side surface display area SDA3 may be connected (e.g., adjacent) to the front display area FDA at opposite sides of the front display area FDA.

The first side surface display area SDA1 and the third side surface display area SDA3 may be bent with a radius of curvature. In an embodiment, the radii of curvature of the first side surface display area SDA1 and the third side surface display area SDA3 may be different from each other. In another embodiment, the radii of curvature of the first side surface display area SDA1 and the third side surface display area SDA3 may be the same. In the following description, a case in which the radii of curvature of the first side surface display area SDA1 and the third side surface display area SDA3 are the same as a first radius R1 of curvature is primarily described in more detail. Furthermore, as the first side surface display area SDA1 and the third side surface display area SDA3 are the same as or similar to each other, the first side surface display area SDA1 is primarily described in more detail.

The second side surface display area SDA2 and the fourth side surface display area SDA4 may be connected to the front display area FDA in the second direction, for example, the x direction or the −x direction. For example, the second side surface display area SDA2 may be connected to the front display area FDA in the −x direction, and the fourth side surface display area SDA4 may be connected to the front display area FDA in the x direction. In an embodiment, the second side surface display area SDA2 and the fourth side surface display area SDA4 may be connected to the front display area FDA at opposite sides of the front display area FDA.

The second side surface display area SDA2 and the fourth side surface display area SDA4 each may be bent with a radius of curvature. The radii of curvature of the second side surface display area SDA2 and the fourth side surface display area SDA4 may be the same as or different from each other. In the following description, a case in which the radii of curvature of the second side surface display area SDA2 and the fourth side surface display area SDA4 are the same as a second radius R2 of curvature is primarily described in more detail. Furthermore, as the second side surface display area SDA2 and the fourth side surface display area SDA4 are the same as or similar to each other, the second side surface display area SDA2 is primarily described in more detail.

The first radius R1 of curvature of the first side surface display area SDA1 may be the same as or different from the second radius R2 of curvature of the second side surface display area SDA2. For example, the first radius R1 of curvature may be less than the second radius R2 of curvature. In another example, the first radius R1 of curvature may be greater than the second radius R2 of curvature. In another embodiment, the first radius R1 of curvature of the first side surface display area SDA1 may be the same as the second radius R2 of curvature of the second side surface display area SDA2.

The corner display area CDA may be disposed at a corner CN of the display panel 10 to be bent. In other words, the corner display area CDA may be disposed corresponding to the corner CN. In this case, the corner CN may be a portion where the long side in the first direction, for example, the y direction or the −y direction, and the short side in the second direction, for example, the x direction or the −x direction, of the display device 1 and/or the display panel 10 meet. The corner display area CDA may be disposed between the neighboring side surface display areas SDA. For example, the corner display area CDA may be disposed between the first side surface display area SDA1 and the second side surface display area SDA2. Alternatively, the corner display area CDA may be disposed between the second side surface display area SDA2 and the third side surface display area SDA3, between the third side surface display area SDA3 and the fourth side surface display area SDA4, or between the fourth side surface display area SDA4 and the first side surface display area SDA1. Accordingly, the side surface display area SDA and the corner display area CDA may be bent around (e.g., surrounding) at least part of the front display area FDA.

Although one corner display area CDA is described, the present disclosure is not limited thereto. For example, any suitable number of corner display areas CDA may be provided, and each of the corner display areas CDA may be at respective corners of the display device 1 (e.g., corners between neighboring side surface display areas SDA). As shown in FIG. 6C, corner display areas CDA may be disposed at opposite sides of the front display area FDA.

When the first radius R1 of curvature of the first side surface display area SDA1 and the second radius R2 of curvature of the second side surface display area SDA2 are different from each other, the radius of curvature in the corner display area CDA may be gradually changed. In an embodiment, when the first radius R1 of curvature of the first side surface display area SDA1 is greater than the second radius R2 of curvature of the second side surface display area SDA2, the radius of curvature of the corner display area CDA may gradually decrease in a direction from the first side surface display area SDA1 toward the second side surface display area SDA2. For example, a third radius R3 of curvature of the corner display area CDA may be less than the first radius R1 of curvature and greater than the second radius R2 of curvature.

The corner display area CDA may include a first corner display area CDA1 and a second corner display area CDA2. The first corner display area CDA1 may be farther away from the front display area FDA than the second corner display area CDA2 is from the front display area FDA. For example, the second corner display area CDA2 may be disposed between the first corner display area CDA1 and the front display area FDA.

A second pixel PX2 including a display element may be disposed in the first corner display area CDA1. Accordingly, the first corner display area CDA1 may display an image (e.g., may display an image using a plurality of second pixels PX2).

The second corner display area CDA2 may include a third pixel PX3. Accordingly, the second corner display area CDA2 may display an image (e.g., may display an image using a plurality of third pixels PX3). Furthermore, in an embodiment, a driving circuit for providing an electrical signal and/or a voltage wiring for providing a voltage may be disposed in the second corner display area CDA2, and the third pixel PX3 may overlap the driving circuit and/or the power wiring. In this case, the display element of the third pixel PX3 may be disposed above the driving circuit and/or the power wiring. In some embodiments, the second corner display area CDA2 may be omitted. In this case, the driving circuit and/or the voltage wiring may be disposed in the peripheral area PA.

The display device 1 may display an image not only in the front display area FDA, but also in the side surface display area SDA and the corner display area CDA. Accordingly, a portion of the display area DA in the display device 1 may increase. Furthermore, as the display device 1 may be bent at the corner and may include the corner display area CDA where an image is displayed, the display device 1 may have an improved aesthetic appearance.

Figure 7:
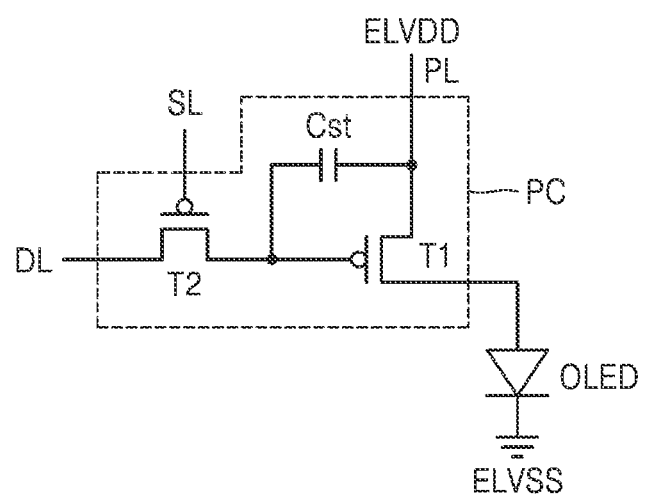
FIG. 7 is a schematic equivalent circuit diagram of a pixel circuit to be applied to a display panel.

FIG. 7 is a schematic equivalent circuit diagram of a pixel circuit PC to be applied to the display panel 10.

Referring to FIG. 7, the pixel circuit PC may be connected to a display element, for example, an organic light-emitting diode OLED.

The pixel circuit PC may include a driving thin film transistor T1, a switching thin film transistor T2, and the storage capacitor Cst. The organic light-emitting diode OLED may emit red light, green light, or blue light, or red light, green light, blue light, or white light.

The switching thin film transistor T2 may be connected to a scan line SL and a data line DL, and may transmit a data signal or a data voltage input from the data line DL to the driving thin film transistor T1, based on a scan signal or a switching voltage input from the scan line SL. The storage capacitor Cst may be connected to the switching thin film transistor T2 and a driving voltage line PL, and may store a voltage equivalent to a difference between the voltage received from the switching thin film transistor T2 and a first power voltage ELVDD supplied to the driving voltage line PL.

The driving thin film transistor T1 may be connected to the driving voltage line PL and the storage capacitor Cst, and may control a driving current flowing from the driving voltage line PL to the organic light-emitting diode OLED corresponding to the voltage value stored in the storage capacitor Cst. The organic light-emitting diode OLED may emit light having a certain luminance in accordance with the driving current. A counter electrode of the organic light-emitting diode OLED may receive a second power voltage ELVSS.

Although FIG. 7 illustrates that the pixel circuit PC includes two thin film transistors and one storage capacitor, any suitable number of thin film transistors and storage capacitors may be used to form the pixel circuit PC. For example, the pixel circuit PC may include three, four, five, or more thin film transistors with suitable changes to the circuit.

Figure 8:
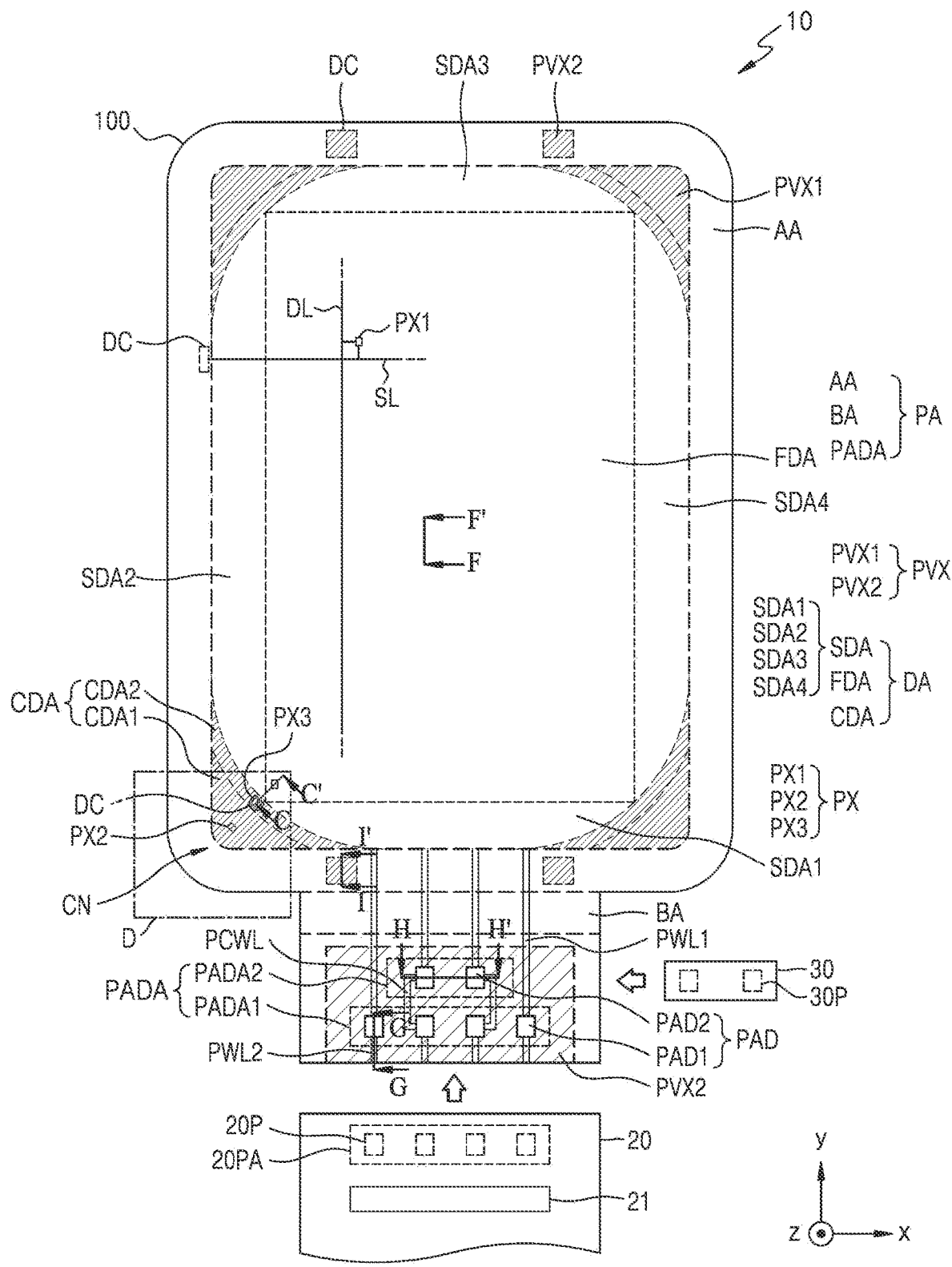
FIG. 8 is a schematic plan view of a display panel according to an embodiment.

FIG. 8 is a schematic plan view of the display panel 10 according to an embodiment. FIG. 8 is a schematic plan view of a shape of the display panel 10 being unbent before the side surface display area SDA and the corner display area CDA of the display panel 10 is bent.

Referring to FIG. 8, the display panel 10 may include a display element. In the following description, a case of an organic light-emitting display panel using an organic light-emitting diode OLED as the display element of the display panel 10 is primarily described in more detail.

The display panel 10 may include the display area DA and the peripheral area PA. The display area DA is where the pixels PX display an image, and the peripheral area PA is an area around (e.g., at least partially surrounding) the display area DA. In an embodiment, the peripheral area PA may entirely surround the display area DA.

Each of the pixels PX may include sub-pixels, and each of the sub-pixels may emit a color light (e.g., light having a certain color) by using an organic light-emitting diode OLED as a display element. In the present specification, a sub-pixel may refer to an emission area as a minimum unit for implementing an image. When an organic light-emitting diode OLED is employed as a display element, the emission area may be defined by an opening of a pixel definition layer, which is described below.

The display panel 10 may include the substrate 100 and a multilayer film disposed on the substrate 100. In this case, the display area DA and the peripheral area PA may be defined in the substrate 100 and/or the multilayer film. In other words, the substrate 100 and/or the multilayer film may include the display area DA and the peripheral area PA. In the following description, a case in which the display area DA and the peripheral area PA are defined in the substrate 100 is primarily described in more detail.

The peripheral area PA is where no image is provided, which is a non-display area. The peripheral area PA may be around (e.g., at least partially surround) the display area DA. In an embodiment, the peripheral area PA may include an adjacent area AA, a bending area BA, and a pad area PADA.

The adjacent area AA may be around (e.g., at least partially surround) the display area DA. In an embodiment, the adjacent area AA may entirely surround the display area DA. The adjacent area AA may be disposed closer to the display area DA than the pad area PADA is to the display area DA.

A driving circuit DC for providing an electrical signal, or a power wiring for providing power, and the like, to the pixels PX may be disposed in the adjacent area AA. For example, the driving circuit DC may be a scan driving circuit for providing a scan signal to each pixel PX through the scan line SL, or a data driving circuit for providing a data signal to each pixel PX through the data line DL.

The pad area PADA may be disposed outside the display area DA. In an embodiment, the pad area PADA may be disposed farther away from the display area DA than the bending area BA is from the display area DA. For example, the bending area BA may be between the display area DA and the pad area PADA. The pad area PADA may include a first pad area PADA1 and a second pad area PADA2.

The first pad area PADA1 may be disposed farther away from the display area DA than the second pad area PADA2 is from the display area DA. For example, the second pad area PADA2 may be between the display area DA and the first pad area PADA1. The first pad area PADA1 may include an edge of the peripheral area PA. The first pad PAD1 may be disposed in the first pad area PADA1. In an embodiment, the first pad PAD1 may include a plurality of first pads PAD1. The plurality of first pads PAD1 may be spaced from one another.

The first pad PAD1 may be connected to a pad wiring. In an embodiment, the first pad PAD1 may be connected to at least one of a first pad wiring PWL1, a second pad wiring PWL2, or a pad connection wiring PCWL. The first pad wiring PWL1 may extend from the first pad area PADA1 to the display area DA. The second pad wiring PWL2 may extend from the first pad PAD1 to the edge of the display panel 10. The second pad wiring PWL2 may be cut or discontinued at the edge of the display panel 10. The second pad wiring PWL2 may connect (e.g., electrically connect) the first pad PAD1 to a test pad during the manufacturing of a display device. When the test pad is removed, the second pad wiring PWL2 may be cut or discontinued. The pad connection wiring PCWL may connect (e.g., electrically connect) the first pad PAD1 to a second pad PAD2.

In an embodiment, any one of the plurality of first pads PAD1 may be connected to the first pad wiring PWL1 and the second pad wiring PWL2. In an embodiment, another one of the plurality of first pads PAD1 may be connected to the pad connection wiring PCWL and the second pad wiring PWL2. Accordingly, any one of the plurality of first pads PAD1 may be connected (e.g., electrically connected) to the second pad PAD2.

A display circuit board 20 may be connected (e.g., electrically connected) to the display panel 10. For example, a pad 20P of the display circuit board 20 may be connected (e.g., electrically connected) to the first pad PAD1 of the substrate 100 by an anisotropic conductive film. In this case, the first pad area PADA1 may overlap a pad area 20PA of the display circuit board 20.

The display circuit board 20 may include a flexible printed circuit board (FPCB) that is bendable or a rigid printed circuit board (PCB) that is rigid so as not to be easily bent. Alternatively, in an embodiment, the display circuit board 20 may include a printed circuit board (e.g., a complex printed circuit board) including both the rigid printed circuit board and the flexible printed circuit board.

In an embodiment, a first driving portion 21 may be disposed on the display circuit board 20. The first driving portion 21 may include an integrated circuit (IC). The first driving portion 21 may be attached to the display circuit board 20. In an embodiment, the first driving portion 21 may generate and output signals and voltages to drive the display panel 10.

The second pad area PADA2 may be disposed closer to the display area DA than the first pad area PADA1 is to the display area DA. The second pad PAD2 may be disposed in the second pad area PADA2. In an embodiment, the second pad PAD2 may include a plurality of second pads PAD2. The second pads PAD2 may be spaced from one another.

The second pad PAD2 may be connected to the pad wiring. The second pad PAD2 may be connected to the first pad wiring PWL1 and the pad connection wiring PCWL. The first pad wiring PWL1 may extend from the second pad area PADA2 to the display area DA. The first pad wiring PWL1 may include a plurality of first pad wirings PWL1. Any one of the first pad wirings PWL1 may be connected (e.g., electrically connected) to the first pad PAD1. Another one of the first pad wirings PWL1 may be connected (e.g., electrically connected) to the second pad PAD2. In some embodiments, the second pad PAD2 may be connected (e.g., electrically connected) to the second pad wiring PWL2.

A second driving portion 30 may be connected (e.g., electrically connected) to the display panel 10. For example, a pad 30P of the second driving portion 30 may be connected (e.g., electrically connected) to the second pad PAD2 of the substrate 100 and an anisotropic conductive film. In this case, the second pad area PADA2 may overlap the second driving portion 30.

The second driving portion 30 may receive control signals and power voltages, and may generate and output signals and voltages to drive the display panel 10. The second driving portion 30 may include an IC.

The bending area BA may be disposed between the display area DA and the pad area PADA. The bending area BA may be disposed between the adjacent area AA and the pad area PADA. The pad area PADA may be connected to the adjacent area AA through the bending area BA.

The bending area BA may be bent. At least parts of a lower surface of the display panel 10 may face each other. The lower surface of the display panel 10 may be a surface opposite to an upper surface of the display panel 10. The upper surface of the display panel 10 may be a surface where an image is displayed. In this case, an area of the peripheral area PA that is perceived by a user may be reduced.

The display area DA may include the front display area FDA, the side surface display area SDA, and the corner display area CDA. The first pixel PX1 having a display element may be disposed in the front display area FDA. The front display area FDA may be a flat portion. In an embodiment, most of the front display area FDA may provide an image.

The pixel PX including a display element may be disposed in the side surface display area SDA that is bendable. For example, as described above with reference to FIG. 5, the side surface display area SDA may be an area that is bent from the front display area FDA. The side surface display area SDA may include the first side surface display area SDA1, the second side surface display area SDA2, the third side surface display area SDA3, and the fourth side surface display area SDA4.

The first side surface display area SDA1 and the third side surface display area SDA3 may extend from the front display area FDA in the first direction, for example, the y direction or the −y direction. Furthermore, the second side surface display area SDA2 and the fourth side surface display area SDA4 may extend from the front display area FDA in the second direction, for example, the x direction or the −x direction.

The corner display area CDA may be disposed at the corner CN of the display panel 10. In this case, the corner CN of the display panel 10 may be a portion where the long side in the first direction, for example, the y direction or the −y direction, of the edge of the display panel 10 and the short side in the second direction, for example, the x direction or the −x direction, of the edge of the display panel 10 meet.

The corner display area CDA may be disposed between the neighboring side surface display areas SDA. For example, the corner display area CDA may be disposed between the first side surface display area SDA1 and the second side surface display area SDA2. Alternatively, the corner display area CDA may disposed between the second side surface display area SDA2 and the third side surface display area SDA3, between the third side surface display area SDA3 and the fourth side surface display area SDA4, or between the fourth side surface display area SDA4 and the first side surface display area SDA1. In the following description, the corner display area CDA disposed between the first side surface display area SDA1 and the second side surface display area SDA2 is primarily described in more detail.

The corner display area CDA may be around (e.g., surround) at least part of the front display area FDA. For example, the corner display area CDA may be disposed between the first side surface display area SDA1 and the second side surface display area SDA2 and may be around (e.g., surround) at least part of the front display area FDA.

The corner display area CDA may include the first corner display area CDA1 and the second corner display area CDA2. The second corner display area CDA2 may be disposed between the first corner display area CDA1 and the front display area FDA.

The second pixel PX2 having a display element may be disposed in the first corner display area CDA1 that is bendable. In an embodiment, the first corner display area CDA1, as described above with reference to FIG. 5, may be disposed corresponding to the corner CN and may be an area that is bent from the front display area FDA.

The second corner display area CDA2 may extend between the side surface display area SDA and the first corner display area CDA1. For example, the second corner display area CDA2 may extend between the first side surface display area SDA1 and the first corner display area CDA1 and/or between the second side surface display area SDA2 and the first corner display area CDA1. In an embodiment, the second corner display area CDA2 may be bendable.

The third pixel PX3 having a display element may be disposed in the second corner display area CDA2. Furthermore, in an embodiment, a driving circuit DC for providing an electrical signal or a power wiring for providing a voltage may be disposed in the second corner display area CDA2. In an embodiment, the driving circuit DC may be disposed along the second corner display area CDA2 and/or the peripheral area PA. In this case, the third pixel PX3 that is disposed in the second corner display area CDA2 may overlap the driving circuit DC or the power wiring. In another embodiment, the second corner display area CDA2 may be omitted.

The display panel 10 may include an inorganic pattern layer PVX. The inorganic pattern layer PVX may include the first inorganic pattern layer PVX1 and the second inorganic pattern layer PVX2. The first inorganic pattern layer PVX1 may overlap the display area DA. In an embodiment, the first inorganic pattern layer PVX1 may overlap the corner display area CDA. For example, the first inorganic pattern layer PVX1 may overlap the first corner display area CDA1 and/or the second corner display area CDA2. In some embodiments, the first inorganic pattern layer PVX1 may overlap the first corner display area CDA1 and may be spaced from the second corner display area CDA2.

The first inorganic pattern layer PVX1 may prevent or reduce infiltration of external moisture and/or oxygen into the corner display area CDA, which is described below.

The second inorganic pattern layer PVX2 may be disposed in the peripheral area PA. In an embodiment, the second inorganic pattern layer PVX2 may be disposed in the pad area PADA. The second inorganic pattern layer PVX2 may be disposed in the first pad area PADA1. The second inorganic pattern layer PVX2 may extend to the edge of the peripheral area PA. The second inorganic pattern layer PVX2 may overlap at least one of the first pad wiring PWL1, the second pad wiring PWL2, or the pad connection wiring PCWL. For example, the second inorganic pattern layer PVX2 may overlap at least part of the first pad wiring PWL1, the second pad wiring PWL2, and the pad connection wiring PCWL.

In an embodiment, the first inorganic pattern layer PVX1 may be formed in the corner display area CDA by forming an inorganic layer on the surface (e.g., the entire surface) of the display panel 10, and then patterning the inorganic layer. In this case, at least one of the inorganic insulating layer, the first pad wiring PWL1, the second pad wiring PWL2, or the pad connection wiring PCWL, which are formed in the pad area PADA, may be etched or damaged in the patterning process, and thus the reliability of the display panel 10 may be reduced or deteriorated. In an embodiment according to the present disclosure, damage to at least one of the inorganic insulating layer, the first pad wiring PWL1, the second pad wiring PWL2, or the pad connection wiring PCWL may be prevented or reduced by disposing the second inorganic pattern layer PVX2 in the pad area PADA. Accordingly, the reliability of the display panel 10 may be improved.

In an embodiment, the second inorganic pattern layer PVX2 may be disposed in the adjacent area AA. The second inorganic pattern layer PVX2 may include a plurality of second inorganic pattern layers PVX2 and may be disposed in the adjacent area AA. In an embodiment, the second inorganic pattern layers PVX2 may be spaced from each other in the first direction, for example, the y direction or the –y direction, with the display area DA therebetween. Furthermore, the second inorganic pattern layer PVX2 may be spaced from each other in the second direction, for example, the x direction or the –x direction. In an embodiment, the second inorganic pattern layers PVX2 may be disposed adjacent to the first side surface display area SDA1 and/or the third side surface display area SDA3.

The second inorganic pattern layer PVX2 may overlap the driving circuit DC disposed on the adjacent area AA. For example, the second inorganic pattern layer PVX2 may overlap the driving circuit DC disposed outside the first side surface display area SDA1 and the third side surface display area SDA3.

In an embodiment, to form the first inorganic pattern layer PVX1 in the corner display area CDA, an inorganic layer may be formed on the surface (e.g., the entire surface) of the display panel 10 and then patterned. In this case, part of the inorganic insulating layer disposed in the adjacent area AA and the wiring may be etched or damaged in the patterning process, the reliability of the display panel 10 may be reduced or deteriorated. In an embodiment according to the present disclosure, as the second inorganic pattern layer PVX2 is disposed in the adjacent area AA, damage to the inorganic insulating layer and the wiring may be prevented or reduced.

At least one of the side surface display area SDA or the corner display area CDA may be bendable. In this case, the first side surface display area SDA1 of the side surface display area SDA may be bent with a first radius of curvature, and the second side surface display area SDA2 of the side surface display area SDA may be bent with a second radius of curvature. When the first radius of curvature is greater than the second radius of curvature, the radius of curvature with which the corner display area CDA is bent may gradually decrease in a direction from the first side surface display area SDA1 toward the second side surface display area SDA2.

When the corner display area CDA is bent, compressive strain may be generated greater than tensile strain in the corner display area CDA. In this case, a compressible substrate and multilayer film structure may be applied to the first corner display area CDA1 of the corner display area CDA. Accordingly, the shape of the substrate 100 or a stack structure of a multilayer film disposed in the first corner display area CDA1 may be different from the shape of the substrate 100 or a stack structure of a multilayer film disposed in the front display area FDA. In an embodiment, the substrate 100 may include a plurality of extension portions extending in a direction away from the front display area FDA and overlapping at least part of the first corner display area CDA1. A penetration portion that penetrates the display panel 10 may be defined between the adjacent extension portions.

Figure 9:
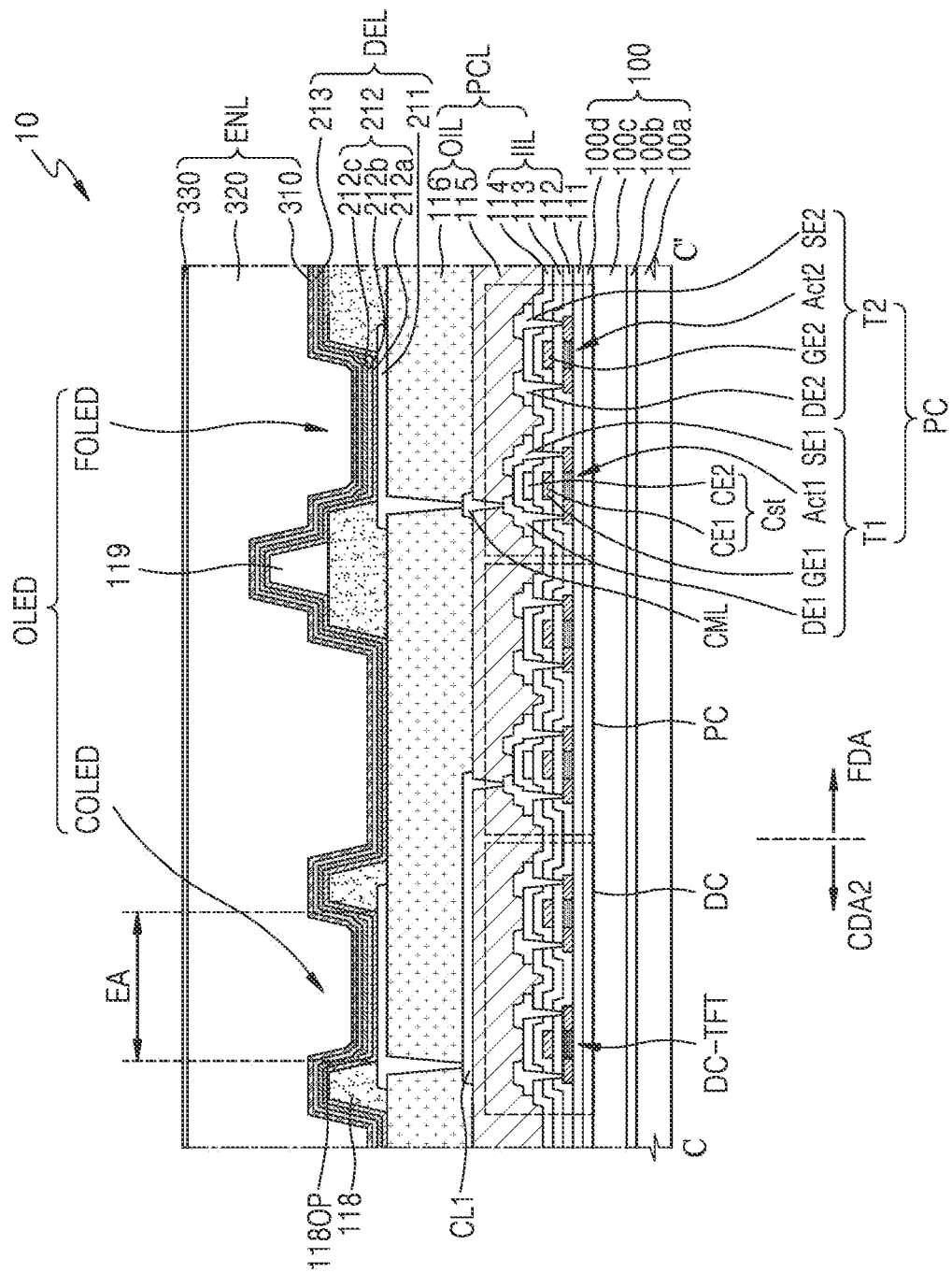
FIG. 9 is a cross-sectional view of the display panel of FIG. 8 taken along the line C-C'.

FIG. 9 is a cross-sectional view of the display panel 10 of FIG. 8 taken along the line C-C'. In FIG. 9, the same reference symbols as those of FIG. 2 denote the same members, and repetitive descriptions thereof may not be repeated.

Referring to FIG. 9, the display panel 10 may include the substrate 100, the buffer layer 111, the pixel circuit layer PCL, the display element layer DEL, and an encapsulation layer ENL.

In an embodiment, the substrate 100 may include the first base layer 100a, the first barrier layer 100b, the second base layer 100c, and the second barrier layer 100d. In an embodiment, the first base layer 100a, the first barrier layer 100b, the second base layer 100c, and the second barrier layer 100d may be stacked (e.g., sequentially stacked) in the substrate 100. In another embodiment, the substrate 100 may include glass. The buffer layer 111 may be disposed on the substrate 100.

The pixel circuit layer PCL may be disposed on the buffer layer 111. The pixel circuit layer PCL may include the driving circuit DC and the pixel circuit PC. In an embodiment, the driving circuit DC may be disposed in the second corner display area CDA2. In an embodiment, the driving circuit DC may not be disposed in the second corner display area CDA2. In this case, the driving circuit DC may be disposed in the peripheral area PA. In the following description, a case in which the driving circuit DC is disposed in the second corner display area CDA2 is primarily described in more detail.

The pixel circuit PC may be disposed in the front display area FDA. In an embodiment, the pixel circuit PC may be spaced from the second corner display area CDA2. In an embodiment, the pixel circuit PC may overlap the second corner display area CDA2. In the following description, a case in which the pixel circuit PC and the second corner display area CDA2 are spaced from each other is primarily described in more detail.

The driving circuit DC may include a driving circuit thin film transistor DC-TFT. In an embodiment, the driving circuit DC may be connected to the scan line SL. The pixel circuit PC may include at least one thin film transistor. In an embodiment, the pixel circuit PC may include the driving thin film transistor T1, the switching thin film transistor T2, and the storage capacitor Cst.

The pixel circuit layer PCL may include the inorganic insulating layer IIL and the organic insulating layer OIL respectively disposed below and/or above components of the driving thin film transistor T1. For example, the organic insulating layer OIL may be disposed above the components of the driving thin film transistor T1, and the inorganic insulating layer IIL may be disposed below and/or above components of the driving thin film transistor T1 depending on the portion of the inorganic insulating layer IIL and the component of the driving thin film transistor T1 as shown in FIG. 9. The inorganic insulating layer IIL may include the first gate insulating layer 112, the second gate insulating layer 113, and the interlayer insulating layer 114. The organic insulating layer OIL may include a lower organic insulating layer 115 and an upper organic insulating layer 116. The driving thin film transistor T1 may include a first semiconductor layer Act1, a first gate electrode GE1, a first source electrode SE1, and a first drain electrode DE1.

As the first semiconductor layer Act1, the first gate electrode GE1, the first source electrode SE1, and the first drain electrode DE1 of FIG. 9 are the same as or similar to the semiconductor layer Act, the gate electrode GE, the source electrode SE, and the drain electrode DE of FIG. 2, detailed descriptions thereof may not be repeated.

The switching thin film transistor T2 may include a second semiconductor layer Act2, a second gate electrode GE2, a second drain electrode DE2, and a second source electrode SE2. The second semiconductor layer Act2, the second gate electrode GE2, the second drain electrode DE2, and the second source electrode SE2 are similar to the first semiconductor layer Act1, the first gate electrode GE1, the first drain electrode DE1, and the first source electrode SE1, respectively, detailed descriptions thereof may not be repeated.

The driving circuit thin film transistor DC-TFT, similar to the switching thin film transistor T2, may include a driving circuit semiconductor layer, a driving circuit gate electrode, a driving circuit source electrode, and a driving circuit drain electrode.

The lower organic insulating layer 115 may be disposed on at least one thin film transistor. In an embodiment, the lower organic insulating layer 115 may be disposed covering the first drain electrode DE1 and the first source electrode SE1. The lower organic insulating layer 115 may include an organic material. For example, the lower organic insulating layer 115 may include an organic insulating material such as a general purpose polymer such as PMMA or PS, a polymer derivative with a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof.

A connection electrode CML and a first connection wiring CL1 may be disposed on the lower organic insulating layer 115. In this case, the connection electrode CML and the first connection wiring CL1 may be connected to the first drain electrode DE1 or the first source electrode SE1, respectively, through corresponding contact holes of the lower organic insulating layer 115. The connection electrode CML and the first connection wiring CL1 may include a material that is conductive (e.g., exhibiting superior conductivity). The connection electrode CML and the first connection wiring CL1 may include a conductive material including Mo, Al, Cu, Ti, and/or the like, and may be formed in a single layer or multiple layers including the above material. In an embodiment, the connection electrode CML and the first connection wiring CL1 may have a multilayer structure of Ti/Al/Ti.

As illustrated in FIG. 9, the first connection wiring CL1 may extend from the front display area FDA to the second corner display area CDA2. In another embodiment, the first connection wiring CL1 may extend from the peripheral area or the first corner display area to the second corner display area CDA2. In another embodiment, the first connection wiring CL1 may extend from the side surface display area to the second corner display area CDA2. The first connection wiring CL1 may overlap the driving circuit thin film transistor DC-TFT.

The upper organic insulating layer 116 may be disposed covering the connection electrode CML and the first connection wiring CL1. In an embodiment, the upper organic insulating layer 116 may be disposed on at least one thin film transistor of the pixel circuit PC. The upper organic insulating layer 116 may include an organic insulating layer. The upper organic insulating layer 116 may include an organic insulating material such as a general purpose polymer such as PMMA or PS, a polymer derivative with a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof.

The display element layer DEL may be disposed on the pixel circuit layer PCL. The display element layer DEL may include an organic light-emitting diode OLED. The display element layer DEL may include a front organic light-emitting diode FOLED disposed in the front display area FDA and a corner organic light-emitting diode COLED disposed in the second corner display area CDA2. The corner organic light-emitting diode COLED may overlap the driving circuit DC. Accordingly, in an embodiment, an image may be displayed even in the second corner display area CDA2 in which the driving circuit DC is disposed.

The pixel electrode 211 of the front organic light-emitting diode FOLED may be connected (e.g., electrically connected) to the connection electrode CML through a contact hole of the upper organic insulating layer 116. The pixel electrode 211 of the corner organic light-emitting diode COLED may be connected to the first connection wiring CL1 through the contact hole of the upper organic insulating layer 116.

The pixel definition layer 118 having the opening 118OP for exposing a central portion of the pixel electrode 211 may be disposed on the pixel electrode 211. The pixel definition layer 118 may include an organic insulating material and/or an inorganic insulating material. The opening 118OP may define an emission area of light emitted from the organic light-emitting diode OLED (hereinafter, referred to as the emission area EA). For example, the width of the opening 118OP may correspond to the width of the emission area EA. Furthermore, the width of the opening 118OP may correspond to the width of a sub-pixel. The spacer 119 may be disposed on the pixel definition layer 118.

The intermediate layer 212 may be disposed on the pixel definition layer 118. The intermediate layer 212 may include the light-emitting layer 212b disposed in the opening 118OP of the pixel definition layer 118. The first functional layer 212a and the second functional layer 212c may be respectively disposed below and above the light-emitting layer 212b. The counter electrode 213 may be disposed on the second functional layer 212c.

The encapsulation layer ENL may be disposed on the counter electrode 213. In an embodiment, the encapsulation layer ENL may include at least one inorganic encapsulation layer and at least one organic encapsulation layer. In an embodiment, FIG. 9 illustrates that the encapsulation layer ENL may include a first inorganic encapsulation layer 310, an organic encapsulation layer 320, and a second inorganic encapsulation layer 330, which are stacked (e.g., sequentially stacked).

The first inorganic encapsulation layer 310 and the second inorganic encapsulation layer 330 each may include one or more inorganic materials such as $Al_2O_3$, $TiO_2$, $Ta_2O_5$, $HfO_2$, ZnO (such as ZnO and/or $ZnO_2$), $SiO_2$, $SiN_x$, and SiON. The organic encapsulation layer 320 may include a polymer-based material. The polymer-based material may include acrylic resin, epoxy-based resin, polyimide, polyethylene, and the like. In an embodiment, the organic encapsulation layer 320 may include acrylate.

In some embodiments, a touch electrode layer may be disposed on the encapsulation layer ENL, and an optical functional layer may be disposed on the touch electrode layer. The touch electrode layer may obtain an external input, for example, coordinates information according to a touch event. The optical functional layer may reduce reflectivity of light (e.g., external light) input to the display device from the outside, and/or improve color purity of light output from the display device. In an embodiment, the optical functional layer may include a retarder and/or a polarizer. The retarder may be of a film type or a liquid crystal coating type, and may include a $\lambda/2$ retarder and/or a $\lambda/4$ retarder. The polarizer may also be of a film type or a liquid crystal coating type. The film type may include a stretchable synthetic resin film, and the liquid crystal coating type may include liquid crystals oriented in a certain arrangement. The retarder and the polarizer each may further include a protective film.

In another embodiment, the optical functional layer may include a black matrix and color filters. The color filters may be arranged considering the color of light emitted from each of the pixels of the display device. Each of the color filters may include red, green, or blue pigment or dye. Alternatively, each of the color filters may further include quantum dots other than the above-described pigment or dye. Alternatively, some of the color filters may not include the above-described pigment or dye, and may include scattering particles such as a titanium oxide.

In another embodiment, the optical functional layer may include a destructive interference structure. The destructive interference structure may include a first reflective layer and a second reflective layer, which are disposed at different layers. A first reflection light and a second reflection light respectively reflected from the first reflective layer and the second reflective layer may be destructively interfered (e.g., destructively interfere with each other), and thus reflectivity of external light may be reduced.

An adhesive member may be disposed between the touch electrode layer and the optical functional layer. General materials known to one of ordinary skill in the art may be employed as the adhesive member without limitation. The adhesive member may include a pressure sensitive adhesive (PSA).

Figure 10:
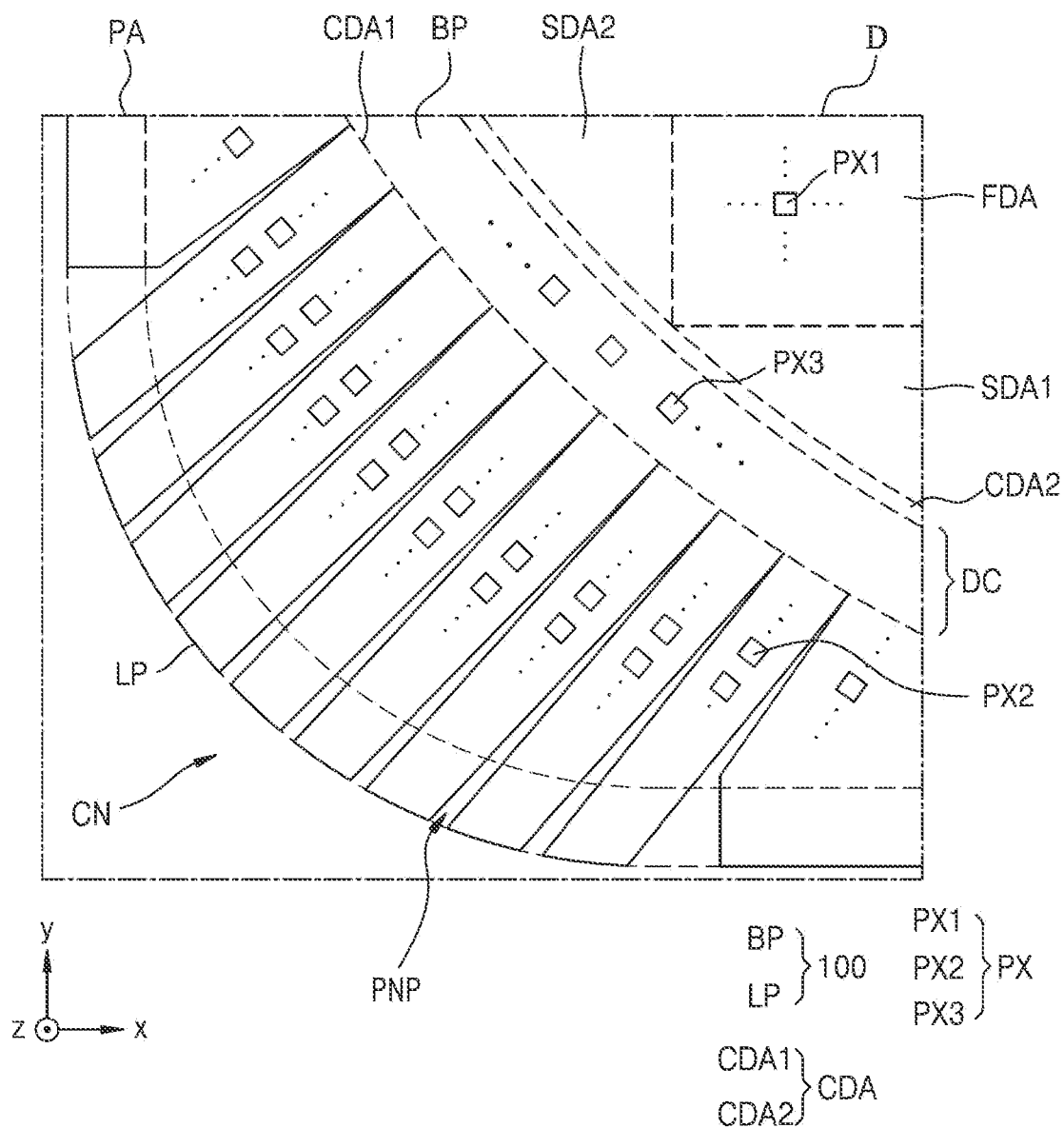
FIG. 10 is an enlarged view of a corner of a display panel according to an embodiment.

FIG. 10 is an enlarged view of the corner CN of the display panel according to an embodiment. FIG. 10 is an enlarged view of a region D of FIG. 8. In FIG. 10, the same reference symbols as those of FIG. 8 denote the same members, and repetitive descriptions thereof may not be repeated.

Referring to FIG. 10, the display panel may include the corner CN. In this case, the substrate 100 may include the front display area FDA, the first side surface display area SDA1, the second side surface display area SDA2, the corner display area CDA, and the peripheral area PA. The corner display area CDA may be disposed at the corner CN of the display panel. Furthermore, the corner display area CDA may be disposed between the front display area FDA and the peripheral area PA. The corner display area CDA may include the first corner display area CDA1 and the second corner display area CDA2. The first corner display area CDA1 may be disposed farther away from the front display area FDA than the second corner display area CDA2 is from the front display area FDA. The second corner display area CDA2 may be disposed between the first corner display area CDA1 and the front display area FDA.

The first pixel PX1 may be disposed in the front display area FDA. The second pixel PX2 may be disposed in the first corner display area CDA1. The third pixel PX3 overlapping the driving circuit DC and the driving circuit DC may be disposed in the second corner display area CDA2. In some embodiments, the second corner display area CDA2 may be omitted.

The substrate 100 may include a plurality of extension portions LP overlapping at least part of the first corner display area CDA1. Each of the plurality of extension portions LP may extend in a direction away from the front display area FDA. In an embodiment, the substrate 100 may include a body portion BP and an extension portion LP. The body portion BP may overlap the front display area FDA, the first side surface display area SDA1, the second side surface display area SDA2, and the second corner display area CDA2. The extension portion LP may overlap the first corner display area CDA1.

The plurality of extension portions LP each may extend in a direction away from the body portion BP. In an embodiment, the plurality of extension portions LP may overlap the first corner display area CDA1 and the peripheral area PA. In this case, the second pixel PX2 may be disposed on the extension portion LP. The second pixel PX2 may include a plurality of second pixels PX2 which are disposed in parallel in an extension direction of the extension portion LP.

Edges of the neighboring extension portions LP may be spaced from each other and face each other. For example, a penetration portion PNP may be defined between the neighboring extension portions LP. The penetration portion PNP may penetrate the display panel. When the corner display area CDA is bent at the corner CN, compressive strain may be generated greater than tensile strain in the corner display area CDA. As the penetration portion PNP is defined between the neighboring extension portions LP, the plurality of extension portions LP may shrink. Accordingly, when the corner display area CDA is bent, the display panel may be bendable without damage.

Figure 11:
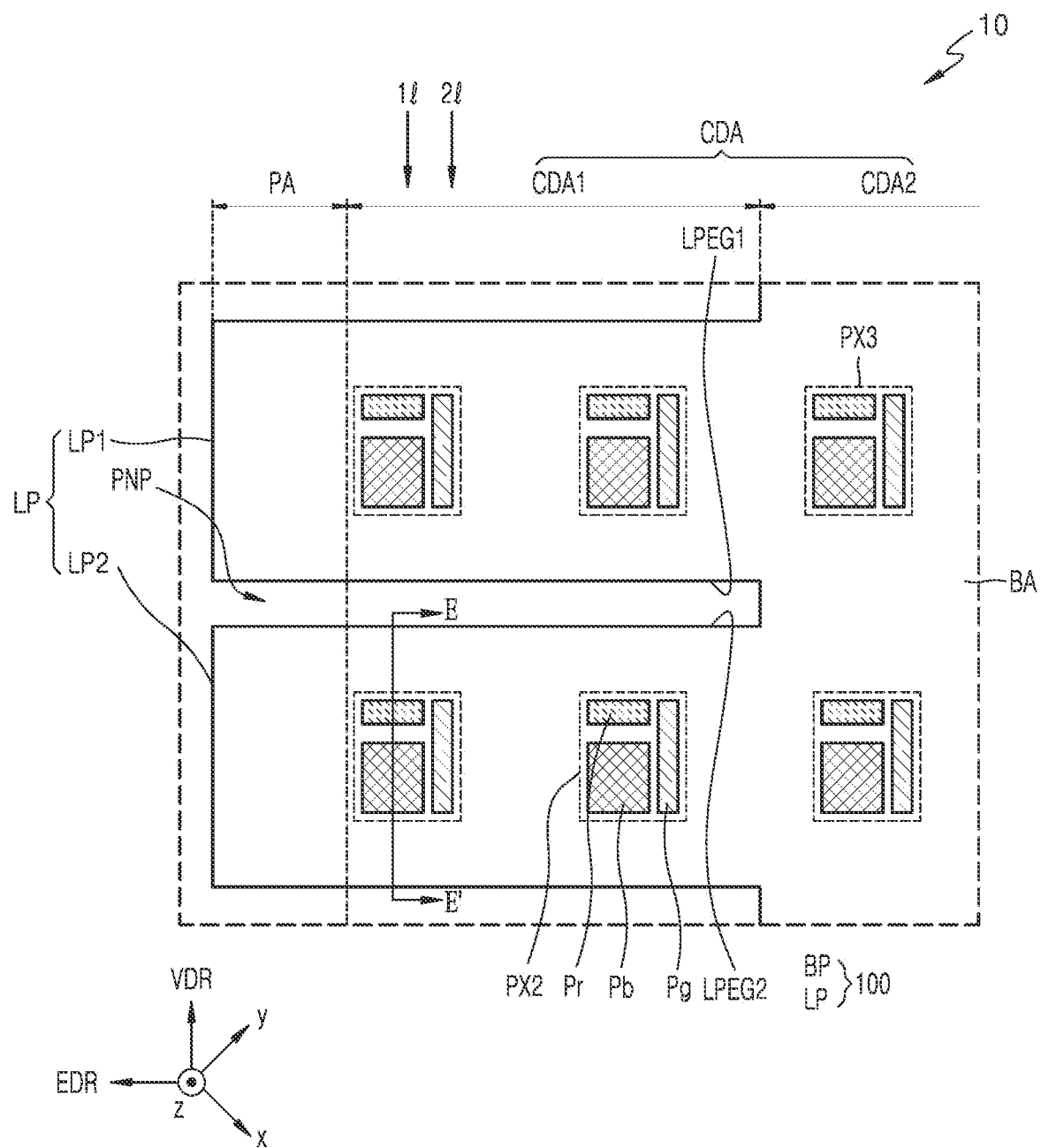
FIG. 11 is a schematic plan view of a body portion and an extension portion according to an embodiment.

FIG. 11 is a schematic plan view of the body portion BP and the extension portion LP according to an embodiment.

Referring to FIG. 11, the display panel may include the substrate and a plurality of pixels (such as, the plurality of second pixels PX2 and the plurality of third pixels PX3) disposed on the substrate. The substrate 100 may include the plurality of extension portions LP extending in a direction away from the display area. In an embodiment, the substrate 100 may include the body portion BP and the extension portion LP. The body portion BP may overlap the second corner display area CDA2.

The plurality of extension portions LP each may extend in a direction away from the body portion BP. The extension portion LP may extend in a direction away from the front display area. The extension portion LP may overlap at least part of the first corner display area CDA1. In an embodiment, the extension portion LP may overlap the peripheral area PA.

The extension portion LP may extend in an extension direction EDR. In an embodiment, the extension direction EDR may be a direction crossing the first direction, for example, the y direction or the −y direction, and the second direction, for example, the x direction or the −x direction.

The extension portion LP may include a first extension portion LP1 and a second extension portion LP2. In an embodiment, the first extension portion LP1 and the second extension portion LP2 may overlap at least part of the first corner display area CDA1.

In an embodiment, the first extension portion LP1 and the second extension portion LP2 may extend in directions different from each other. In another embodiment, the first extension portion LP1 and the second extension portion LP2 may extend in the same direction. In the following description, a case in which the first extension portion LP1 and the second extension portion LP2 extend in the same extension direction EDR is primarily described in more detail.

The first extension portion LP1 and the second extension portion LP2 may be spaced from each other in a vertical direction VDR. In an embodiment, the vertical direction VDR may be a direction perpendicular to the extension direction EDR.

The first extension portion LP1 and the second extension portion LP2 may be spaced from each other with the penetration portion PNP therebetween. In an embodiment, the elements of the display panel may not be disposed between the first extension portion LP1 and the second extension portion LP2.

An edge LPEG1 of the first extension portion LP1 and an edge LPEG2 of the second extension portion LP2 may be spaced from each other and face each other. For example, the edge LPEG1 of the first extension portion LP1 and the edge LPEG2 of the second extension portion LP2 may define at least part of the penetration portion PNP.

The second pixel PX2 may be disposed in the first corner display area CDA1. In an embodiment, the plurality of second pixels PX2 may be disposed in parallel in the extension direction EDR of the extension portion LP.

The third pixel PX3 may include a plurality of third pixels PX3 which are disposed in the second corner display area CDA2. In an embodiment, the plurality of third pixels PX3 may be disposed in parallel in the extension direction EDR of the extension portion LP. In this case, the third pixels PX3 may be disposed parallel to the second pixels PX2.

The second pixel PX2 and the third pixel PX3 each may include a red sub-pixel Pr, a green sub-pixel Pg, and a blue sub-pixel Pb. The red sub-pixel Pr, the green sub-pixel Pg, and the blue sub-pixel Pb may emit red light, green light, and blue light, respectively.

A sub-pixel arrangement structure of the second pixel PX2 and a sub-pixel arrangement structure of the third pixel PX3 each may be provided as an S-stripe structure. The second pixel PX2 and the third pixel PX3 each may include the red sub-pixel Pr, the green sub-pixel Pg, and the blue sub-pixel Pb.

The red sub-pixel Pr and the blue sub-pixel Pb may be disposed in a first column 1*l* (e.g., a first column 1*l* of a pixel), and the green sub-pixel Pg may be disposed in a second column 2*l* (e.g., a second column 2*l* of the pixel) adjacent to the first column 1*l*. In this case, the red sub-pixel Pr and the blue sub-pixel Pb may be arranged in a rectangular shape, and the green sub-pixel Pg may be arranged in a rectangular shape having a long side in the vertical direction VDR. For example, a side of the red sub-pixel Pr and a side of the blue sub-pixel Pb may be disposed to face a long side of the green sub-pixel Pg. In an embodiment, the length of a side of the red sub-pixel Pr in the vertical direction VDR perpendicular to the extension direction EDR may be less than the length of a side of the blue sub-pixel Pb in the vertical direction VDR.

In another embodiment, the sub-pixel arrangement structure of the second pixel PX2 and the sub-pixel arrangement structure of the third pixel PX3 each may be an RGBG type or a PENTILE® type (PENTILE® is a registered trademark of Samsung Display Co., Ltd., Republic of Korea). In another embodiment, the sub-pixel arrangement structure of the second pixel PX2 and the sub-pixel arrangement structure of the third pixel PX3 may be a stripe type.

Figure 12:
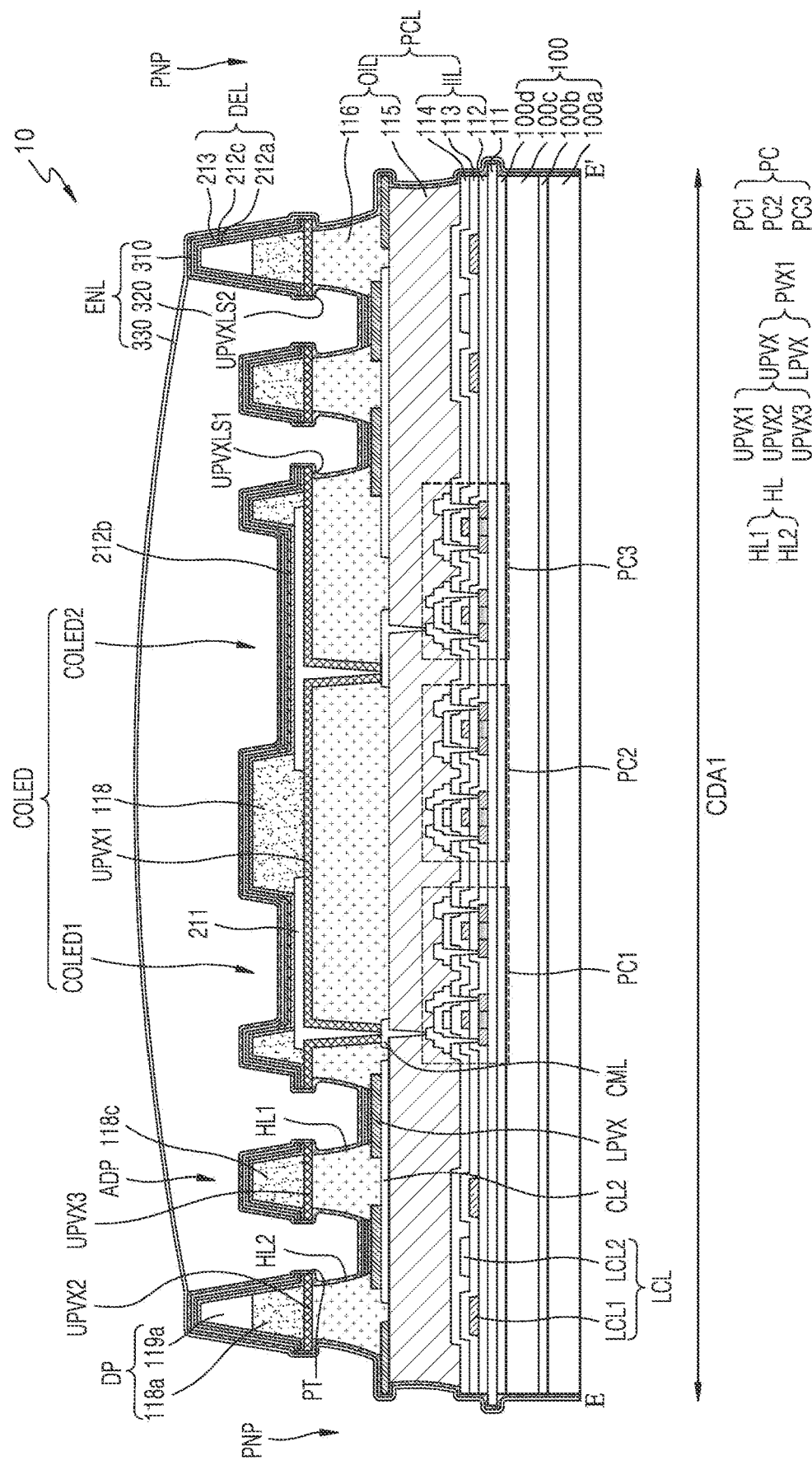
FIG. 12 is a cross-sectional view of the display panel of FIG. 11 taken along the line E-E'.

FIG. 12 is a cross-sectional view of the display panel of FIG. 11 taken along the line E-E'. In FIG. 12, the same reference symbols as those of FIG. 9 denote the same members, and repetitive descriptions thereof may not be repeated.

Referring to FIG. 12, the display panel 10 may include the substrate 100, the buffer layer 111, the pixel circuit layer PCL, the first inorganic pattern layer PVX1, the display element layer DEL, and the encapsulation layer ENL. The pixel circuit layer PCL may include a lower connection wiring LCL, the pixel circuit PC, the inorganic insulating layer IIL, and the organic insulating layer OIL. The inorganic insulating layer IIL may include the first gate insulating layer 112, the second gate insulating layer 113, and the interlayer insulating layer 114. The organic insulating layer OIL may include the lower organic insulating layer 115 and the upper organic insulating layer 116. The organic insulating layer OIL may be at least one of the lower organic insulating layer 115 or the upper organic insulating layer 116. In an embodiment, the organic insulating layer OIL may be the lower organic insulating layer 115.

The lower connection wiring LCL may include a first lower connection wiring LCL1 and a second lower connection wiring LCL2. The first lower connection wiring LCL1 and the second lower connection wiring LCL2 may be at different layers from each other. The first lower connection wiring LCL1 may be disposed between the first gate insulating layer 112 and the second gate insulating layer 113. The second lower connection wiring LCL2 may be disposed between the second gate insulating layer 113 and the interlayer insulating layer 114. In an embodiment, the first lower connection wiring LCL1 and the second lower connection wiring LCL2 may be alternately disposed to each other. Accordingly, the width of an extension portion may be reduced.

The pixel circuit PC may include a first pixel circuit PC1, a second pixel circuit PC2, and a third pixel circuit PC3. The first pixel circuit PC1 may be connected to a red corner organic light-emitting diode COLED1. In some embodiments, the second pixel circuit PC2 may be connected to a green corner organic light-emitting diode. The third pixel circuit PC3 may be connected to a blue corner organic light-emitting diode COLED2. In an embodiment, the size of an emission area of the blue corner organic light-emitting diode COLED2 may be greater than the size of an emission are of the red corner organic light-emitting diode COLED1.

The lower organic insulating layer 115 may cover the lower connection wiring LCL and the pixel circuit PC. A second connection wiring CL2 and the connection electrode CML may be disposed on the lower organic insulating layer 115.

The first inorganic pattern layer PVX1 may overlap the first corner display area CDA1. The first inorganic pattern layer PVX1 may include a lower inorganic pattern layer LPVX and an upper inorganic pattern layer UPVX. The lower inorganic pattern layer LPVX may be disposed on the second connection wiring CL2.

The upper organic insulating layer 116 may include a hole HL, and may be disposed on the lower organic insulating layer 115. In an embodiment, the upper organic insulating layer 116 may cover an edge of the lower inorganic pattern layer LPVX and an edge of the second connection wiring CL2. The hole HL may include a first hole HL1 and a second hole HL2. The first hole HL1 may be disposed closer to the corner organic light-emitting diode COLED than the second hole HL2 is to the corner organic light-emitting diode COLED. For example, the second hole HL2 may be between the first hole HL1 and the corner organic light-emitting diode COLED.

The hole HL of the upper organic insulating layer 116 may be formed in an etching process. When the lower inorganic pattern layer LPVX is omitted, the second connection wiring CL2 may be overetched in the etching process. In this case, resistance of the second connection wiring CL2 may be increased. In the present embodiment, as the lower inorganic pattern layer LPVX is disposed on the second connection wiring CL2 to overlap the hole HL of the upper organic insulating layer 116, the second connection wiring CL2 may be prevented or substantially prevented from being overetched.

The upper inorganic pattern layer UPVX may be disposed on the upper organic insulating layer 116. The upper inorganic pattern layer UPVX may include a protruding tip PT protruding in a direction toward a center of the hole HL. The direction toward the center of the hole HL may be a direction from an inner surface of the upper organic insulating layer 116 defining the hole HL toward a center axis of the hole HL. Accordingly, a lower surface of the protruding tip PT may be exposed in the hole HL. In other words, the hole HL of the upper organic insulating layer 116 may have an undercut structure.

The upper inorganic pattern layer UPVX may include a first upper inorganic pattern layer UPVX1, a second upper inorganic pattern layer UPVX2, and a third upper inorganic pattern layer UPVX3. The first upper inorganic pattern layer UPVX1, the second upper inorganic pattern layer UPVX2, and the third upper inorganic pattern layer UPVX3 may be spaced from one another.

The first upper inorganic pattern layer UPVX1 may overlap the corner organic light-emitting diode COLED. The first upper inorganic pattern layer UPVX1 may include a protruding tip protruding in a direction toward the center of the first hole HL1.

The second upper inorganic pattern layer UPVX2 may be spaced from the first upper inorganic pattern layer UPVX1 on the upper organic insulating layer 116. The second upper inorganic pattern layer UPVX2 may include a protruding tip protruding in a direction toward the center of the second hole HL2.

The third upper inorganic pattern layer UPVX3 may be disposed between the first upper inorganic pattern layer UPVX1 and the second upper inorganic pattern layer UPVX2. The third upper inorganic pattern layer UPVX3 may be spaced from the first upper inorganic pattern layer UPVX1 and the second upper inorganic pattern layer UPVX2. A protruding tip of the third upper inorganic pattern layer UPVX3 may protrude in a direction toward the center of the first hole HL1 and/or the center of the second hole HL2.

A dam portion DP protruding from an upper surface of the upper inorganic pattern layer UPVX in a thickness direction of the substrate 100 may be disposed on the upper inorganic pattern layer UPVX. The dam portion DP may include a first corner organic pattern layer 118a and an upper corner organic pattern layer 119a.

The first corner organic pattern layer 118a may be disposed on the upper inorganic pattern layer UPVX. The first corner organic pattern layer 118a may include the same material as the pixel definition layer 118. The first corner organic pattern layer 118a may be concurrently (e.g., simultaneously) formed when the pixel definition layer 118 is formed.

The upper corner organic pattern layer 119a may be disposed on the first corner organic pattern layer 118a. The upper corner organic pattern layer 119a may include the same material as a spacer (e.g., a spacer 119 as shown in FIG. 9). The upper corner organic pattern layer 119a may be concurrently (e.g., simultaneously) formed when the spacer is formed.

An auxiliary dam portion ADP may be disposed between the corner organic light-emitting diode COLED and the dam portion DP. The auxiliary dam portion ADP may be disposed between the first hole HL1 and the second hole HL2. The auxiliary dam portion ADP may include a second corner organic pattern layer 118c.

The thickness of the dam portion DP may be greater than the thickness of the auxiliary dam portion ADP. For example, while the dam portion DP includes the first corner organic pattern layer 118a and the upper corner organic pattern layer 119a, the auxiliary dam portion ADP may include the second corner organic pattern layer 118c, and thus the thickness of the dam portion DP and the thickness of the auxiliary dam portion ADP may be different from each other. The thickness of the dam portion DP may be a distance from an upper surface of the second upper inorganic pattern layer UPVX2 to an upper surface of the upper corner organic pattern layer 119a. The thickness of the auxiliary dam portion ADP may be a distance from an upper surface of the third upper inorganic pattern layer UPVX3 to an upper surface of the second corner organic pattern layer 118c.

A distance from an upper surface of the substrate 100 to the upper surface of the upper corner organic pattern layer 119a may be greater than a distance from the upper surface of the substrate 100 to the upper surface of the second corner organic pattern layer 118c.

The dam portion DP may function similarly to the spacer 119 of FIG. 9. In a method of manufacturing the display panel 10, the upper corner organic pattern layer 119a may prevent or reduce damage to at least one of the pixel circuit layer PCL or the display element layer DEL by the mask sheet. During the manufacture of the display panel 10, the upper corner organic pattern layer 119a contacts the mask sheet so that the shape of the upper corner organic pattern layer 119a may be deformed. When the shape of the upper corner organic pattern layer 119a is deformed, the first inorganic encapsulation layer 310 may be formed along the deformed shape of the upper corner organic pattern layer 119a so that barrier properties may be weakened.

In the present embodiment, the auxiliary dam portion ADP may be disposed between the corner organic light-emitting diode COLED and the dam portion DP. As the thickness of the auxiliary dam portion ADP is less than the thickness of the dam portion DP, the auxiliary dam portion ADP may not be in contact with the mask sheet. Accordingly, the first inorganic encapsulation layer 310 may be formed on a flat upper surface of the auxiliary dam portion ADP. Accordingly, a time for external air or moisture to arrive at the corner organic light-emitting diode COLED may be delayed, and the barrier properties of the first inorganic encapsulation layer 310 may be reinforced. In some embodiments, the auxiliary dam portion ADP may have the same thickness as the dam portion DP.

The corner organic light-emitting diode COLED may be disposed on the first upper inorganic pattern layer UPVX1. The corner organic light-emitting diode COLED may overlap the first upper inorganic pattern layer UPVX1. The corner organic light-emitting diode COLED may include the pixel electrode 211, the first functional layer 212a, the light-emitting layer 212b, the second functional layer 212c, and the counter electrode 213. In an embodiment, the first functional layer 212a, the second functional layer 212c, and the counter electrode 213 may be formed on the surface (e.g., the entire surface) of the first corner display area CDA1.

As the upper inorganic pattern layer UPVX includes the protruding tip PT protruding in the direction toward the center of the hole HL, the first functional layer 212a, the second functional layer 212c, and the counter electrode 213 may be disconnected or discontinued with respect to or at the hole HL.

A lower surface UPVXLS1 of the first upper inorganic pattern layer UPVX1 (e.g., the lower surface UPVXLS1 overlapping the first hole HL1) may not be in contact with the first functional layer 212a, the second functional layer 212c, and the counter electrode 213. A lower surface UPVXLS2 of the second upper inorganic pattern layer UPVX2, e.g., the lower surface UPVXLS2 overlapping the second hole HL2, may not be in contact with the first functional layer 212a, the second functional layer 212c, and the counter electrode 213.

The encapsulation layer ENL may cover the corner organic light-emitting diode COLED. The encapsulation layer ENL may include at least one inorganic encapsulation layer and at least one organic encapsulation layer. FIG. 12 illustrates that the encapsulation layer ENL includes the first inorganic encapsulation layer 310, the organic encapsulation layer 320, and the second inorganic encapsulation layer 330.

The first inorganic encapsulation layer 310 may cover (e.g., entirely and continuously cover) the first corner display area CDA1. For example, the first inorganic encapsulation layer 310 may be continuously disposed in or at the first hole HL1, the auxiliary dam portion ADP, the second hole HL2, and the dam portion DP. In an embodiment, the first inorganic encapsulation layer 310 may overlap (e.g., overlap in the thickness direction of the substrate 100) the entirety of the first hole HL1, the auxiliary dam portion ADP, the second hole HL2, and the dam portion DP. The first inorganic encapsulation layer 310 may be in contact with the upper inorganic pattern layer UPVX. The first inorganic encapsulation layer 310 may also be in contact with the protruding tip PT of the upper inorganic pattern layer UPVX. For example, the first inorganic encapsulation layer 310 may be in contact with the lower surface UPVXLS1 of the first upper inorganic pattern layer UPVX1 (e.g., the lower surface UPVXLS1 overlapping the first hole HL1 of the upper organic insulating layer 116) and the lower surface UPVXLS2 of the second upper inorganic pattern layer UPVX2 (e.g., the lower surface UPVXLS2 overlapping the second hole HL2 of the upper organic insulating layer 116). Accordingly, infiltration of external moisture and foreign material into the first corner display area CDA1 through at least one of the first functional layer 212a or the second functional layer 212c including an organic material may be prevented or reduced, and thus the reliability of the display panel 10 may be improved.

The organic encapsulation layer 320 may cover the corner organic light-emitting diode COLED. The organic encapsulation layer 320 may extend from the corner organic light-emitting diode COLED to the dam portion DP. The organic encapsulation layer 320 may be controlled by the dam portion DP. For example, the flow of an organic material forming the organic encapsulation layer 320 may be controlled by the dam portion DP. In an embodiment, the organic encapsulation layer 320 may overlap the first hole HL1 and the second hole HL2. In another embodiment, the organic encapsulation layer 320 may not overlap at least one of the first hole HL1 or the second hole HL2.

The second inorganic encapsulation layer 330, like the first inorganic encapsulation layer 310, may cover (e.g., entirely and continuously cover) the first corner display area CDA1. In an embodiment, the second inorganic encapsulation layer 330 may be in contact with the first inorganic encapsulation layer 310 on the dam portion DP.

Figure 13:
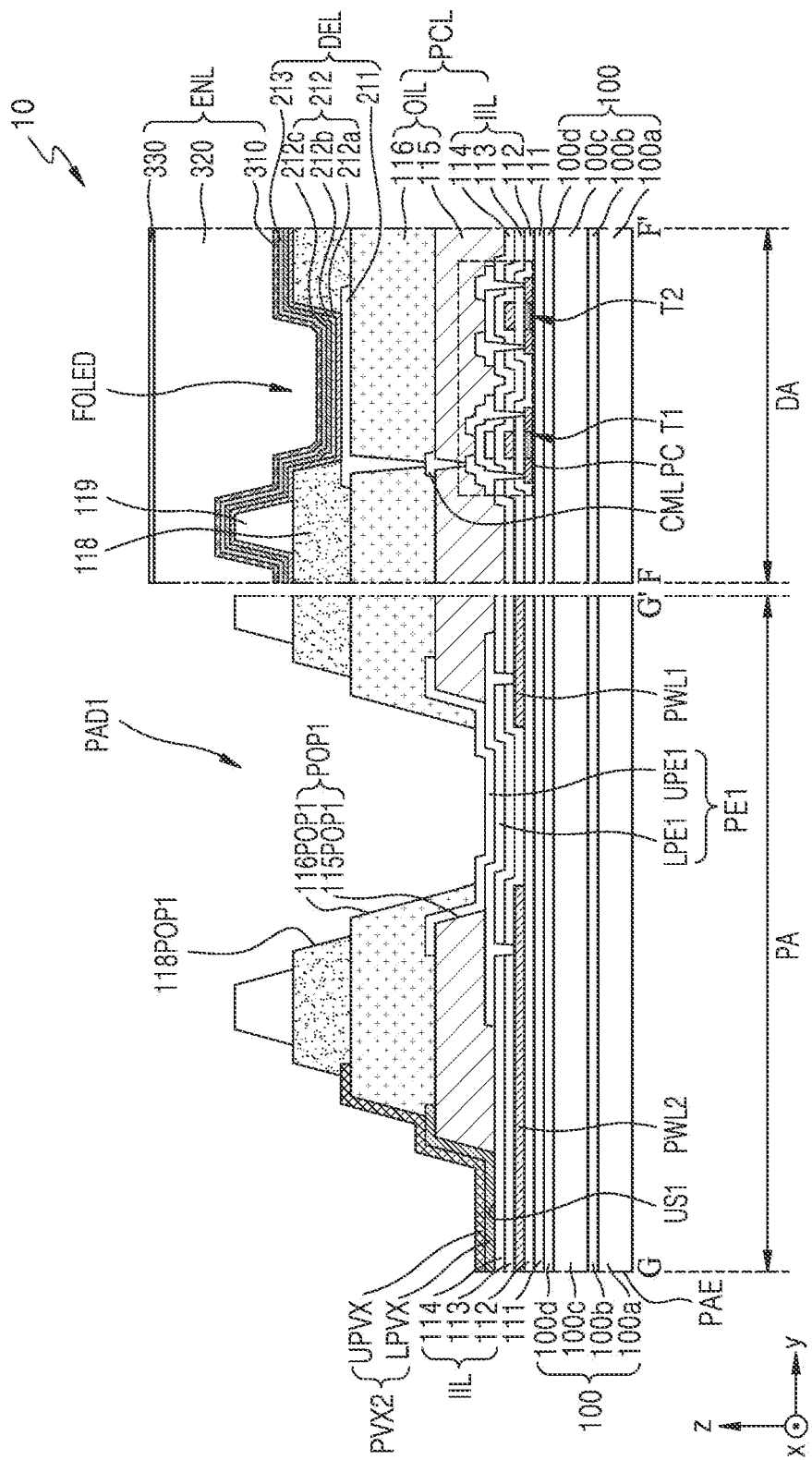
FIG. 13 is a cross-sectional view of the display panel of FIG. 8 taken along the line F-F' and the line G-G'.

FIG. 13 is a cross-sectional view of the display panel of FIG. 8 taken along the line F-F' and the line G-G'. In FIG. 13, the same reference symbols as those of FIG. 9 denote the same members, and repetitive descriptions thereof may not be repeated.

Referring to FIG. 13, the display panel 10 may include the substrate 100, the buffer layer 111, the pixel circuit layer PCL, the display element layer DEL, and the encapsulation layer ENL. The substrate 100 may include the display area DA and the peripheral area PA. The pixel circuit layer PCL may include the inorganic insulating layer IIL, the organic insulating layer OIL, the pixel circuit PC, the connection electrode CML, the first pad wiring PWL1, the second pad wiring PWL2, and a first pad electrode PE1. The inorganic insulating layer IIL may include the first gate insulating layer 112, the second gate insulating layer 113, and the interlayer insulating layer 114.

The inorganic insulating layer IIL may be disposed in the peripheral area PA. In an embodiment, at least one of the first pad wiring PWL1 or the second pad wiring PWL2 may be disposed between the first gate insulating layer 112 and the second gate insulating layer 113. In another embodiment, at least one of the first pad wiring PWL1 or the second pad wiring PWL2 may be disposed between the second gate insulating layer 113 and the interlayer insulating layer 114. In the following description, a case in which the first pad wiring PWL1 and the second pad wiring PWL2 are disposed between the first gate insulating layer 112 and the second gate insulating layer 113 is primarily described in more detail.

In an embodiment, the first pad wiring PWL1 and the second pad wiring PWL2 may extend in the first direction, for example, the y direction or the −y direction. The second pad wiring PWL2 may extend to an edge PAE of the peripheral area PA.

The organic insulating layer OIL may be disposed on the inorganic insulating layer IIL. The organic insulating layer OIL may be disposed on a part of the inorganic insulating layer IIL to expose the first upper surface US1 of the inorganic insulating layer IIL (e.g., the first upper surface US1 overlapping the peripheral area PA). The first upper surface US1 of the inorganic insulating layer IIL may meet the edge PAE of the peripheral area PA. In an embodiment, the inorganic insulating layer IIL may extend to the edge PAE of the peripheral area PA. In this case, the organic insulating layer OIL may not extend to the edge PAE of the peripheral area PA. Accordingly, the first upper surface US1 of the inorganic insulating layer IIL may be disposed on or at the edge PAE of the peripheral area PA. The organic insulating layer OIL may include the lower organic insulating layer 115 and the upper organic insulating layer 116 disposed on the lower organic insulating layer 115. The organic insulating layer OIL may be at least one of the lower organic insulating layer 115 or the upper organic insulating layer 116. In an embodiment, the organic insulating layer OIL may be the lower organic insulating layer 115.

The first pad PAD1 may be disposed in the peripheral area PA. The first pad PAD1 may include the first pad electrode PE1. The first pad electrode PE1 may be disposed on the inorganic insulating layer IIL. In an embodiment, the first pad electrode PE1 may be connected (e.g., electrically connected) to the first pad wiring PWL1 and the second pad wiring PWL2 through respective contact holes in the second gate insulating layer 113 and the interlayer insulating layer 114.

In an embodiment, the first pad electrode PE1 may include a first lower pad electrode LPE1 and a first upper pad electrode UPE1. The first lower pad electrode LPE1 may be disposed on the inorganic insulating layer IIL. In an embodiment, the first lower pad electrode LPE1 may extend between the inorganic insulating layer IL and the lower organic insulating layer 115. The first upper pad electrode UPE1 may be disposed on the first lower pad electrode LPE1. The first upper pad electrode UPE1 may be connected (e.g., electrically connected) to the first lower pad electrode LPE1. In an embodiment, the first upper pad electrode UPE1 may extend between the lower organic insulating layer 115 and the upper organic insulating layer 116.

At least one of the first lower pad electrode LPE1 or the first upper pad electrode UPE1 may include a material that is conductive (e.g., exhibiting superior conductivity). At least one of the first lower pad electrode LPE1 or the first upper pad electrode UPE1 may include a conductive material including Mo, Al, Cu, Ti, and/or the like, and may be formed in a single layer or multiple layers including the above material. In an embodiment, at least one of the first lower pad electrode LPE1 or the first upper pad electrode UPE1 may have a multilayer structure of Ti/Al/Ti.

The organic insulating layer OIL may include a first pad opening portion POP1 overlapping the first pad electrode PE1. The first pad opening portion POP1 may expose the first pad electrode PE1. In an embodiment, the first pad opening portion POP1 may expose the first upper pad electrode UPE1. The first pad opening portion POP1 may include a first lower pad opening portion 115POP1 and a first upper pad opening portion 116POP1. The first lower pad opening portion 115POP1 may be provided in the lower organic insulating layer 115. The first upper pad opening portion 116POP1 may be provided in the upper organic insulating layer 116.

The second inorganic pattern layer PVX2 may meet the edge PAE of the peripheral area PA. The second inorganic pattern layer PVX2 may extend to the edge PAE of the peripheral area PA.

The second inorganic pattern layer PVX2 may be in contact with the first upper surface US1 of the inorganic insulating layer IIL. In an embodiment, the second inorganic pattern layer PVX2 may be in direct contact with the inorganic insulating layer IIL. In other words, an intervening element may not be provided between the second inorganic pattern layer PVX2 and the inorganic insulating layer IIL. The second inorganic pattern layer PVX2 may cover (e.g., may entirely cover) the first upper surface US1 of the inorganic insulating layer IIL. In an embodiment, the second inorganic pattern layer PVX2 may not be disposed in the display area DA.

The second inorganic pattern layer PVX2 may be a single layer or multilayer film including an inorganic material such as $SiN_x$, $SiO_2$, and/or SiON, and the like.

In an embodiment, the second inorganic pattern layer PVX2 may include the lower inorganic pattern layer LPVX and the upper inorganic pattern layer UPVX. In another embodiment, one of the lower inorganic pattern layer LPVX and the upper inorganic pattern layer UPVX may be omitted. In the following description, a case in which the second inorganic pattern layer PVX2 includes the lower inorganic pattern layer LPVX and the upper inorganic pattern layer UPVX is primarily described in more detail.

The lower inorganic pattern layer LPVX may be in contact with the inorganic insulating layer IIL. The lower inorganic pattern layer LPVX may cover (e.g., may entirely cover) the first upper surface US1 of the inorganic insulating layer IIL. In an embodiment, the lower inorganic pattern layer LPVX may extend from the first upper surface US1 of the inorganic insulating layer IIL between the lower organic insulating layer 115 and the upper organic insulating layer 116. In another embodiment, the lower inorganic pattern layer LPVX may not extend from the first upper surface US1 of the inorganic insulating layer IIL between the lower organic insulating layer 115 and the upper organic insulating layer 116.

The upper inorganic pattern layer UPVX may be disposed on the lower inorganic pattern layer LPVX. In an embodiment, the upper inorganic pattern layer UPVX may extend from the lower inorganic pattern layer LPVX to an upper surface of the upper organic insulating layer 116. In another embodiment, the upper inorganic pattern layer UPVX may not extend from the lower inorganic pattern layer LPVX to the upper surface of the upper organic insulating layer 116.

In an embodiment, the pixel definition layer 118 may be disposed in the peripheral area PA. The pixel definition layer 118 may include a first pad opening portion 118POP1 of the pixel definition layer 118 (e.g., the first pad opening portion 118POP1 overlapping the first pad PAD1). In an embodiment, the spacer 119 overlapping the peripheral area PA may be further disposed on the pixel definition layer 118.

The second inorganic pattern layer PVX2 may protect the inorganic insulating layer IIL and the second pad wiring PWL2. In an embodiment, in the peripheral area PA, the inorganic insulating layer IIL may be in contact with any one of the organic insulating layer OIL, the first pad electrode PE1, and the second inorganic pattern layer PVX2. For example, the first upper surface US1 of the inorganic insulating layer IIL may be in contact with the second inorganic pattern layer PVX2. The inorganic insulating layer IIL may be in contact with the organic insulating layer OIL and the first pad electrode PE1 of the first pad PAD1. Accordingly, the inorganic insulating layer IIL may be protected in the peripheral area PA.

The edge PAE of the peripheral area PA may not meet the organic insulating layer OIL. For example, the organic insulating layer OIL may not overlap (e.g., overlap in a thickness direction of the substrate 100) the edge PAE of the peripheral area PA. During the manufacture of the display device, a test pad may be disposed for inspection (e.g., lighting inspection) of the organic light-emitting diode OLED. The test pad may be connected (e.g., electrically connected) to the first pad PAD1 and organic light-emitting diode OLED through the second pad wiring PWL2. When the inspection (e.g., lighting inspection) of the organic light-emitting diode OLED is complete, the test pad may be removed to reduce the size of the peripheral area PA. In this case, when the organic insulating layer OIL is disposed on or at the edge PAE of the peripheral area PA, it may be difficult to cut the display panel. Accordingly, the organic insulating layer OIL may not be disposed on the edge PAE of the peripheral area PA, and the first upper surface US1 of the inorganic insulating layer IIL may be exposed.

The second inorganic pattern layer PVX2 may protect the inorganic insulating layer IIL and the second pad wiring PWL2. In the present embodiment, the first inorganic pattern layer PVX1 described with reference to FIG. 12 may be disposed in the first corner display area CDA1. The first inorganic pattern layer PVX1 may be formed in the patterning process after an inorganic layer is formed on the surface (e.g., the entire surface) of the display panel 10. In this case, when the first upper surface US1 of the inorganic insulating layer IIL is exposed, the inorganic insulating layer IIL and the second pad wiring PWL2 may be etched or damaged due to the patterning process. In the present embodiment, damage to the inorganic insulating layer IIL and the second pad wiring PWL2 may be prevented or reduced by forming the second inorganic pattern layer PVX2 on the first upper surface US1 of the inorganic insulating layer IIL in the patterning process.

Figure 14:
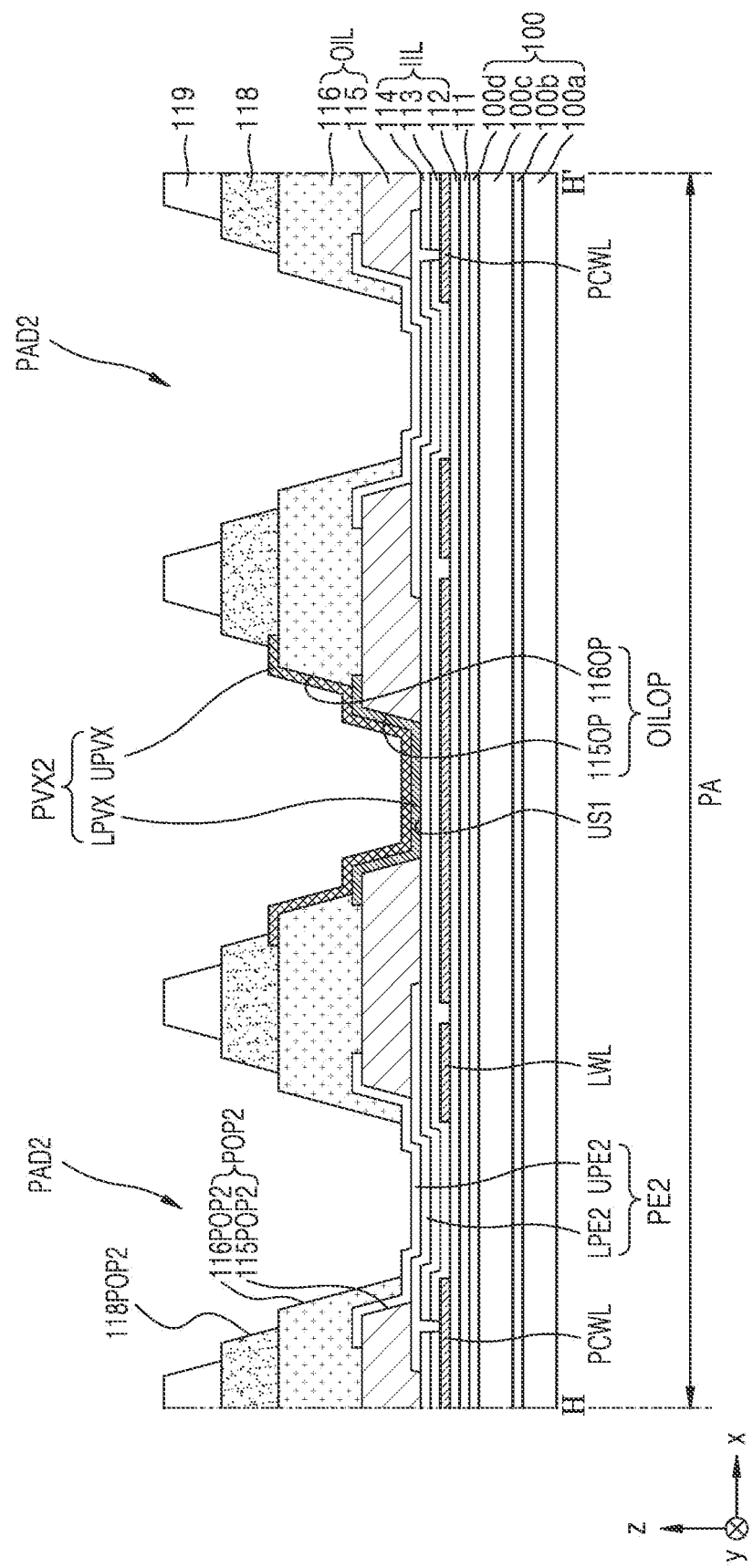
FIG. 14 is a cross-sectional view of the display panel of FIG. 8 taken along the line H-H'.

FIG. 14 is a cross-sectional view of the display panel of FIG. 8 taken along the line H-H'. In FIG. 14, the same reference symbols as those of FIG. 13 denote the same members, and repetitive descriptions thereof may not be repeated.

Referring to FIG. 14, the display panel 10 may include the substrate 100, the buffer layer 111, the inorganic insulating layer IIL, the organic insulating layer OIL, a lower wiring LWL, the pad connection wiring PCWL, and the second pad PAD2. The substrate 100 may include the peripheral area PA.

The inorganic insulating layer IIL may be disposed in the peripheral area PA. In an embodiment, at least one of the pad connection wiring PCWL or the lower wiring LWL may be disposed between the first gate insulating layer 112 and the second gate insulating layer 113. In another embodiment, at least one of the pad connection wiring PCWL or the lower wiring LWL may be disposed between the second gate insulating layer 113 and the interlayer insulating layer 114. In the following description, a case in which the pad connection wiring PCWL and the lower wiring LWL are disposed between the first gate insulating layer 112 and the second gate insulating layer 113 is primarily described in more detail.

The organic insulating layer OIL may be disposed on the inorganic insulating layer IIL. The organic insulating layer OIL may be disposed on part of the inorganic insulating layer IIL to expose the first upper surface US1 of the inorganic insulating layer IIL (e.g., the first upper surface US1 overlapping the peripheral area PA). In an embodiment, the organic insulating layer OIL may include the opening portion OILOP of the organic insulating layer OIL, and the first upper surface US1 of the inorganic insulating layer IIL may be exposed through the opening portion OILOP of the organic insulating layer OIL. The organic insulating layer OIL may include the lower organic insulating layer 115 and the upper organic insulating layer 116 disposed on the lower organic insulating layer 115. The organic insulating layer OIL may be at least one of the lower organic insulating layer 115 or the upper organic insulating layer 116. In an embodiment, the organic insulating layer OIL may be the lower organic insulating layer 115. The opening portion OILOP of the organic insulating layer OIL may include an opening portion 115OP of the lower organic insulating layer 115 and an opening portion 116OP of the upper organic insulating layer 116.

The second pad PAD2 may be disposed in the peripheral area PA. The second pad PAD2 may include a second pad electrode PE2. The second pad electrode PE2 may be disposed on the inorganic insulating layer IIL. In an embodiment, the second pad electrode PE2 may be connected (e.g., electrically connected) to the pad connection wiring PCWL through the contact holes provided in the second gate insulating layer 113 and the interlayer insulating layer 114.

In an embodiment, the second pad electrode PE2 may include a second lower pad electrode LPE2 and a second upper pad electrode UPE2. The second lower pad electrode LPE2 may be disposed on the inorganic insulating layer IIL. In an embodiment, the second lower pad electrode LPE2 may extend between the inorganic insulating layer IIL and the lower organic insulating layer 115. The second upper pad electrode UPE2 may be disposed on the second lower pad electrode LPE2. The second upper pad electrode UPE2 may be connected (e.g., electrically connected) to the second lower pad electrode LPE2. In an embodiment, the second upper pad electrode UPE2 may extend between the lower organic insulating layer 115 and the upper organic insulating layer 116.

At least one of the second lower pad electrode LPE2 or the second upper pad electrode UPE2 may include a material that is conductive (e.g., exhibiting superior conductivity). At least one of the second lower pad electrode LPE2 or the second upper pad electrode UPE2 may include a conductive material including Mo, Al, Cu, Ti, and/or the like, and may be formed in a single layer or multiple layers including the above material. In an embodiment, at least one of the second lower pad electrode LPE2 or the second upper pad electrode UPE2 may have a multilayer structure of Ti/Al/Ti.

The organic insulating layer OIL may include a second pad opening portion POP2 overlapping the second pad electrode PE2. The second pad opening portion POP2 may expose the second pad electrode PE2. In an embodiment, the second pad opening portion POP2 may expose the second upper pad electrode UPE2. The second pad opening portion POP2 may include a second lower pad opening portion 115POP2 and a second upper pad opening portion 116POP2. The second lower pad opening portion 115POP2 may be provided in the lower organic insulating layer 115. The second upper pad opening portion 116POP2 may be provided in the upper organic insulating layer 116. The second lower pad opening portion 115POP2 may overlap the second upper pad opening portion 116POP2 in a thickness direction of the substrate 100.

The second inorganic pattern layer PVX2 may be in contact with the first upper surface US1 of the inorganic insulating layer IIL. In an embodiment, the second inorganic pattern layer PVX2 may be in direct contact with the inorganic insulating layer IIL. In other words, an intervening element may not be provided between the second inorganic pattern layer PVX2 and the inorganic insulating layer IIL. The second inorganic pattern layer PVX2 may cover (e.g., may entirely cover) the first upper surface US1 of the inorganic insulating layer IIL.

The second inorganic pattern layer PVX2 may overlap the opening portion OILOP of the organic insulating layer OIL. In an embodiment, the opening portion OILOP of the organic insulating layer OIL may be disposed between the neighboring second pad opening portions POP2. In an embodiment, the second inorganic pattern layer PVX2 may be disposed between the neighboring second pad opening portions POP2.

In an embodiment, the second inorganic pattern layer PVX2 may include the lower inorganic pattern layer LPVX and the upper inorganic pattern layer UPVX. In another embodiment, one of the lower inorganic pattern layer LPVX and the upper inorganic pattern layer UPVX may be omitted.

The lower inorganic pattern layer LPVX may be in contact with the inorganic insulating layer IIL. The lower inorganic pattern layer LPVX may cover (e.g., may entirely cover) the first upper surface US1 of the inorganic insulating layer IL. In an embodiment, the lower inorganic pattern layer LPVX may extend from the first upper surface US1 of the inorganic insulating layer IIL between the lower organic insulating layer 115 and the upper organic insulating layer 116. In another embodiment, the lower inorganic pattern layer LPVX may not extend from the first upper surface US1 of the inorganic insulating layer IIL between the lower organic insulating layer 115 and the upper organic insulating layer 116.

The upper inorganic pattern layer UPVX may be disposed on the lower inorganic pattern layer LPVX. In an embodiment, the upper inorganic pattern layer UPVX may extend from the lower inorganic pattern layer LPVX to the upper surface of the upper organic insulating layer 116. In another embodiment, the upper inorganic pattern layer UPVX may not extend from the lower inorganic pattern layer LPVX to the upper surface of the upper organic insulating layer 116.

In an embodiment, the pixel definition layer 118 may be disposed in the peripheral area PA. The pixel definition layer 118 may include a second pad opening portion 118POP2 of the pixel definition layer 118 (e.g., the second pad opening portion 118POP2 overlapping the second pad PAD2). In an embodiment, the spacer 119 overlapping the peripheral area PA may be further disposed on the pixel definition layer 118.

The second inorganic pattern layer PVX2 may protect the inorganic insulating layer IIL and the lower wiring LWL. In an embodiment, in the peripheral area PA, the inorganic insulating layer IIL may be in contact with any one of the organic insulating layer OIL, the second pad electrode PE2, and the second inorganic pattern layer PVX2. For example, the first upper surface US1 of the inorganic insulating layer IIL may be in contact with the second inorganic pattern layer PVX2. The inorganic insulating layer IIL may be in contact with the organic insulating layer OIL and the second pad electrode PE2 of the second pad PAD2. Accordingly, the inorganic insulating layer IIL may be protected in the peripheral area PA.

The second inorganic pattern layer PVX2 may protect the inorganic insulating layer IIL and the lower wiring LWL. In the present embodiment, the first inorganic pattern layer PVX1 described with reference to FIG. 12 may be disposed in the first corner display area CDA1. The first inorganic pattern layer PVX1 may be formed in the patterning process after an inorganic layer is formed on the surface (e.g., the entire surface) of the display panel 10. In this case, when the first upper surface US1 of the inorganic insulating layer IL is exposed, the inorganic insulating layer IIL and the lower wiring LWL may be etched or damaged due to the patterning process. In the present embodiment, as the second inorganic pattern layer PVX2 is formed on the first upper surface US1 of the inorganic insulating layer IL in the patterning process, damage to the inorganic insulating layer IIL and the lower wiring LWL may be prevented or reduced.

Figure 15:
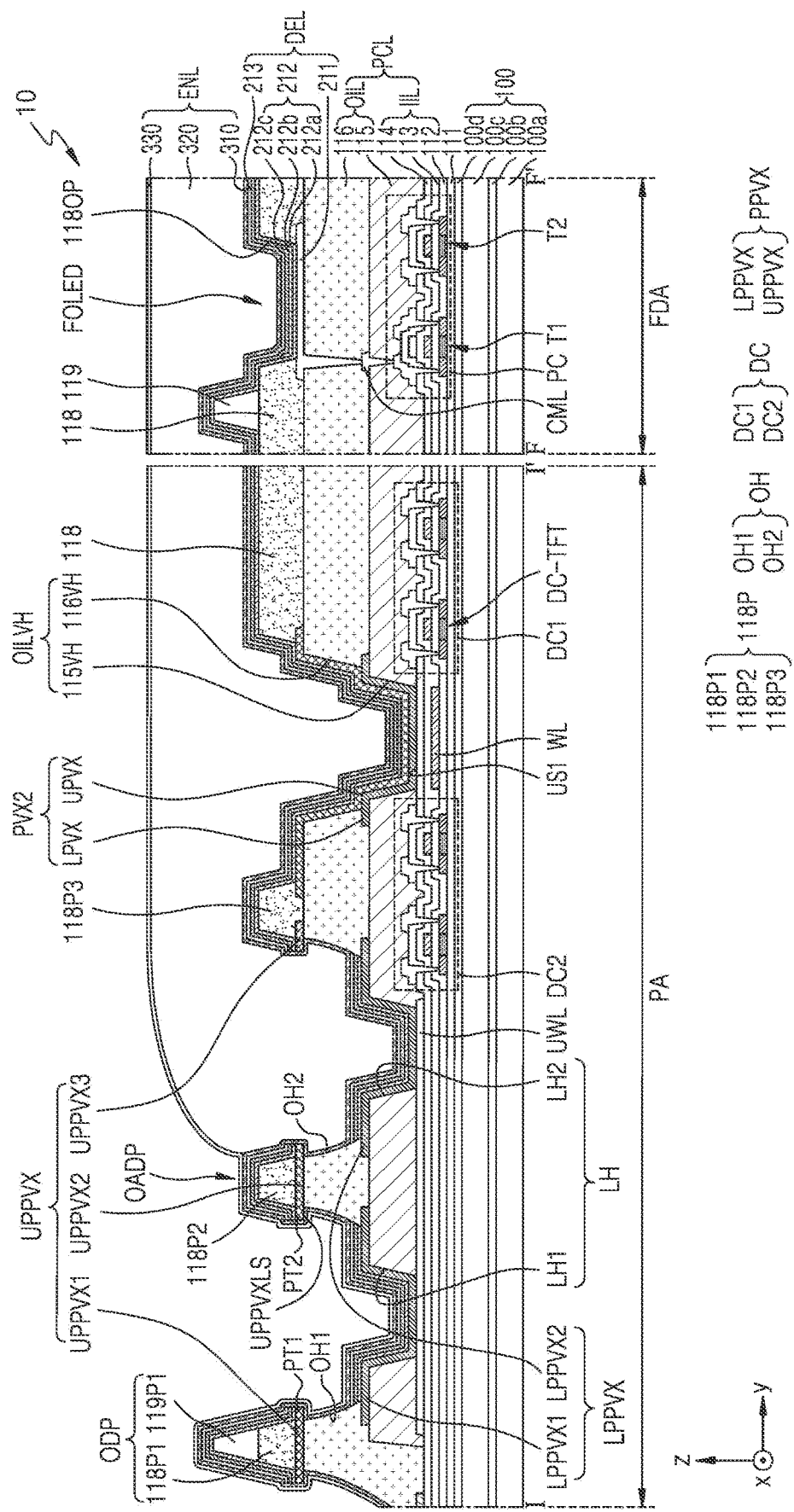
FIG. 15 is a cross-sectional view of the display panel of FIG. 8 taken along the line F-F' and the line I-I'.

FIG. 15 is a cross-sectional view of the display panel of FIG. 8 taken along the line F-F' and the line I-I'. In FIG. 15, the same reference symbols as those of FIG. 9 denote the same members, and repetitive descriptions thereof may not be repeated.

Referring to FIG. 15, the display panel 10 may include the substrate 100, the buffer layer 111, the pixel circuit layer PCL, a peripheral inorganic pattern layer PPVX, the second inorganic pattern layer PVX2, the display element layer DEL, and the encapsulation layer ENL.

The pixel circuit layer PCL may include the wiring WL, an upper wiring UWL, the driving circuit DC, the pixel circuit PC, the inorganic insulating layer IIL, and the organic insulating layer OIL. In an embodiment, the inorganic insulating layer IIL may include the first gate insulating layer 112, the second gate insulating layer 113, and the interlayer insulating layer 114.

The substrate 100 may include the front display area FDA and the peripheral area PA disposed outside the front display area FDA. The buffer layer 111, the inorganic insulating layer IIL, and the driving circuit DC including the driving circuit thin film transistor DC-TFT may be disposed in the peripheral area PA.

In an embodiment, the driving circuit DC may include a first driving circuit DC1 and a second driving circuit DC2. The first driving circuit DC1 and the second driving circuit DC2 may be spaced from each other. In an embodiment, the first driving circuit DC1 and the second driving circuit DC2 may be connected (e.g., electrically connected) to each other through the wiring WL.

In an embodiment, the wiring WL may be disposed in the peripheral area PA. In an embodiment, the wiring WL may be disposed between the first gate insulating layer 112 and the second gate insulating layer 113. In another embodiment, the wiring WL may be disposed between the second gate insulating layer 113 and the interlayer insulating layer 114. Accordingly, when the inorganic insulating layer IIL includes a first inorganic insulating layer and a second inorganic insulating layer, the wiring WL may be disposed between the first inorganic insulating layer and the second inorganic insulating layer. In some embodiments, the wiring WL may be disposed between the buffer layer 111 and the inorganic insulating layer IIL.

The organic insulating layer OIL may be disposed on the inorganic insulating layer IIL. The organic insulating layer OIL may be disposed on part of the inorganic insulating layer IIL to expose the first upper surface US1 of the inorganic insulating layer IIL (e.g., the first upper surface US1 overlapping the peripheral area PA). In an embodiment, the organic insulating layer OIL may include a valley hole OILVH, and the first upper surface US1 of the inorganic insulating layer IIL may be exposed through the valley hole OILVH. In an embodiment, the first driving circuit DC1 and the second driving circuit DC2 may be spaced from each other with respect to the valley hole OILVH. For example, the first driving circuit DC1 and the second driving circuit DC2 may be spaced from each other with the valley hole OILVH therebetween.

The organic insulating layer OIL may include the lower organic insulating layer 115 and the upper organic insulating layer 116 disposed on the lower organic insulating layer 115. The organic insulating layer OIL may be at least one of the lower organic insulating layer 115 or the upper organic insulating layer 116. In an embodiment, the organic insulating layer OIL may be the lower organic insulating layer 115. The valley hole OILVH may include a first valley hole 115VH of the lower organic insulating layer 115 and a second valley hole 116VH of the upper organic insulating layer 116.

The second inorganic pattern layer PVX2 may be in contact with the first upper surface US1 of the inorganic insulating layer IIL. In an embodiment, the second inorganic pattern layer PVX2 may be in direct contact with the inorganic insulating layer IIL. In other words, an intervening element may not be provided between the second inorganic pattern layer PVX2 and the inorganic insulating layer IIL. The second inorganic pattern layer PVX2 may cover (e.g., may entirely cover) the first upper surface US1 of the inorganic insulating layer IIL. In an embodiment, the second inorganic pattern layer PVX2 may not be disposed in the display area DA.

The second inorganic pattern layer PVX2 may overlap the valley hole OILVH. Accordingly, the second inorganic pattern layer PVX2 may protect the inorganic insulating layer IIL and the wiring WL, both overlapping the valley hole OILVH.

In an embodiment, the second inorganic pattern layer PVX2 may include the lower inorganic pattern layer LPVX and the upper inorganic pattern layer UPVX. In another embodiment, one of the lower inorganic pattern layer LPVX and the upper inorganic pattern layer UPVX may be omitted.

The lower inorganic pattern layer LPVX may be in contact with the inorganic insulating layer IIL. The lower inorganic pattern layer LPVX may cover (e.g., may entirely cover) the first upper surface US1 of the inorganic insulating layer IIL. In an embodiment, the lower inorganic pattern layer LPVX may extend from the first upper surface US1 of the inorganic insulating layer IIL between the lower organic insulating layer 115 and the upper organic insulating layer 116. In another embodiment, the lower inorganic pattern layer LPVX may not extend from the first upper surface US1 of the inorganic insulating layer IIL between the lower organic insulating layer 115 and the upper organic insulating layer 116.

The upper inorganic pattern layer UPVX may be disposed on the lower inorganic pattern layer LPVX. In an embodiment, the upper inorganic pattern layer UPVX may extend from the lower inorganic pattern layer LPVX to the upper surface of the upper organic insulating layer 116. In another embodiment, the upper inorganic pattern layer UPVX may not extend from the lower inorganic pattern layer LPVX to the upper surface of the upper organic insulating layer 116.

In the present embodiment, the first inorganic pattern layer PVX1 described with reference to FIG. 12 may be disposed in the first corner display area CDA1. The first inorganic pattern layer PVX1 may be formed in the patterning process after an inorganic layer is formed on the surface (e.g., the entire surface) of the display panel 10. In this case, when the first upper surface US1 of the inorganic insulating layer IIL is exposed through the valley hole OILVH, the inorganic insulating layer IIL and the wiring WL may be etched or damaged due to the patterning process. In the present embodiment, as the second inorganic pattern layer PVX2 is formed on the first upper surface US1 of the inorganic insulating layer IIL in the patterning process, damage to the inorganic insulating layer IIL and the wiring WL may be prevented or reduced.

The upper wiring UWL may be disposed on the inorganic insulating layer IIL. The upper wiring UWL may be disposed between the inorganic insulating layer IIL and the organic insulating layer OIL. The upper wiring UWL may transmit a power voltage and/or a signal to the front organic light-emitting diode FOLED. The upper wiring UWL may include a conductive material including Mo, Al, Cu, Ti, and/or the like, and may be formed in a single layer or multiple layers including the above material. In an embodiment, the upper wiring UWL may have a multilayer structure of Ti/Al/Ti.

The lower organic insulating layer 115 may cover the upper wiring UWL. The lower organic insulating layer 115 may include a lower hole LH exposing at least part of the upper wiring UWL. In an embodiment, the lower organic insulating layer 115 may include a plurality of lower holes as the lower hole LH. For example, the lower organic insulating layer 115 may include a first lower hole LH1 and a second lower hole LH2. The first lower hole LH1 may be disposed farther away from the front display area FDA than the second lower hole LH2 is from the front display area FDA.

The peripheral inorganic pattern layer PPVX may include a lower peripheral inorganic pattern layer LPPVX and an upper peripheral inorganic pattern layer UPPVX. The lower peripheral inorganic pattern layer LPPVX and the lower inorganic pattern layer LPVX may include the same material. The upper peripheral inorganic pattern layer UPPVX and the upper inorganic pattern layer UPVX may include the same material.

The lower peripheral inorganic pattern layer LPPVX may be disposed in the peripheral area PA. The lower peripheral inorganic pattern layer LPPVX may be disposed between the substrate 100 and the upper organic insulating layer 116. In an embodiment, the lower peripheral inorganic pattern layer LPPVX may be disposed on the upper wiring UWL. The lower peripheral inorganic pattern layer LPPVX may overlap the lower hole LH. The lower peripheral inorganic pattern layer LPPVX may extend between the lower organic insulating layer 115 and the upper organic insulating layer 116.

In an embodiment, the lower peripheral inorganic pattern layer LPPVX may include a first lower peripheral inorganic pattern layer LPPVX1 and a second lower peripheral inorganic pattern layer LPPVX2. The first lower peripheral inorganic pattern layer LPPVX1 may be disposed farther away from the front display area FDA than the second lower peripheral inorganic pattern layer LPPVX2 is from the front display area FDA. For example, the second lower peripheral inorganic pattern layer LPPVX2 may be between the first lower peripheral inorganic pattern layer LPPVX1 and the front display area FDA. In an embodiment, the first lower peripheral inorganic pattern layer LPPVX1 may overlap the first lower hole LH1. The second lower peripheral inorganic pattern layer LPPVX2 may overlap the second lower hole LH2.

In an embodiment, the first lower peripheral inorganic pattern layer LPPVX1 and the second lower peripheral inorganic pattern layer LPPVX2 may be spaced from one another. In another embodiment, the first lower peripheral inorganic pattern layer LPPVX1 and the second lower peripheral inorganic pattern layer LPPVX2 may be integrally provided.

The upper organic insulating layer 116 may cover an edge of the upper wiring UWL. Accordingly, the upper organic insulating layer 116 may prevent or reduce degradation of a side surface of the upper wiring UWL. In an embodiment, the upper organic insulating layer 116 may cover an edge of the lower peripheral inorganic pattern layer LPPVX.

In an embodiment, the upper organic insulating layer 116 may include an outer through hole OH. The outer through hole OH may penetrate the upper organic insulating layer 116. The outer through hole OH may expose the lower peripheral inorganic pattern layer LPPVX. In an embodiment, the outer through hole OH may expose a central portion of the lower peripheral inorganic pattern layer LPPVX. The outer through hole OH may be formed by etching the upper organic insulating layer 116, and the lower peripheral inorganic pattern layer LPPVX may prevent or protect the upper wiring UWL from being overetched. Accordingly, the lower peripheral inorganic pattern layer LPPVX may prevent or reduce the overetching of the upper wiring UWL, which causes an increase in resistance of the upper wiring UWL.

In an embodiment, the upper organic insulating layer 116 may include a plurality of outer through holes as the outer through hole OH. For example, the upper organic insulating layer 116 may include a first outer through hole OH1 and a second outer through hole OH2. The first outer through hole OH1 may be disposed farther away from the front display area FDA than the second outer through hole OH2 is from the front display area FDA. For example, the second outer through hole OH2 may be between the first outer through hole OH1 and the front display area FDA.

The outer through hole OH may overlap the lower hole LH. For example, the first outer through hole OH1 may overlap the first lower hole LH1, and the second outer through hole OH2 may overlap the second lower hole LH2.

The upper peripheral inorganic pattern layer UPPVX may be disposed in the peripheral area PA. The upper peripheral inorganic pattern layer UPPVX may be spaced from the front display area FDA. For example, the upper peripheral inorganic pattern layer UPPVX may not overlap the front display area FDA.

The upper peripheral inorganic pattern layer UPPVX may be disposed on the upper organic insulating layer 116. The upper peripheral inorganic pattern layer UPPVX may be disposed between the upper organic insulating layer 116 and an organic pattern layer 118P.

The upper peripheral inorganic pattern layer UPPVX may include a plurality of upper peripheral inorganic pattern layers UPPVX. The upper peripheral inorganic pattern layers UPPVX may be spaced from one another. For example, the upper peripheral inorganic pattern layer UPPVX may include a first upper peripheral inorganic pattern layer UPPVX1, a second upper peripheral inorganic pattern layer UPPVX2, and a third upper peripheral inorganic pattern layer UPPVX3. The first upper peripheral inorganic pattern layer UPPVX1 may be disposed between the upper organic insulating layer 116 and a first organic pattern layer 118P1. The second upper peripheral inorganic pattern layer UPPVX2 may be disposed between the upper organic insulating layer 116 and a second organic pattern layer 118P2. The third upper peripheral inorganic pattern layer UPPVX3 may be disposed between the upper organic insulating layer 116 and a third organic pattern layer 118P3.

The upper peripheral inorganic pattern layer UPPVX may include a protruding tip protruding in a direction toward a center of the outer through hole OH. The direction toward the center of the outer through hole OH may be a direction from an inner surface of the upper organic insulating layer 116 defining the outer through hole OH toward a center axis of the outer through hole OH. Accordingly, a lower surface of the protruding tip may be exposed in the outer through hole OH. In other words, the outer through hole OH of the upper organic insulating layer 116 may have an undercut structure.

In an embodiment, the first upper peripheral inorganic pattern layer UPPVX1 may include a first protruding tip PT1 protruding in the direction toward the center of the first outer through hole OH1. The second upper peripheral inorganic pattern layer UPPVX2 may include a second protruding tip PT2 protruding in the direction toward the center of the first outer through hole OH1. The first protruding tip PT1 and the second protruding tip PT2 may face each other with the first outer through hole OH1 therebetween. A lower surface of the first protruding tip PT1 and a lower surface of the second protruding tip PT2 each may overlap the first outer through hole OH1.

The organic pattern layer 118P may be disposed in the peripheral area PA. The organic pattern layer 118P may be disposed on the upper organic insulating layer 116. In an embodiment, the organic pattern layer 118P may be disposed on the upper peripheral inorganic pattern layer UPPVX. In an embodiment, the organic pattern layer 118P may include a plurality of organic pattern layers. For example, the organic pattern layer 118P may include the first organic pattern layer 118P1, the second organic pattern layer 118P2, and the third organic pattern layer 118P3 which are spaced from one another.

A first upper organic pattern layer 119P1 may be disposed on the first organic pattern layer 118P1. The first upper organic pattern layer 119P1 may include the same material as the spacer 119. The first upper organic pattern layer 119P1 may be spaced from the spacer 119. The first organic pattern layer 118P1 and the first upper organic pattern layer 119P1 may be parts of an outer dam portion ODP. For example, the outer dam portion ODP may be disposed on the first upper peripheral inorganic pattern layer UPPVX1, and the outer dam portion ODP may include the first organic pattern layer 118P1 and the first upper organic pattern layer 119P1. The outer dam portion ODP may be disposed farther away from the display area DA than the outer through hole OH is from the display area DA.

The second organic pattern layer 118P2 may be part of an outer auxiliary dam portion OADP. For example, the outer auxiliary dam portion OADP may be disposed on the second upper peripheral inorganic pattern layer UPPVX2, and the outer dam portion ODP may include the second organic pattern layer 118P2. In an embodiment, the first outer through hole OH1 may be disposed between the outer dam portion ODP and the outer auxiliary dam portion OADP.

The upper peripheral inorganic pattern layer UPPVX may include a protruding tip protruding in the direction toward the center of the outer through hole OH to discontinue or disconnect the first functional layer 212a and the second functional layer 212c. By discontinuing or disconnecting the first functional layer 212a and the second functional layer 212c in this manner, the infiltration of external moisture and oxygen into the organic light-emitting diode OLED may be prevented or reduced. Accordingly, the reliability of the display panel 10 may be improved. Furthermore, the width of the peripheral area PA of the display panel 10 may be reduced due to the upper peripheral inorganic pattern layer UPPVX.

The encapsulation layer ENL may be disposed in the front display area FDA and the peripheral area PA. The first inorganic encapsulation layer 310 and the second inorganic encapsulation layer 330 may extend from the front display area FDA to the peripheral area PA. The first inorganic encapsulation layer 310 and the second inorganic encapsulation layer 330 may extend to the outer dam portion ODP. In an embodiment, the first inorganic encapsulation layer 310 and the second inorganic encapsulation layer 330 may extend from the front organic light-emitting diode FOLED to the organic pattern layer 118P.

The first inorganic encapsulation layer 310 may be in contact with the protruding tip of the upper peripheral inorganic pattern layer UPPVX. For example, the first inorganic encapsulation layer 310 may be in contact with the first protruding tip PT1 of the first upper peripheral inorganic pattern layer UPPVX1 and the second protruding tip PT2 of the second upper peripheral inorganic pattern layer UPPVX2. In an embodiment, the first inorganic encapsulation layer 310 may be in contact with a lower surface UPPVXLS of the upper peripheral inorganic pattern layer UPPVX (e.g., the lower surface UPPVXLS overlapping the outer through hole OH).

The first inorganic encapsulation layer 310 may be in contact with the peripheral inorganic pattern layer PPVX in the peripheral area PA. Accordingly, the infiltration of external moisture and oxygen into the organic light-emitting diode OLED may be prevented or reduced.

The organic encapsulation layer 320 may extend from the front display area FDA to the peripheral area PA. The organic encapsulation layer 320 may fill the valley hole OILVH. In an embodiment, the organic encapsulation layer 320 may extend to the third organic pattern layer 118P3. In an embodiment, the organic encapsulation layer 320 may extend to the outer auxiliary dam portion OADP. In an embodiment, the organic encapsulation layer 320 may extend to the outer dam portion ODP. The third organic pattern layer 118P3, the outer auxiliary dam portion OADP, the outer dam portion ODP, and the valley hole OILVH may control the flow of an organic material forming the organic encapsulation layer 320.

The second inorganic encapsulation layer 330 may be disposed on the organic encapsulation layer 320. The second inorganic encapsulation layer 330 may be in contact with the first inorganic encapsulation layer 310 at or on at least one of the outer dam portion ODP or the outer auxiliary dam portion OADP.

Figure 16:
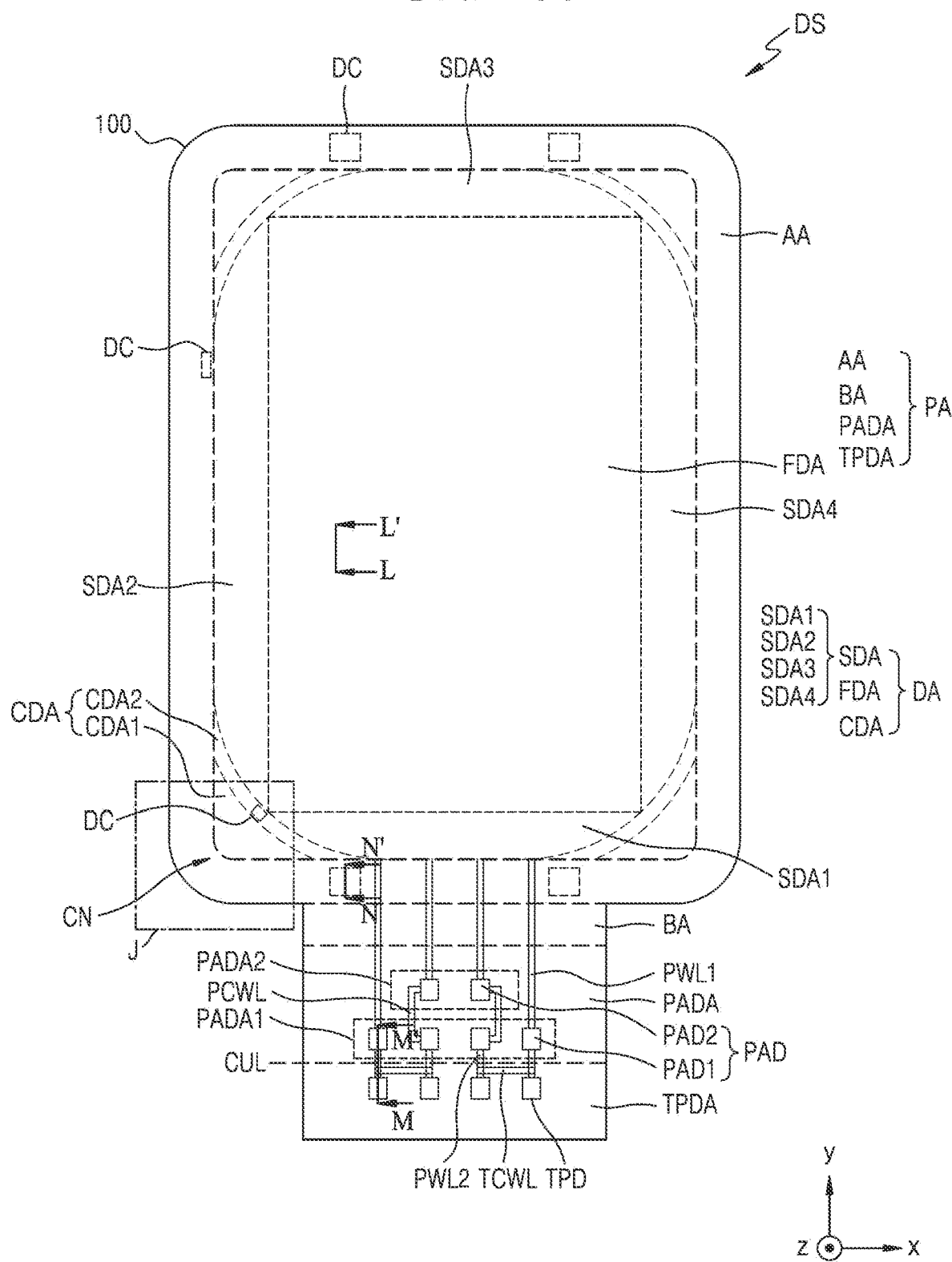
FIG. 16 is a plan view of a method of manufacturing a display device according to an embodiment.
Figure 17:
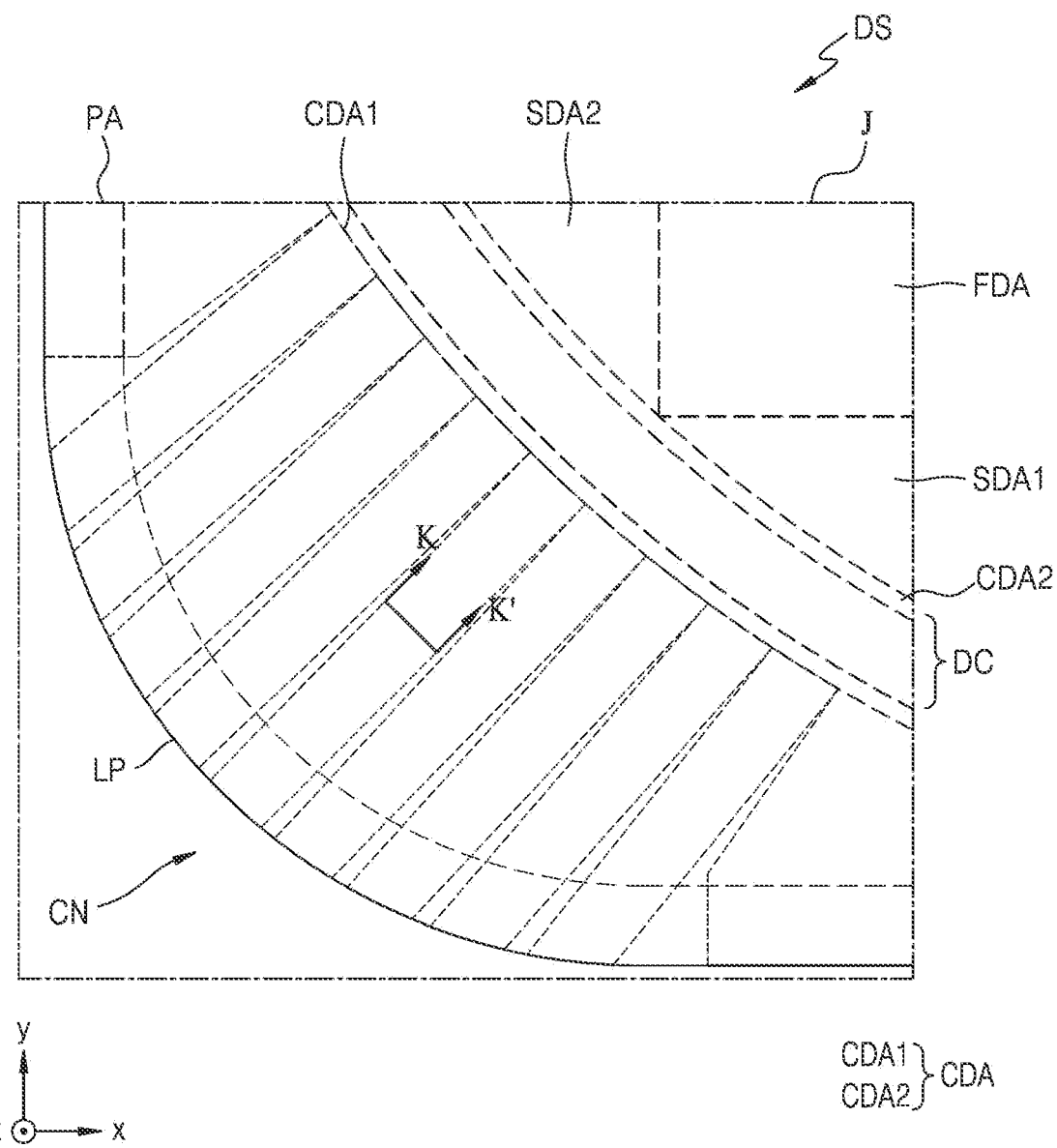
FIG. 17 is an enlarged view of a region J of the display substrate of FIG. 16.

FIG. 16 is a plan view of a method of manufacturing a display device according to an embodiment. FIG. 17 is an enlarged view of a region J of the display substrate DS of FIG. 16. In FIG. 16 and FIG. 17, the same reference symbols as those of FIG. 8 and FIG. 10 denote the same members, and repetitive descriptions thereof may not be repeated.

Referring to FIG. 16 and FIG. 17, the display substrate DS may be prepared. The display substrate DS may be a display device being manufactured. The display substrate DS may include the substrate 100, the driving circuit DC, a pad PAD, and a test pad TPD.

The display area DA may include the front display area FDA, the side surface display area SDA, and the corner display area CDA. The side surface display area SDA may include the first side surface display area SDA1, the second side surface display area SDA2, the third side surface display area SDA3, and the fourth side surface display area SDA4.

The corner display area CDA may be disposed at the corner CN of the display panel that is manufactured. The corner display area CDA may include the first corner display area CDA1 and the second corner display area CDA2. The second corner display area CDA2 may be disposed between the first corner display area CDA1 and the front display area FDA.

The first corner display area CDA1 may overlap at least part of the plurality of extension portions LP. A penetration portion that penetrates the display panel 10 through a subsequent process may be formed between the neighboring extension portions LP. The driving circuit DC may be disposed in the second corner display area CDA2.

The peripheral area PA may be around (e.g., at least partially surround) the display area DA. In an embodiment, the peripheral area PA may include the adjacent area AA, the bending area BA, the pad area PADA, and a test pad area TPDA.

The adjacent area AA may be around (e.g., at least partially surround) the display area DA. In an embodiment, the adjacent area AA may entirely surround the display area DA. The adjacent area AA may be disposed closer to the display area DA than the pad area PADA is to the display area DA. For example, the adjacent area AA may be between the display area DA and the pad area PADA. A driving circuit DC for providing an electrical signal to the pixels PX and/or a power wiring for providing power to the pixels PX, and the like may be disposed in the adjacent area AA.

The pad area PADA and the test pad area TPDA may be disposed outside the display area DA. In an embodiment, the pad area PADA and the test pad area TPDA may be disposed farther away from the display area DA than the bending area BA is from the display area DA. The test pad area TPDA may be disposed farther away from the display area DA than the pad area PADA is from the display area DA.

The pad area PADA may include the first pad area PADA1 and the second pad area PADA2. The first pad area PADA1 may be disposed farther away from the display area DA than the second pad area PADA2 is from the display area DA.

The pad PAD may be disposed in the pad area PADA. The pad PAD may include the first pad PAD1 disposed in the first pad area PADA1 and the second pad PAD2 disposed in the second pad area PADA2.

The test pad TPD may be disposed in the test pad area TPDA. In an embodiment, the test pad TPD may include a plurality of test pads TPD. The plurality of test pads TPD may be spaced from one another.

The pad PAD and the test pad TPD may be connected to the pad wiring. In an embodiment, the pad wiring may include the first pad wiring PWL1, the second pad wiring PWL2, the pad connection wiring PCWL, and a test pad connection wiring TCWL.

The first pad wiring PWL1 may extend from the first pad area PADA1 to the display area DA. The first pad wiring PWL1 may include a plurality of first pad wirings PWL1. Any one of the first pad wirings PWL1 may be connected (e.g., electrically connected) to the first pad PAD1. Another one of the first pad wirings PWL1 may be connected (e.g., electrically connected) to the second pad PAD2.

The second pad wiring PWL2 may extend from the first pad area PADA1 to the test pad area TPDA. In an embodiment, the second pad wiring PWL2 may connect (e.g., electrically connect) the first pad PAD1 to the test pad TPD. In some embodiments, the second pad wiring PWL2 may connect (e.g., electrically connect) to the second pad PAD2 to the test pad TPD.

The pad connection wiring PCWL may connect (e.g., electrically connect) the first pad PAD1 to the second pad PAD2. The test pad connection wiring TCWL may connect (e.g., electrically connect) a plurality of the second pad wiring PWL2 to each other.

FIGS. 18A-18I are cross-sectional views of a method of manufacturing a display device according to an embodiment. FIGS. 18A-18I are cross-sectional views of the display substrate DS of FIG. 17 taken along the line K-K'. In FIGS. 18A-18I, the same reference symbols as those of FIG. 12 denote the same members, and repetitive descriptions thereof may not be repeated.

Figure 18A:
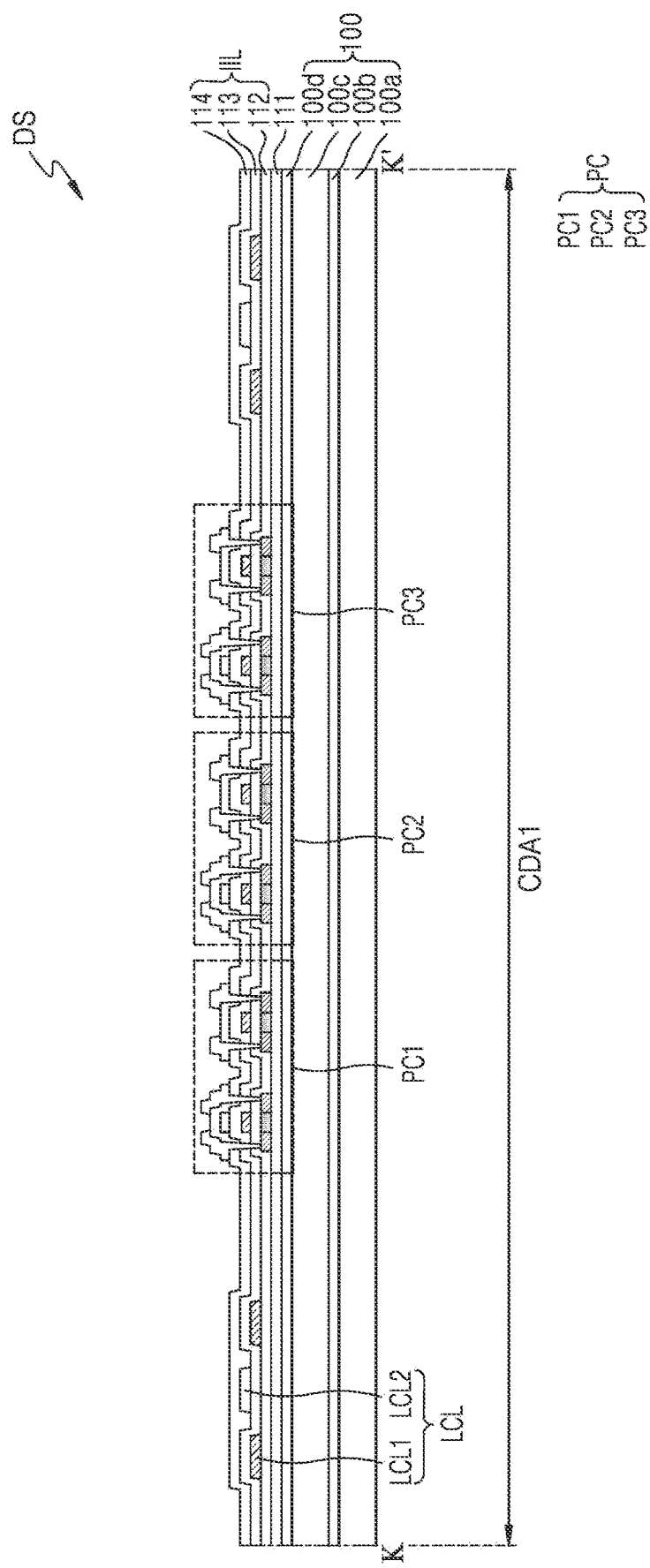

Referring to FIG. 18A, the display substrate DS may include the substrate 100, the buffer layer 111, the pixel circuit PC, the lower connection wiring LCL, and the inorganic insulating layer IIL. The inorganic insulating layer IIL may include the first gate insulating layer 112, the second gate insulating layer 113, and the interlayer insulating layer 114.

The lower connection wiring LCL may include the first lower connection wiring LCL1 and the second lower connection wiring LCL2. The first lower connection wiring LCL1 may be disposed between the first gate insulating layer 112 and the second gate insulating layer 113. The second lower connection wiring LCL2 may be disposed between the second gate insulating layer 113 and the interlayer insulating layer 114. The first lower connection wiring LCL1 may be at a different layer from the second lower connection wiring LCL2.

In an embodiment, the pixel circuit PC may include the first pixel circuit PC1, the second pixel circuit PC2, and the third pixel circuit PC3.

Figure 18B:
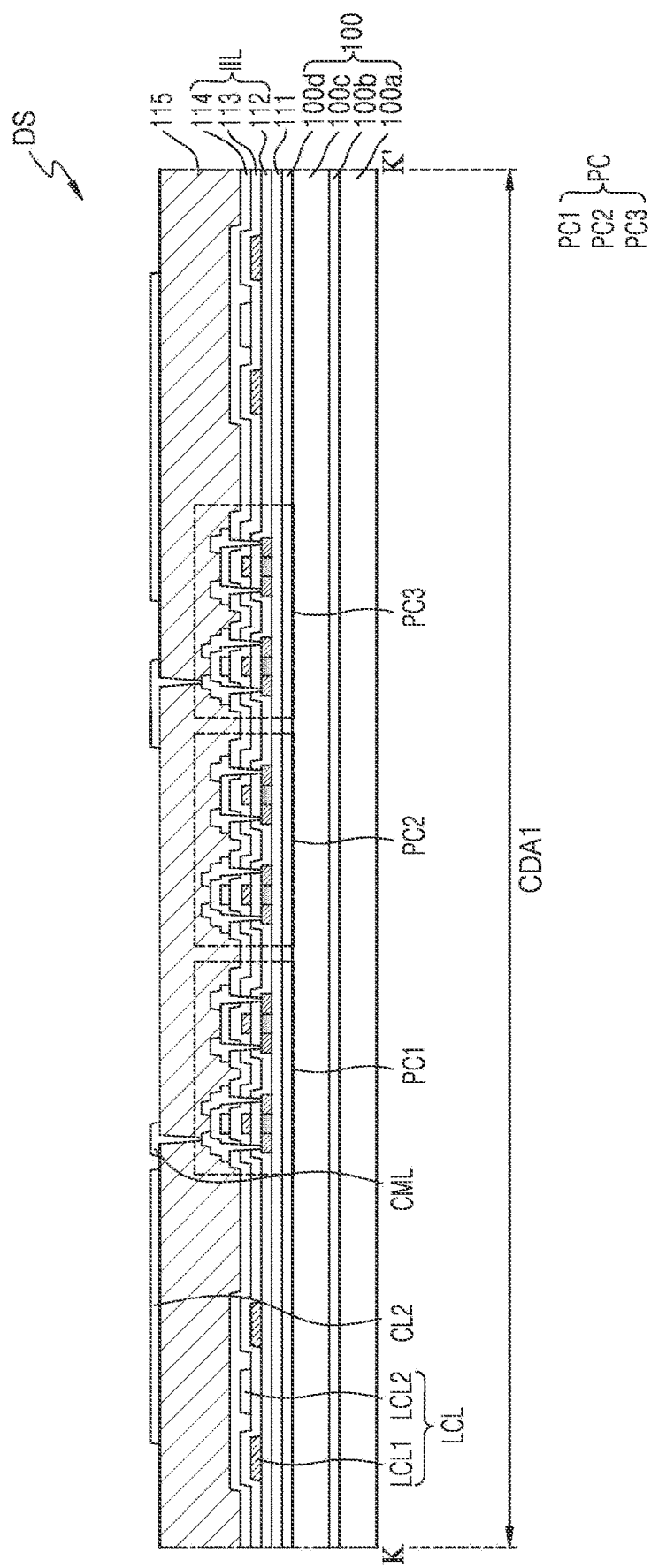

Referring to FIG. 18B, the lower organic insulating layer 115 may be formed. The lower organic insulating layer 115 may cover the lower connection wiring LCL and the pixel circuit PC.

The second connection wiring CL2 and the connection electrode CML may be formed on the lower organic insulating layer 115.

Figure 18C:
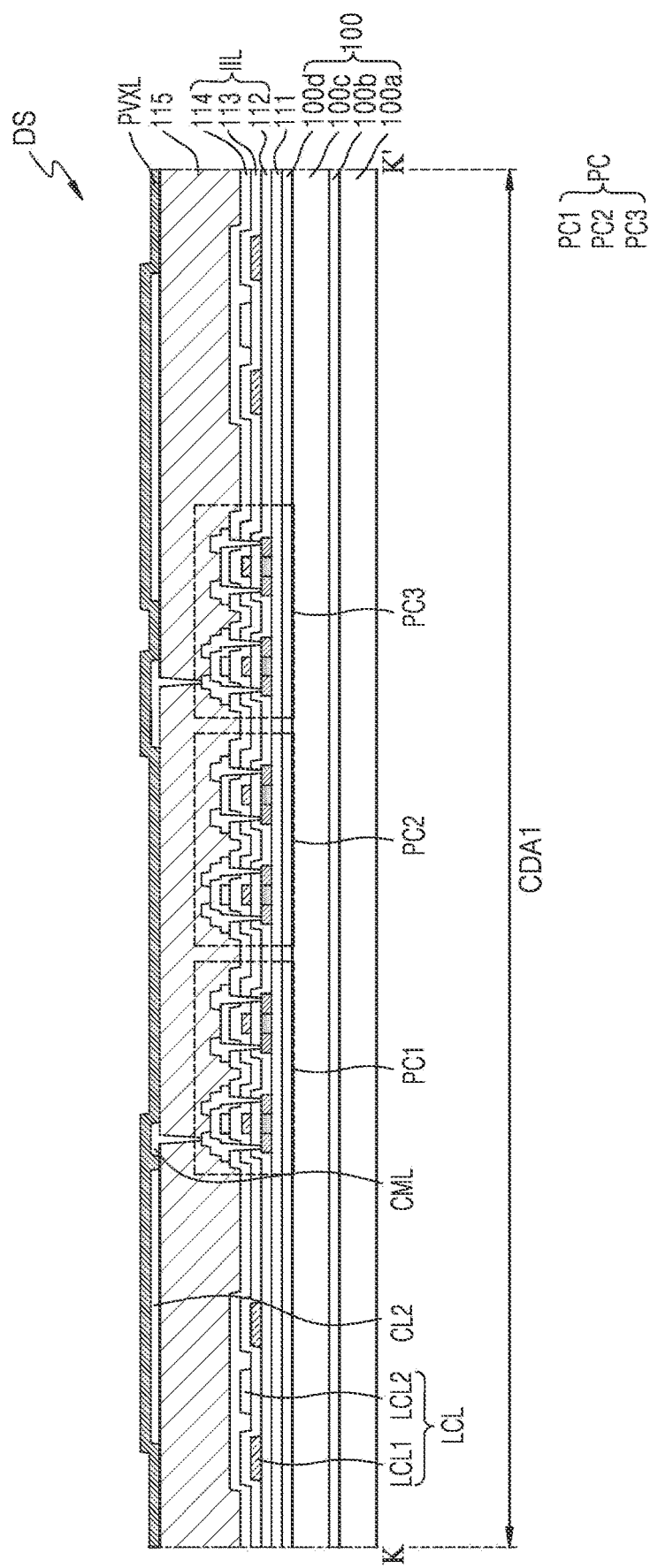

Referring to FIG. 18C, the inorganic layer PVXL may be formed. The inorganic layer PVXL may be formed on the surface (e.g., the entire surface) of the first corner display area CDA1. The inorganic layer PVXL may overlap the first corner display area CDA1.

The inorganic layer PVXL may be formed on the lower organic insulating layer 115. The inorganic layer PVXL may cover the lower organic insulating layer 115, the second connection wiring CL2, and the connection electrode CML.

Referring to FIG. 18D, the lower inorganic pattern layer LPVX overlapping the first corner display area CDA1 may be formed by at least partially removing the inorganic layer PVXL. In an embodiment, the lower inorganic pattern layer LPVX may be formed on the second connection wiring CL2. In an embodiment, the lower inorganic pattern layer LPVX may include a plurality of lower inorganic pattern layers LPVX.

Figure 18E:
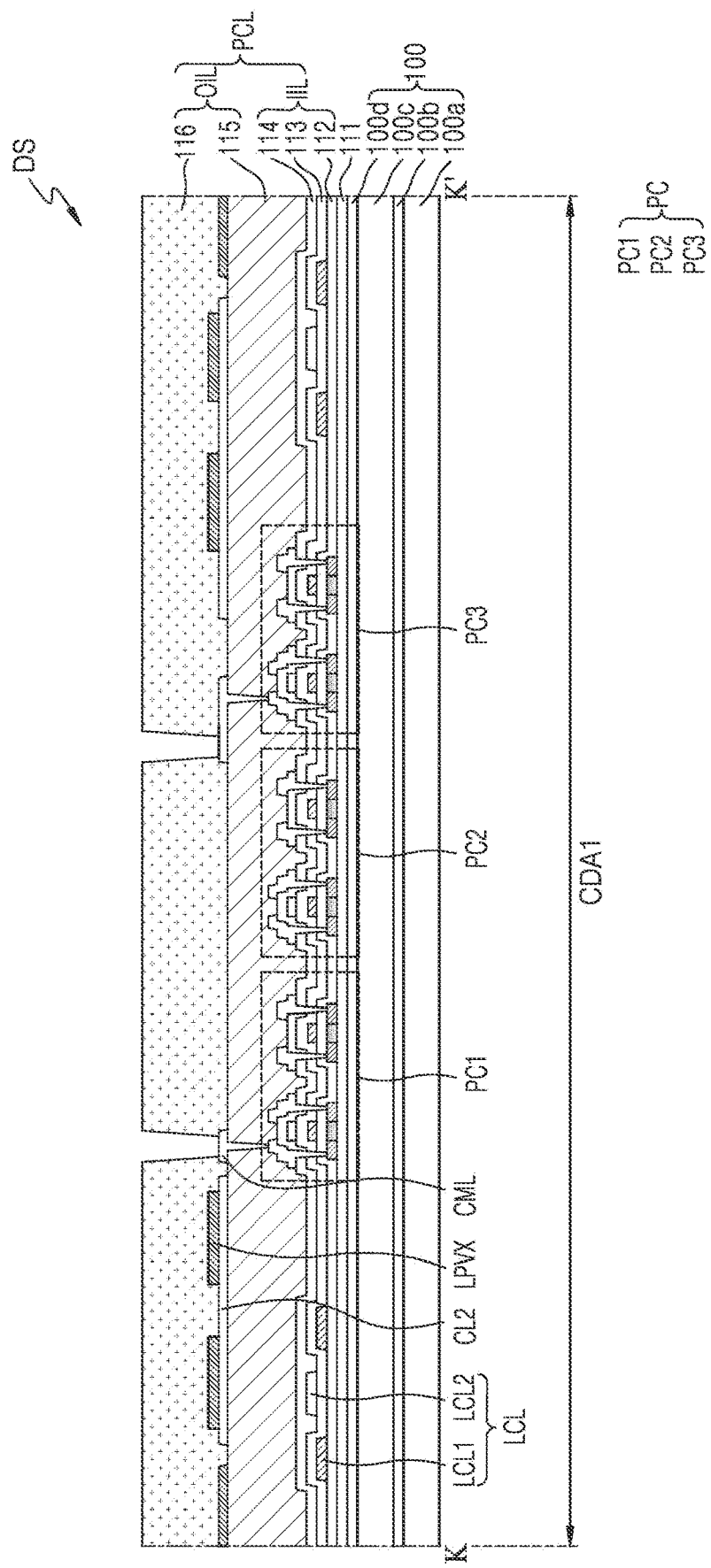

Referring to FIG. 18E, the upper organic insulating layer 116 may be formed. In an embodiment, the upper organic insulating layer 116 may be formed on the lower organic insulating layer 115. The upper organic insulating layer 116 may overlap the first corner display area CDA1, and may cover the second connection wiring CL2. In an embodiment, the upper organic insulating layer 116 may be continuously formed on the second connection wiring CL2. In an embodiment, the upper organic insulating layer 116 may include a contact hole exposing the connection electrode CML.

Figure 18F:
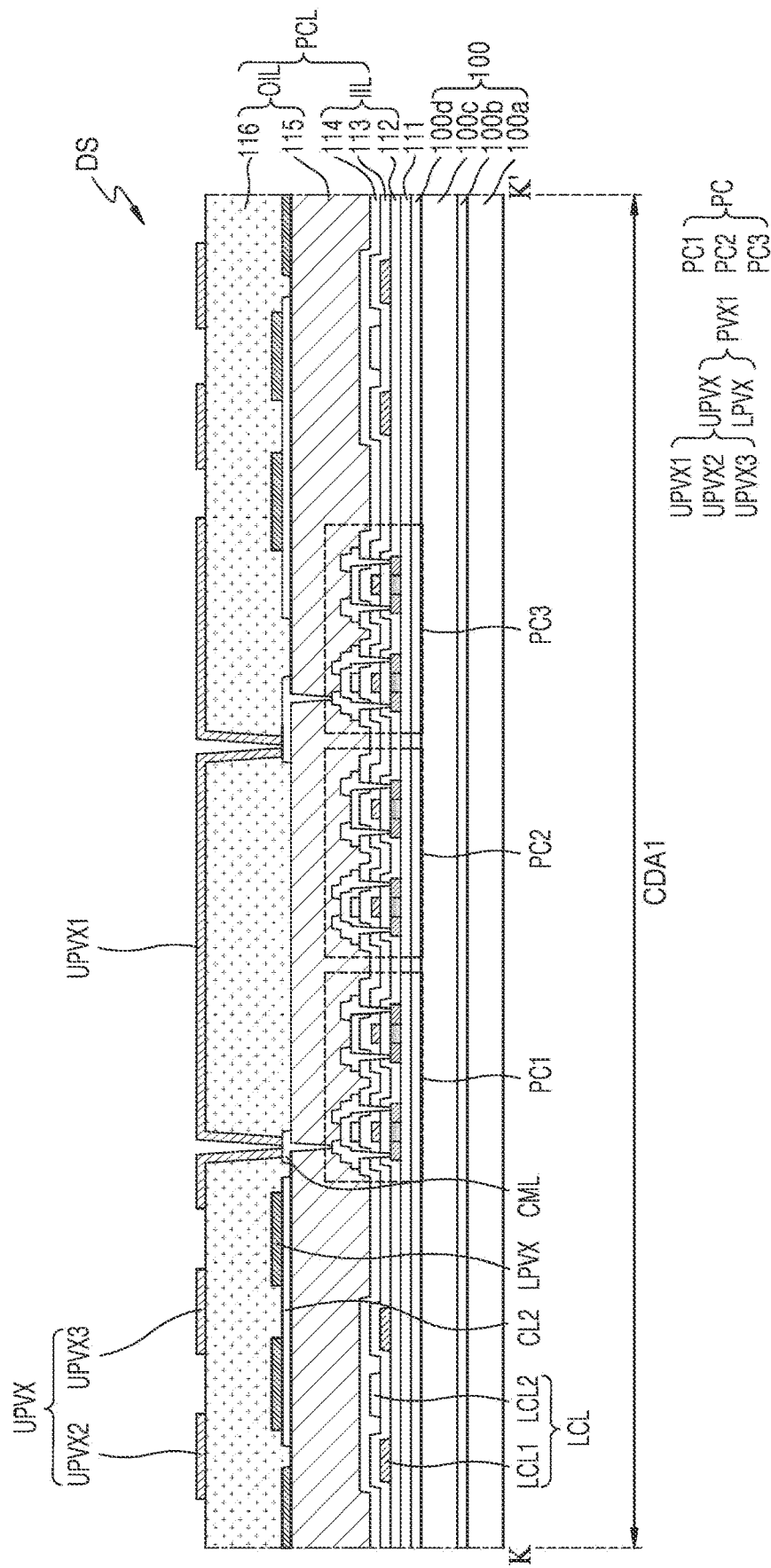

Referring to FIG. 18F, the upper inorganic pattern layer UPVX may be formed on the upper organic insulating layer 116. A process of forming the upper inorganic pattern layer UPVX may be similar to a process of forming the lower inorganic pattern layer LPVX. For example, the upper inorganic pattern layer UPVX may be formed by forming an inorganic layer on the surface (e.g., the entire surface) of the upper organic insulating layer 116 and then patterning the inorganic layer.

The upper inorganic pattern layer UPVX may include the first upper inorganic pattern layer UPVX1, the second upper inorganic pattern layer UPVX2, and the third upper inorganic pattern layer UPVX3. The first upper inorganic pattern layer UPVX1, the second upper inorganic pattern layer UPVX2, and the third upper inorganic pattern layer UPVX3 may be spaced from one another.

Figure 18G:
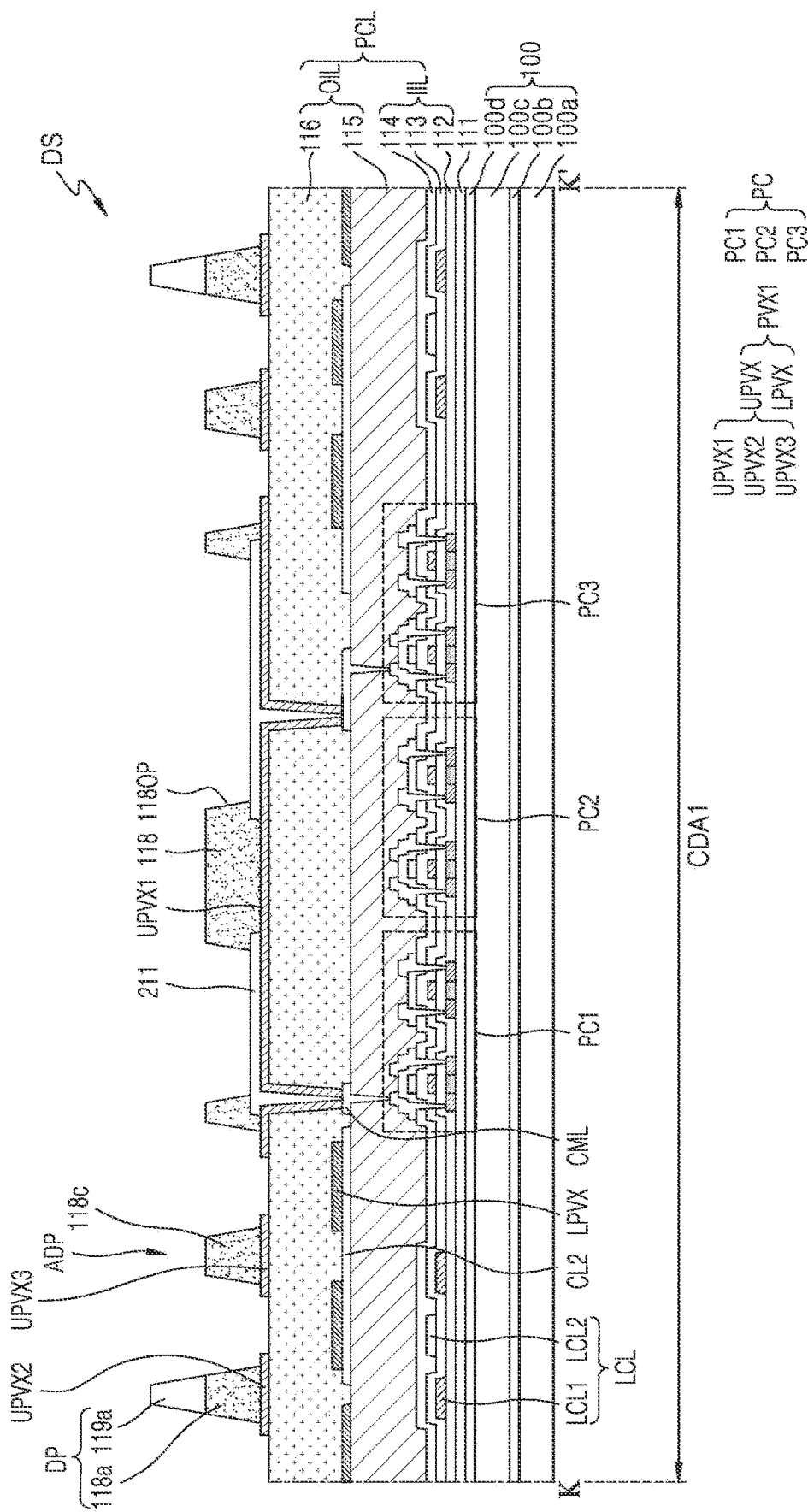

Referring to FIG. 18G, the pixel electrode 211 may be formed on the first upper inorganic pattern layer UPVX1. For example, after the upper inorganic pattern layer UPVX is formed, the pixel electrode 211 may be formed.

The pixel definition layer 118 may be formed to cover an edge of the pixel electrode 211. The pixel definition layer 118 may include the opening 118OP exposing the central portion of the pixel electrode 211.

The first corner organic pattern layer 118a and the second corner organic pattern layer 118c may be formed on the upper inorganic pattern layer UPVX. The first corner organic pattern layer 118a and the second corner organic pattern layer 118c may be formed when the pixel definition layer 118 is formed. The first corner organic pattern layer 118a and the second corner organic pattern layer 118c may be spaced from one another.

In an embodiment, the pixel definition layer 118, the first corner organic pattern layer 118a, and the second corner organic pattern layer 118c may be formed by entirely forming an organic layer on the first corner display area CDA1 and then patterning the organic layer. In this case, the pixel definition layer 118, the first corner organic pattern layer 118a, and the second corner organic pattern layer 118c may include the same material.

The upper corner organic pattern layer 119a may be formed on the first corner organic pattern layer 118a. In an embodiment, the first corner organic pattern layer 118a and the upper corner organic pattern layer 119a may be concurrently (e.g., simultaneously) formed in a mask process using a halftone mask and the like. In another embodiment, after the first corner organic pattern layer 118a is formed, the upper corner organic pattern layer 119a may be formed. The first corner organic pattern layer 118a and the upper corner organic pattern layer 119a may be the dam portion DP. The second corner organic pattern layer 118c may be the auxiliary dam portion ADP.

Figure 18H:
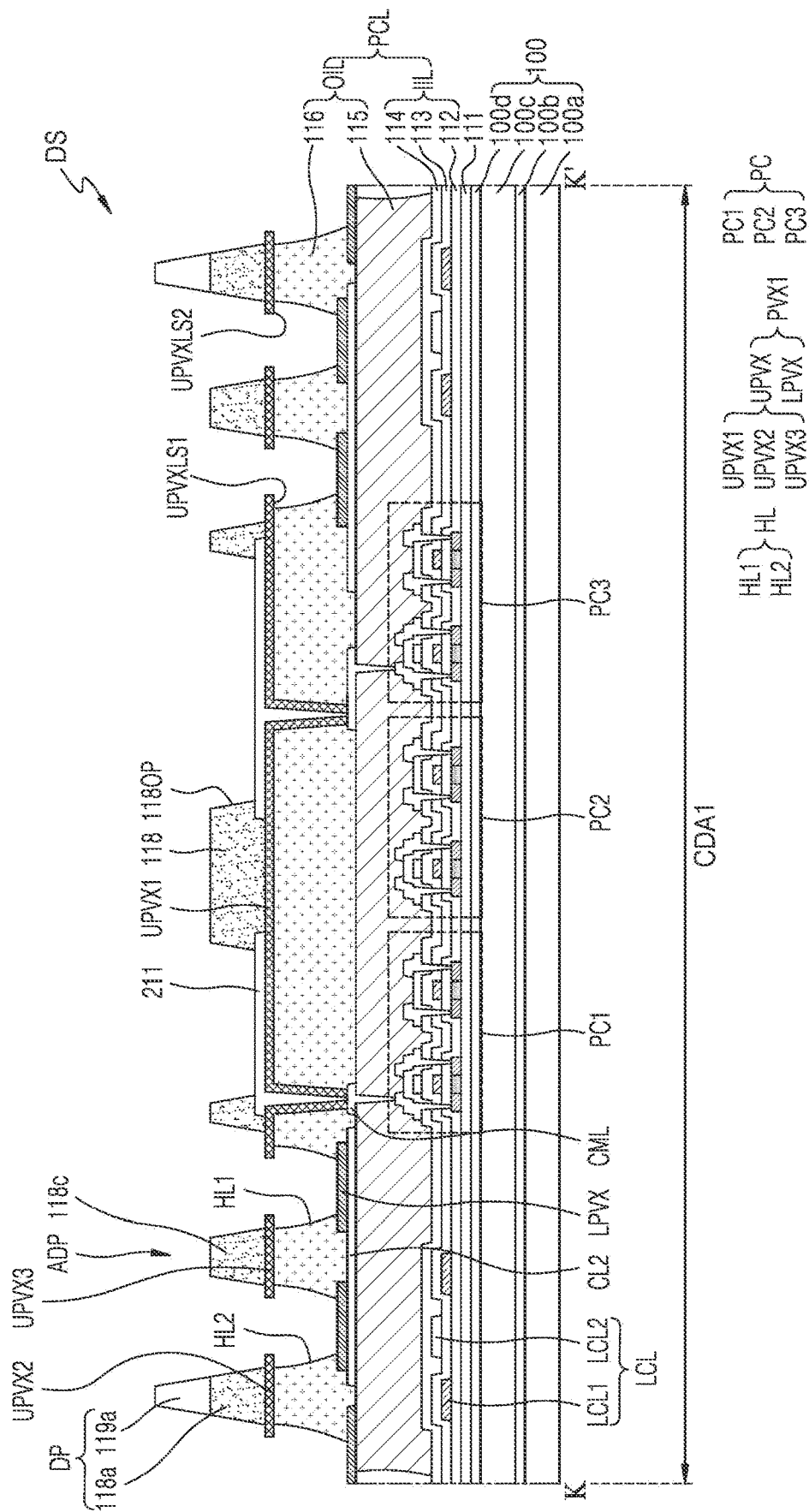

Referring to FIG. 18H, the hole HL (e.g., the hole HL including the first hole HL1 and the second hole HL2) overlapping the first corner display area CDA1 may be formed on the upper organic insulating layer 116. In an embodiment, the hole HL of the upper organic insulating layer 116 may be formed through a dry etching process.

In an embodiment, the upper organic insulating layer 116 exposed between the first upper inorganic pattern layer UPVX1 and the third upper inorganic pattern layer UPVX3 may be etched. Accordingly, the first hole HL1 of the upper organic insulating layer 116 may be formed.

In an embodiment, the upper organic insulating layer 116 exposed between the second upper inorganic pattern layer UPVX2 and the third upper inorganic pattern layer UPVX3 may be etched. Accordingly, the second hole HL2 of the upper organic insulating layer 116 may be formed.

The first hole HL1 and the second hole HL2 may expose the lower inorganic pattern layer LPVX. In an embodiment, the first hole HL1 and the second hole HL2 may expose a central portion of the lower inorganic pattern layer LPVX. The lower inorganic pattern layer LPVX may prevent or protect the second connection wiring CL2 under the lower inorganic pattern layer LPVX from being overetched or damaged.

Accordingly, the lower inorganic pattern layer LPVX may prevent or reduce the overetching of the second connection wiring CL2, which causes an increase in resistance of the second connection wiring CL2.

In an embodiment, the upper organic insulating layer 116 disposed under the upper inorganic pattern layer UPVX may be overetched. Accordingly, the upper organic insulating layer 116 may have an undercut structure. In this case, a lower surface of an end portion of the upper inorganic pattern layer UPVX may be exposed. For example, the lower surface UPVXLS1 of the first upper inorganic pattern layer UPVX1 (e.g., the lower surface UPVXLS1 overlapping the first hole HL1 of the upper organic insulating layer 116) and the lower surface UPVXLS2 of the second upper inorganic pattern layer UPVX2 (e.g., the lower surface UPVXLS2 overlapping the second hole HL2 of the upper organic insulating layer 116) may be exposed.

In an embodiment, the protruding tip PT of the upper inorganic pattern layer UPVX may protrude in the direction toward the center of the hole HL.

In an embodiment, when the hole HL is formed, the dam portion DP, the auxiliary dam portion ADP, the pixel electrode 211, and the pixel definition layer 118 may be protected by a protection layer. The protection layer may include an indium zinc oxide (IZO).

Figure 18I:
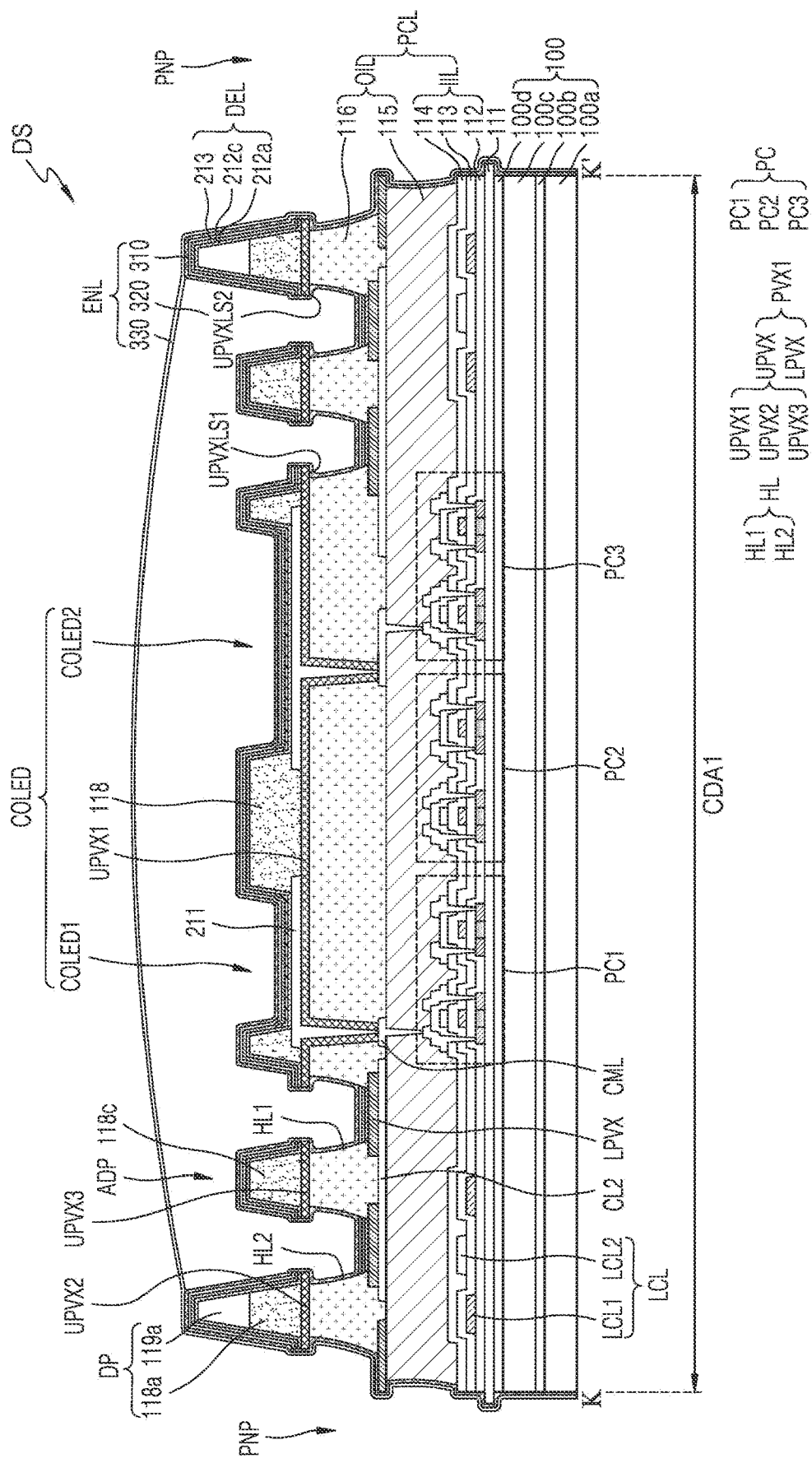

Referring to FIG. 18I, the corner organic light-emitting diode COLED overlapping the first corner display area CDA1 may be formed. As the upper inorganic pattern layer UPVX includes the protruding tip PT protruding in the direction toward the center of the hole HL, the first functional layer 212a, the second functional layer 212c, and the counter electrode 213 may be disconnected or discontinued with respect to or at the hole HL.

The lower surface UPVXLS1 of the first upper inorganic pattern layer UPVX1 (e.g., the lower surface UPVXLS1 overlapping the first hole HL1 of the upper organic insulating layer 116) and the lower surface UPVXLS2 of the second upper inorganic pattern layer UPVX2 (e.g., the lower surface UPVXLS2 overlapping the second hole HL2 of the upper organic insulating layer 116) may not be in contact with the first functional layer 212a, the second functional layer 212c, and the counter electrode 213. Accordingly, the infiltration of external moisture and foreign material into the first corner display area CDA1 through at least one of the first functional layer 212a and the second functional layer 212c may be prevented or reduced, and thus the reliability of the display panel may be improved.

The encapsulation layer ENL may be formed after the corner organic light-emitting diode COLED is formed. The encapsulation layer ENL may include at least one inorganic encapsulation layer and at least one organic encapsulation layer. For example, the encapsulation layer ENL may include the first inorganic encapsulation layer 310, the organic encapsulation layer 320, and the second inorganic encapsulation layer 330.

The first inorganic encapsulation layer 310 may be in contact with the lower surface UPVXLS1 of the first upper inorganic pattern layer UPVX1 (e.g., the lower surface UPVXLS1 overlapping the first hole HL1 of the upper organic insulating layer 116) and the lower surface UPVXLS2 of the second upper inorganic pattern layer UPVX2 (e.g., the lower surface UPVXLS2 overlapping the second hole HL2 of the upper organic insulating layer 116).

In an embodiment, the first inorganic encapsulation layer 310 may be in contact with the lower inorganic pattern layer LPVX. Furthermore, the first inorganic encapsulation layer 310 may be in contact with the inorganic insulating layer IIL.

In an embodiment, the organic encapsulation layer 320 may extend to the dam portion DP. The dam portion DP may control the flow of an organic material forming the organic encapsulation layer 320.

The second inorganic encapsulation layer 330 may be formed on the organic encapsulation layer 320. The second inorganic encapsulation layer 330 may be in contact with the first inorganic encapsulation layer 310 on or at the dam portion DP.

Then, a plurality of neighboring extension portions may be separated from each other by forming the penetration portion PNP.

FIGS. 19A-19H are cross-sectional views of a method of manufacturing a display device according to an embodiment. FIGS. 19A-19H are cross-sectional views of the display substrate DS of FIG. 16 taken along the line L-L' and the line M-M'. In FIGS. 19A-19H, the same reference symbols as those of FIG. 13 denote the same members, and repetitive descriptions thereof may not be repeated.

Figure 19A:
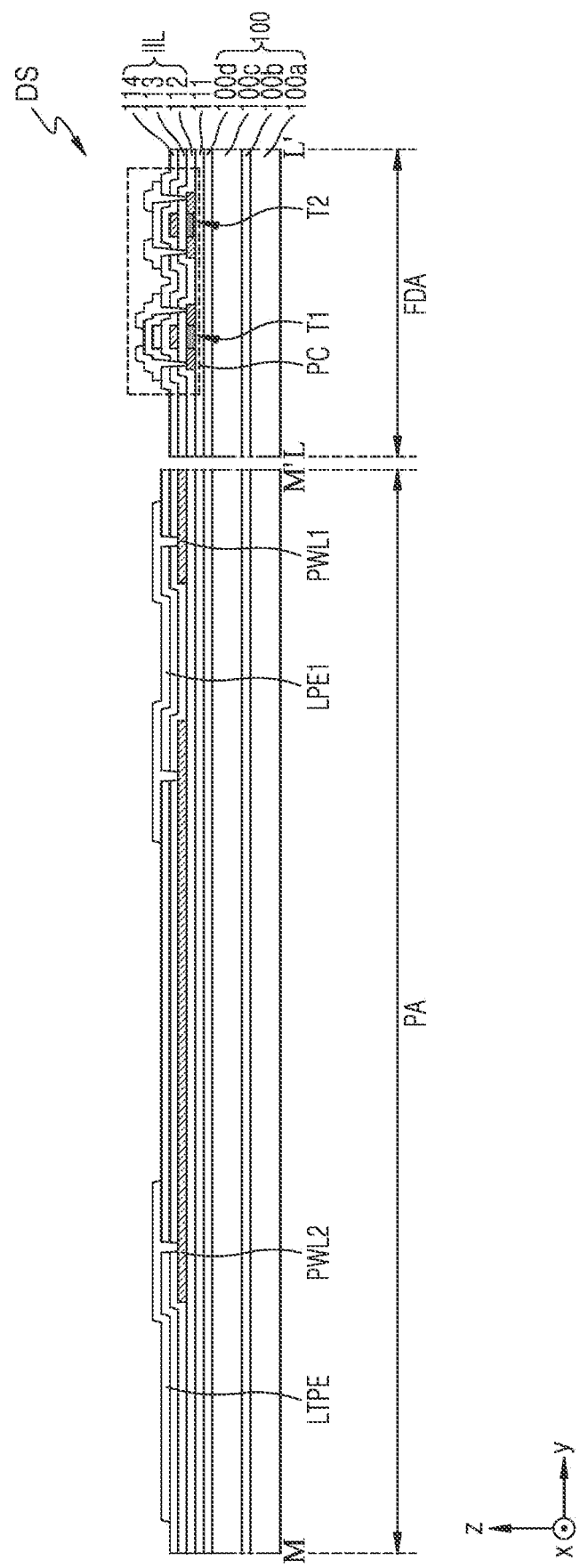
FIGS. 19A-19H are cross-sectional views of a method of manufacturing a display device according to an embodiment.

Referring to FIG. 19A, the display substrate DS may include the substrate 100, the buffer layer 111, the pixel circuit PC, the first pad wiring PWL1, the second pad wiring PWL2, and the inorganic insulating layer IIL. The substrate 100 may include the front display area FDA and the peripheral area PA. The inorganic insulating layer IIL may be disposed in the front display area FDA and the peripheral area PA. The inorganic insulating layer IIL may include the first gate insulating layer 112, the second gate insulating layer 113, and the interlayer insulating layer 114.

In an embodiment, at least one of the first pad wiring PWL1 or the second pad wiring PWL2 may be disposed between the first gate insulating layer 112 and the second gate insulating layer 113. In another embodiment, at least one of the first pad wiring PWL1 or the second pad wiring PWL2 may be disposed between the second gate insulating layer 113 and the interlayer insulating layer 114. In the following description, a case in which the first pad wiring PWL1 and the second pad wiring PWL2 are disposed between the first gate insulating layer 112 and the second gate insulating layer 113 is primarily described in more detail.

In an embodiment, the first pad wiring PWL1 and the second pad wiring PWL2 may extend in the first direction, for example, the y direction or the -y direction.

In an embodiment, the first lower pad electrode LPE1 and a lower test pad electrode LTPE may be formed on the inorganic insulating layer IIL. The lower test pad electrode LTPE may include a conductive material including Mo, Al, Cu, Ti, and/or the like, and may be formed in a single layer or multiple layers including the above material. In an embodiment, the lower test pad electrode LTPE may have a multilayer structure of Ti/Al/Ti.

The first lower pad electrode LPE1 may be connected (e.g., electrically connected) to the first pad wiring PWL1 and the second pad wiring PWL2 through respective contact holes provided in the second gate insulating layer 113 and the interlayer insulating layer 114. The lower test pad electrode LTPE may be connected (e.g., electrically connected) to the second pad wiring PWL2 through the contact hole provided in the second gate insulating layer 113 and the interlayer insulating layer 114.

Figure 19B:
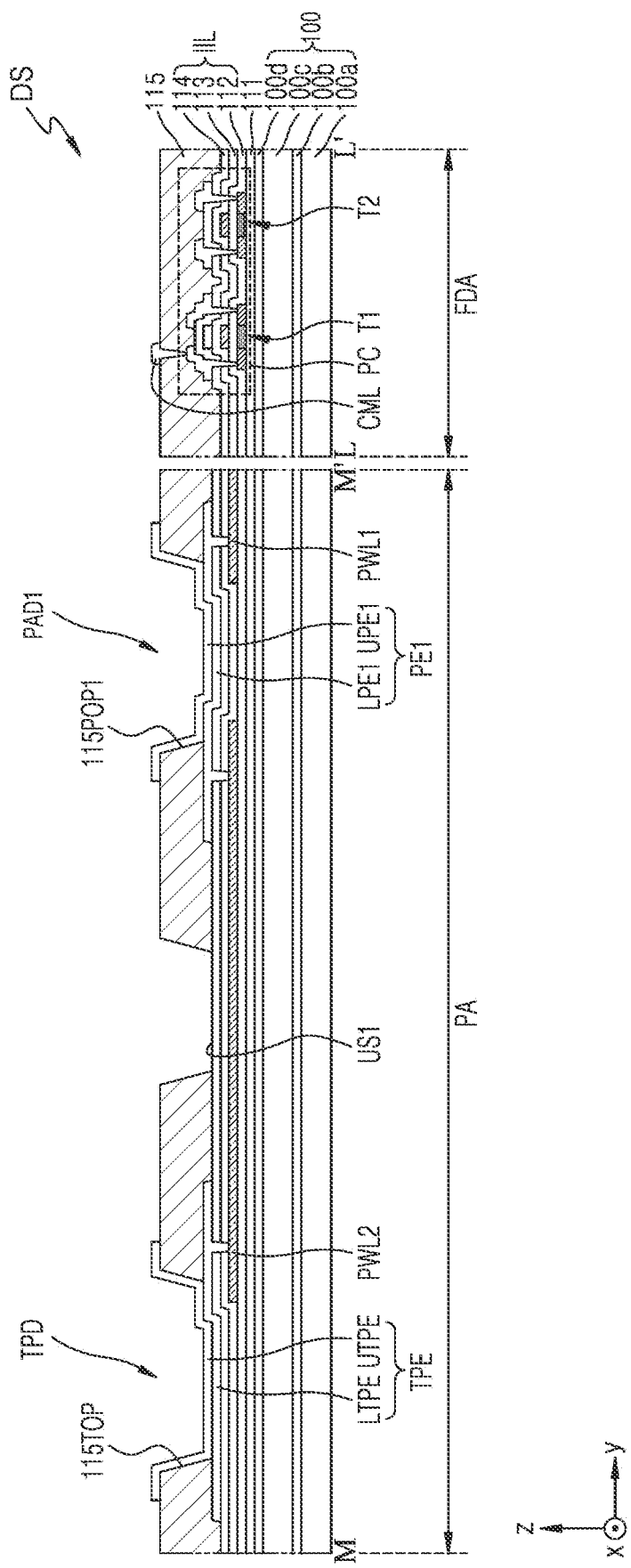

Referring to FIG. 19B, the lower organic insulating layer 115 may be formed. The lower organic insulating layer 115 may be formed in the peripheral area PA and the front display area FDA. The lower organic insulating layer 115 may be formed such that the first upper surface US1 of the inorganic insulating layer IIL (e.g., the first upper surface US1 overlapping the peripheral area PA) is exposed. For example, the first upper surface US1 of the inorganic insulating layer IIL may not overlap the lower organic insulating layer 115.

The lower organic insulating layer 115 may include the first lower pad opening portion 115POP1 and a lower test pad opening portion 115TOP. The first lower pad opening portion 115POP1 may overlap the first lower pad electrode LPE1. The lower test pad opening portion 115TOP may overlap the lower test pad electrode LTPE.

The connection electrode CML, the first upper pad electrode UPE1, and an upper test pad electrode UTPE may be formed on the lower organic insulating layer 115. The connection electrode CML may be formed in the front display area FDA, and may be connected (e.g., electrically connected) to the pixel circuit PC. The first upper pad electrode UPE1 may overlap the first lower pad electrode LPE1. The upper test pad electrode UTPE may overlap the lower test pad electrode LTPE.

Figure 19C:
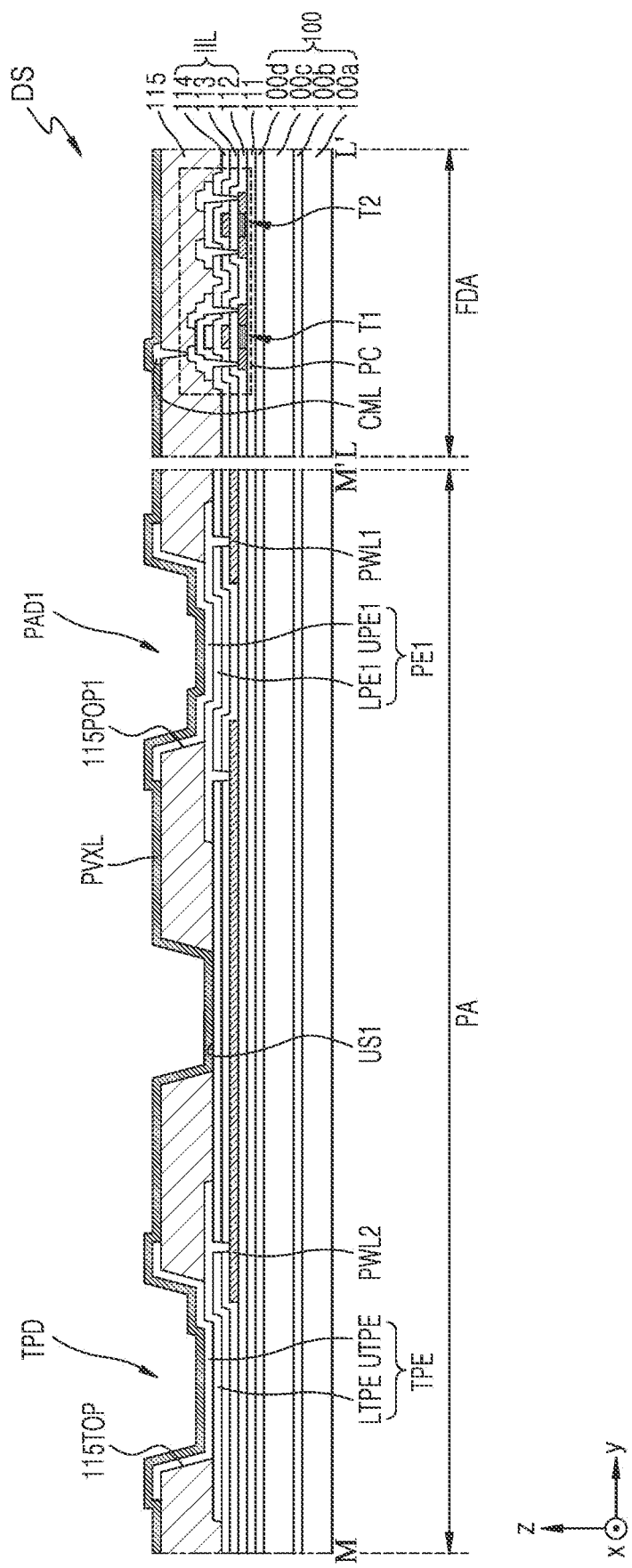

Referring to FIG. 19C, the inorganic layer PVXL may be formed. The inorganic layer PVXL may be formed on the surface (e.g., the entire surface) of the peripheral area PA and the front display area FDA.

The inorganic layer PVXL may be formed on the lower organic insulating layer 115. The inorganic layer PVXL may overlap the lower organic insulating layer 115, the first pad electrode PE1, a test pad electrode TPE, the connection electrode CML, and the first upper surface US1 of the inorganic insulating layer IIL.

The inorganic layer PVXL may be formed on the first upper surface US1 of the inorganic insulating layer IIL. As the inorganic layer PVXL is formed on the surface (e.g., the entire surface) of the display substrate DS, the inorganic layer PVXL may be formed on the first upper surface US1 of the inorganic insulating layer IIL. The inorganic layer PVXL may extend from the first upper surface US1 of the inorganic insulating layer IIL to an upper surface of the lower organic insulating layer 115.

The inorganic layer PVXL may be in direct contact with the inorganic insulating layer IIL. In other words, an intervening element may not be provided between the inorganic layer PVXL and the inorganic insulating layer IIL.

Figure 19D:
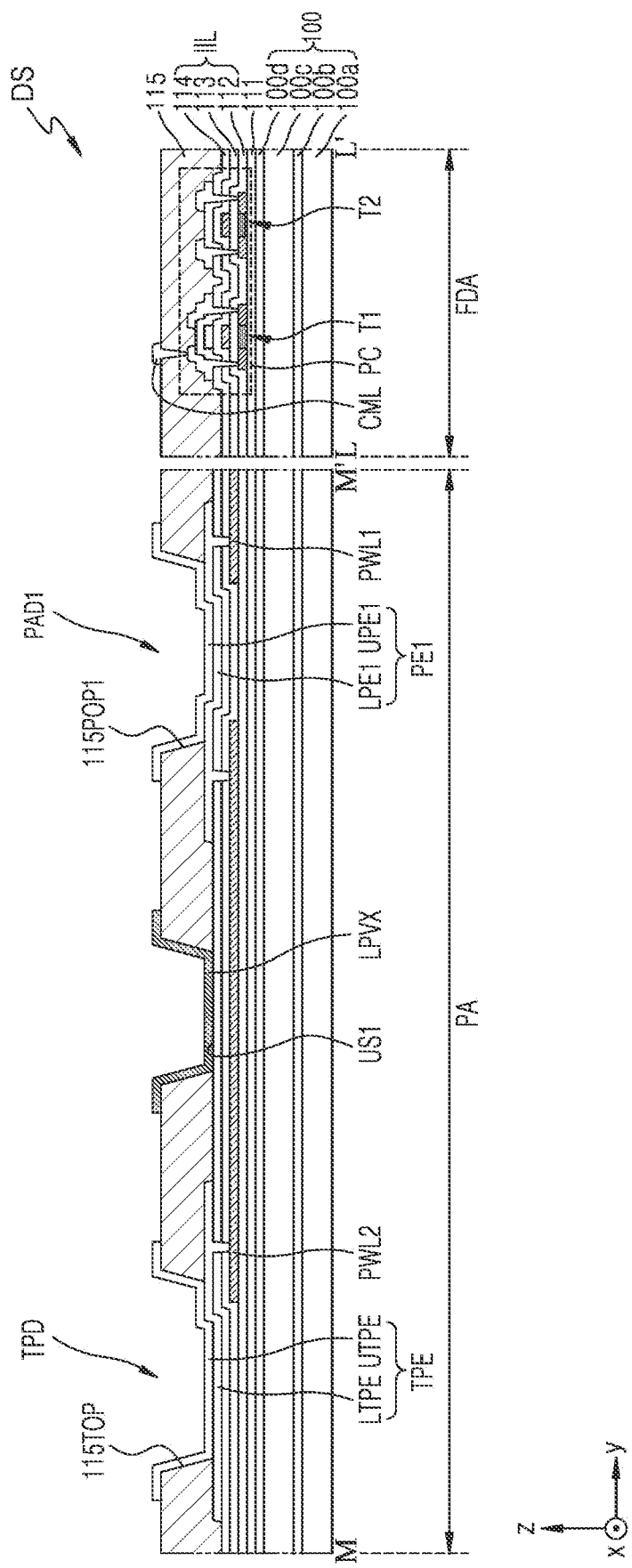

Referring to FIG. 19D, the lower inorganic pattern layer LPVX overlapping the peripheral area PA may be formed by at least partially removing the inorganic layer PVXL. The lower inorganic pattern layer LPVX may overlap the first upper surface US1 of the inorganic insulating layer IIL. In an embodiment, the inorganic layer PVXL may be fully removed from the front display area FDA. Accordingly, in an embodiment, the inorganic layer PVXL may be partially removed in the peripheral area PA and fully removed in the front display area FDA.

The lower inorganic pattern layer LPVX may be in contact with the first upper surface US1 of the inorganic insulating layer IIL. In an embodiment, the lower inorganic pattern layer LPVX may cover (e.g., may entirely cover) the first upper surface US1 of the inorganic insulating layer IIL. In an embodiment, the lower inorganic pattern layer LPVX may extend from the first upper surface US1 of the inorganic insulating layer IIL to the upper surface of the lower organic insulating layer 115. In another embodiment, the lower inorganic pattern layer LPVX may not extend from the first upper surface US1 of the inorganic insulating layer IIL to the upper surface of the lower organic insulating layer 115.

Figure 19E:
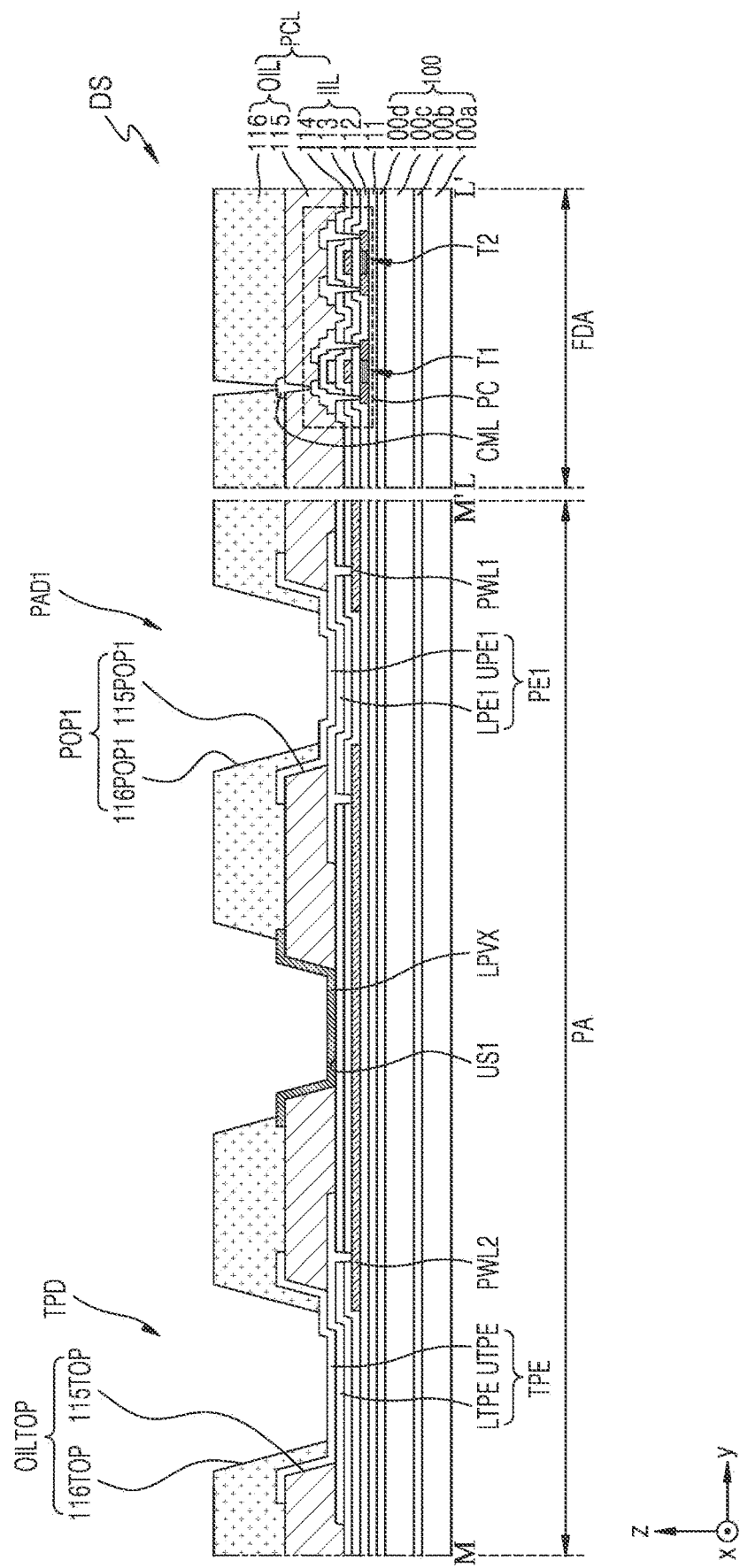

Referring to FIG. 19E, the upper organic insulating layer 116 may be formed. The upper organic insulating layer 116 may overlap the peripheral area PA and the front display area FDA. In an embodiment, the upper organic insulating layer 116 may include a contact hole exposing the connection electrode CML. The upper organic insulating layer 116 may include the first upper pad opening portion 116POP1 and an upper test pad opening portion 116TOP in the peripheral area PA. The first upper pad opening portion 116POP1 may overlap the first pad electrode PE1. The upper test pad opening portion 116TOP may overlap the test pad electrode TPE.

The first lower pad opening portion 115POP1 and the first upper pad opening portion 116POP1 may be the first pad opening portion POP1. The lower test pad opening portion 115TOP and the upper test pad opening portion 116TOP may be a test pad opening portion OILTOP.

Figure 19F:
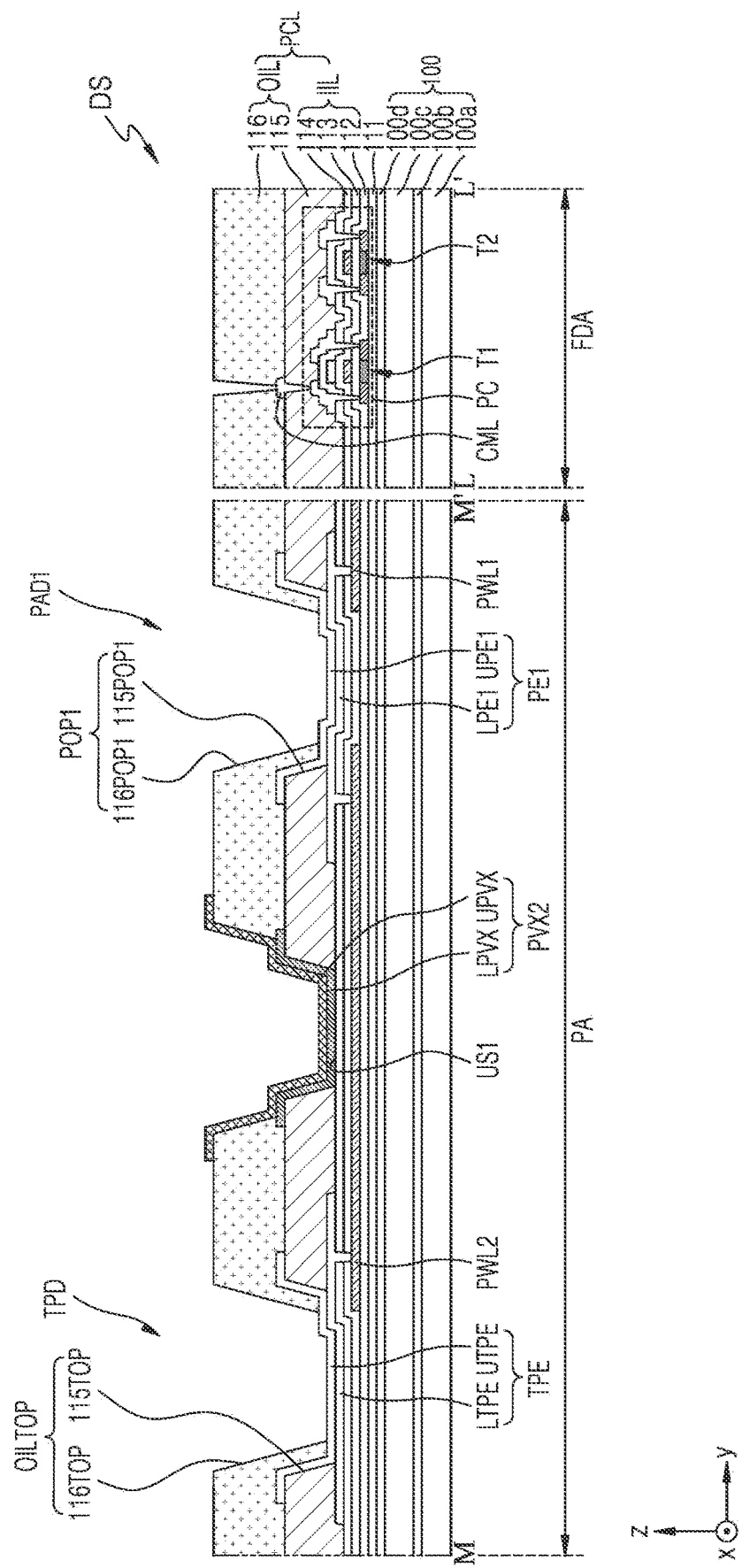

Referring to FIG. 19F, the upper inorganic pattern layer UPVX may be formed. A process of forming the upper inorganic pattern layer UPVX may be similar to a process of forming the lower inorganic pattern layer LPVX. For example, the upper inorganic pattern layer UPVX may be formed by forming an inorganic layer on the surface (e.g., the entire surface) of the upper organic insulating layer 116 and then patterning the inorganic layer. The lower inorganic pattern layer LPVX and the upper inorganic pattern layer UPVX disposed in the peripheral area PA may be the second inorganic pattern layer PVX2.

The second inorganic pattern layer PVX2 may protect the inorganic insulating layer IIL and the second pad wiring PWL2. In an embodiment, in the peripheral area PA, the inorganic insulating layer IIL may be in contact with any one of the organic insulating layer OIL, the first pad electrode PE1, and the second inorganic pattern layer PVX2. For example, the first upper surface US1 of the inorganic insulating layer IIL may be in contact with the second inorganic pattern layer PVX2. The inorganic insulating layer IIL may be in contact with the organic insulating layer OIL and the first pad electrode PE1 in the first pad PAD1. Accordingly, the inorganic insulating layer IIL may be protected in the peripheral area PA.

The second inorganic pattern layer PVX2 may protect the inorganic insulating layer IIL and the second pad wiring PWL2. In the present embodiment, the first inorganic pattern layer PVX1 described with reference to FIGS. 18A-18I may be formed in the first corner display area CDA1. The first inorganic pattern layer PVX1 may be formed in the patterning process after an inorganic layer is formed on the surface (e.g., the entire surface) of the display substrate DS. In this case, when the first upper surface US1 of the inorganic insulating layer IIL is exposed, the inorganic insulating layer IIL and the second pad wiring PWL2 may be etched or damaged in the patterning process. In the present embodiment, as the second inorganic pattern layer PVX2 is formed on the first upper surface US1 of the inorganic insulating layer IL in the patterning process, damage to the inorganic insulating layer IIL and the second pad wiring PWL2 may be prevented or reduced.

Although a method of manufacturing a display device in the peripheral area PA that the first pad PAD1 overlaps is described, the manufacturing method may be performed in a similar manner in the peripheral area PA that the second pad PAD2 overlaps.

Figure 19G:
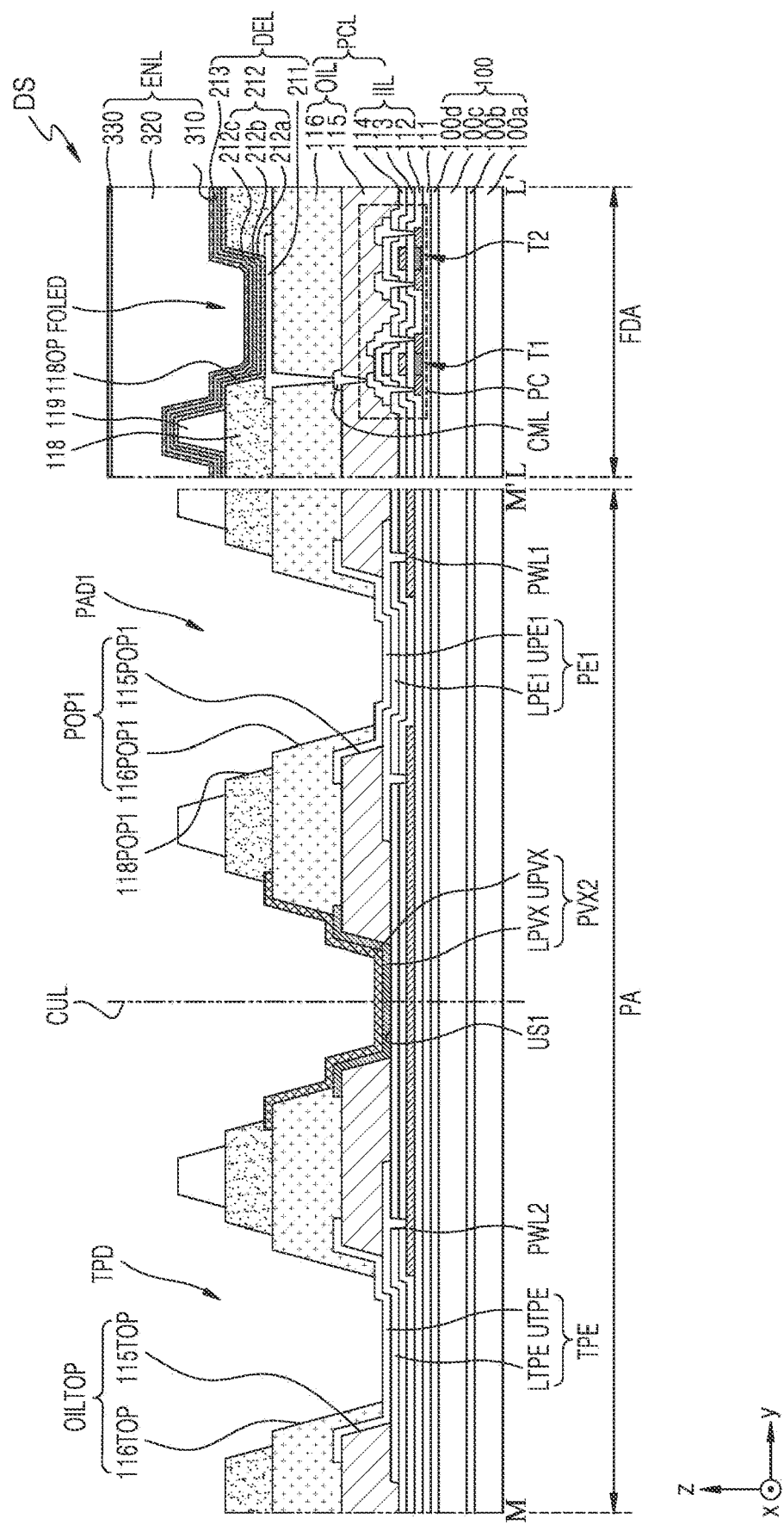

Referring to FIG. 19G, the display element layer DEL may be formed. In an embodiment, the front organic light-emitting diode FOLED may be formed as a display element at or overlapping the front display area FDA. The front organic light-emitting diode FOLED may include the pixel electrode 211, the intermediate layer 212, and the counter electrode 213.

In an embodiment, the pixel electrode 211 may be formed in the front display area FDA.

In an embodiment, the pixel definition layer 118 may be disposed in the front display area FDA and the peripheral area PA. The pixel definition layer 118 may include the first pad opening portion 118POP1 of the pixel definition layer 118 (e.g., the first pad opening portion 118POP1 overlapping the first pad PAD1). In an embodiment, the spacer 119 overlapping the peripheral area PA may be further disposed on the pixel definition layer 118.

Then, the encapsulation layer ENL overlapping the front display area FDA may be formed. The encapsulation layer ENL may include the first inorganic encapsulation layer 310, the organic encapsulation layer 320, and the second inorganic encapsulation layer 330.

Then, the lighting of the organic light-emitting diode OLED may be inspected through the test pad TPD. In an embodiment, a test signal may be applied to the test pad TPD, and whether the organic light-emitting diode OLED emits light may be inspected.

Figure 19H:
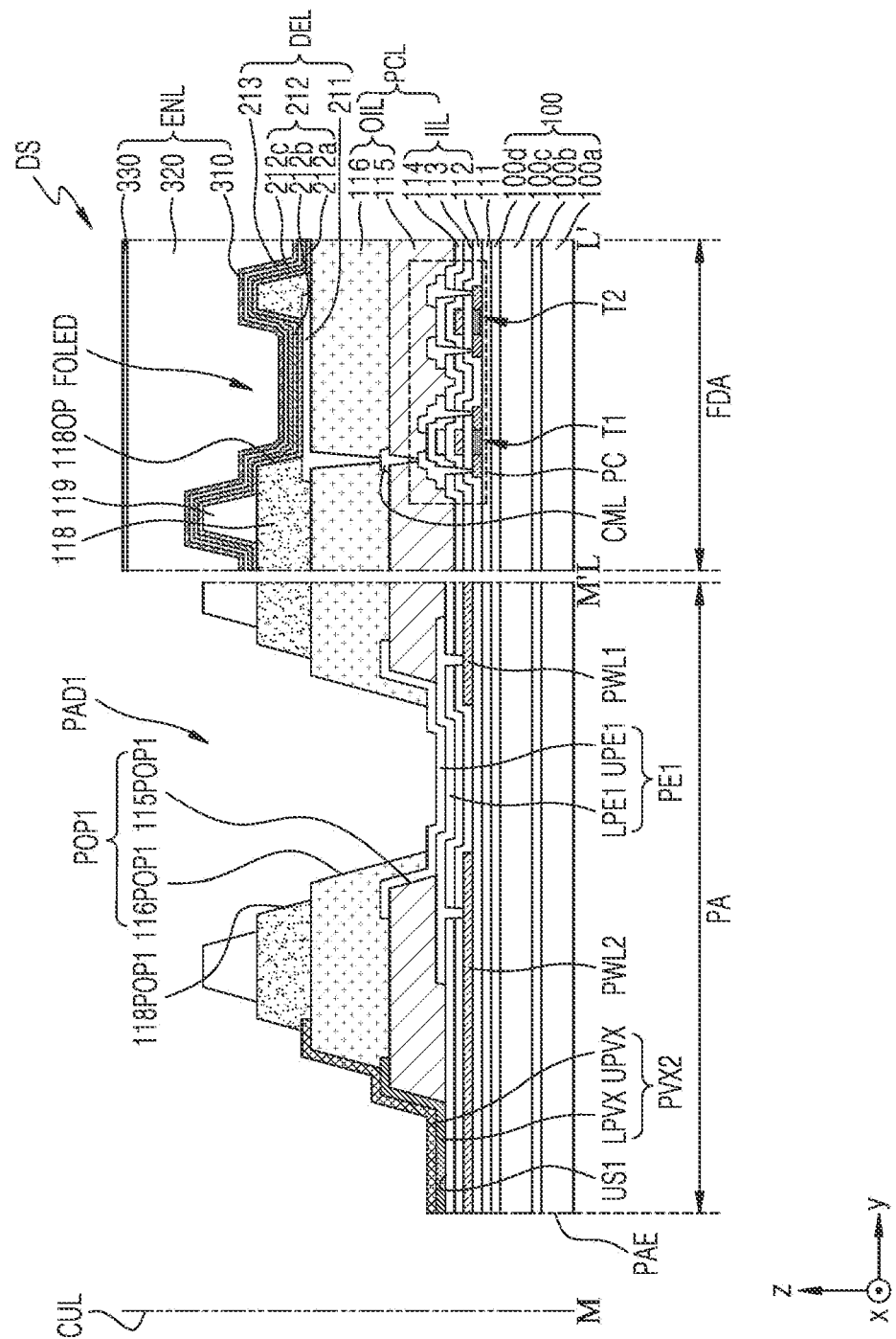

Referring to FIGS. 19G and 19H, the display substrate DS may be cut along a cutting line CUL crossing the first upper surface US1 of the inorganic insulating layer K. Accordingly, the test pad TPD may be removed. In this case, the edge PAE of the peripheral area PA may overlap the cutting line CUL.

As the test pad TPD is removed after the lighting of the organic light-emitting diode OLED is inspected, the area of the peripheral area PA may be reduced.

In the present embodiment, the cutting line CUL may cross the first upper surface US1 of the inorganic insulating layer IIL. The organic insulating layer OIL, the pixel definition layer 118, and/or the spacer 119, and the like may not be disposed on the first upper surface US1 of the inorganic insulating layer IIL. Accordingly, an area overlapping the first upper surface US1 of the inorganic insulating layer IIL may be a thin part of the display substrate DS, and thus the display substrate DS may be cut (e.g., easily cut).

FIGS. 20A-20I are cross-sectional views of another method of manufacturing the display device according to one or more embodiments. FIGS. 20A-20I are cross-sectional views of the display substrate DS of FIG. 16 taken along the line L-L' and the line N-N'. In FIGS. 20A-20I, the same reference symbols as those of FIG. 15 denote the same members, and repetitive descriptions thereof may not be repeated.

Figure 20A:
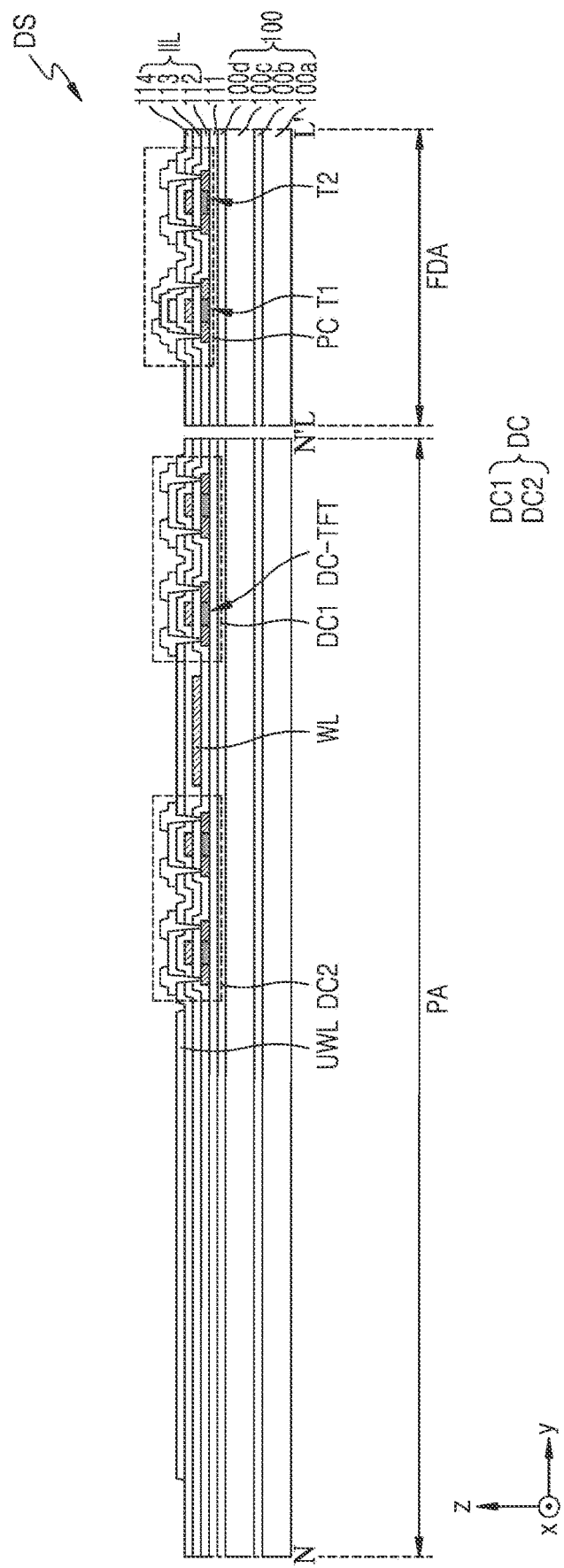
FIGS. 20A-20I are cross-sectional views of another method of manufacturing the display device according to an embodiment.

Referring to FIG. 20A, the display substrate DS may include the substrate 100, the buffer layer 111, the pixel circuit PC, the driving circuit DC, the wiring WL, the upper wiring UWL, and the inorganic insulating layer IIL. The inorganic insulating layer IIL may include the first gate insulating layer 112, the second gate insulating layer 113, and the interlayer insulating layer 114.

In an embodiment, the driving circuit DC may include the first driving circuit DC1 and the second driving circuit DC2. The first driving circuit DC1 and the second driving circuit DC2 may be spaced from each other. In an embodiment, the first driving circuit DC1 and the second driving circuit DC2 may be connected (e.g., electrically connected) to each other through the wiring WL.

In an embodiment, the wiring WL may be disposed in the peripheral area PA. In an embodiment, the wiring WL may be disposed between the first gate insulating layer 112 and the second gate insulating layer 113. In another embodiment, the wiring WL may be disposed between the second gate insulating layer 113 and the interlayer insulating layer 114. Accordingly, when the inorganic insulating layer IIL includes a first inorganic insulating layer and a second inorganic insulating layer, the wiring WL may be disposed between the first inorganic insulating layer and the second inorganic insulating layer. In some embodiments, the wiring WL may be disposed between the buffer layer 111 and the inorganic insulating layer IIL. The upper wiring UWL may be disposed on the inorganic insulating layer IIL.

Figure 20B:
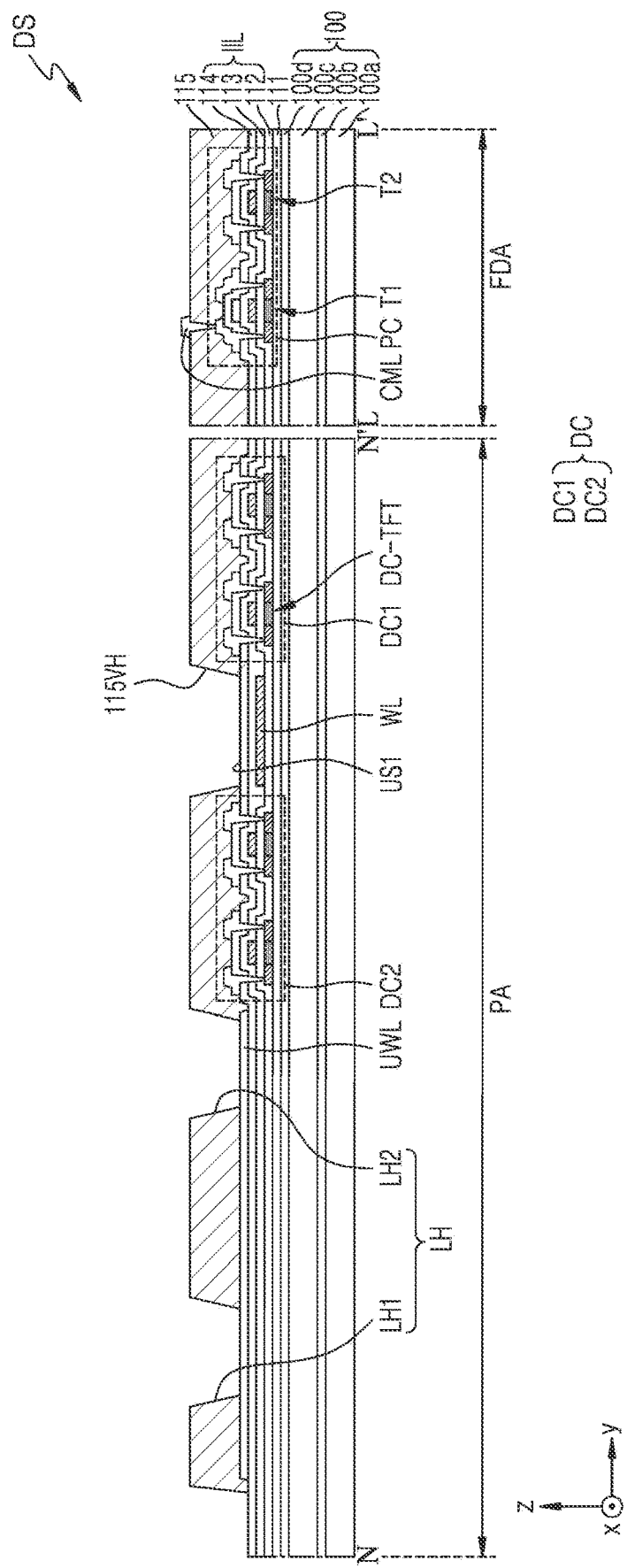

Referring to FIG. 20B, the lower organic insulating layer 115 may be formed. The lower organic insulating layer 115 may be formed in the peripheral area PA and the front display area FDA. The lower organic insulating layer 115 may cover the driving thin film transistor T1 and the switching thin film transistor T2 of the pixel circuit PC. The lower organic insulating layer 115 may cover the driving circuit DC.

The lower organic insulating layer 115 may be formed to expose the first upper surface US1 of the inorganic insulating layer IIL (e.g., the first upper surface US1 overlapping the peripheral area PA). For example, the first upper surface US1 of the inorganic insulating layer IIL may not overlap the lower organic insulating layer 115.

The lower organic insulating layer 115 may include the lower hole LH exposing at least part of the upper wiring UWL. For example, the lower organic insulating layer 115 may include the first lower hole LH1 and the second lower hole LH2.

The lower organic insulating layer 115 may include the first valley hole 115VH. The first valley hole 115VH may overlap the first upper surface US1 of the inorganic insulating layer IIL. The first valley hole 115VH may expose the first upper surface US1 of the inorganic insulating layer IIL.

The connection electrode CML may be formed on the lower organic insulating layer 115. The connection electrode CML may be formed in the front display area FDA, and may be connected (e.g., electrically connected) to the pixel circuit PC.

Figure 20C:
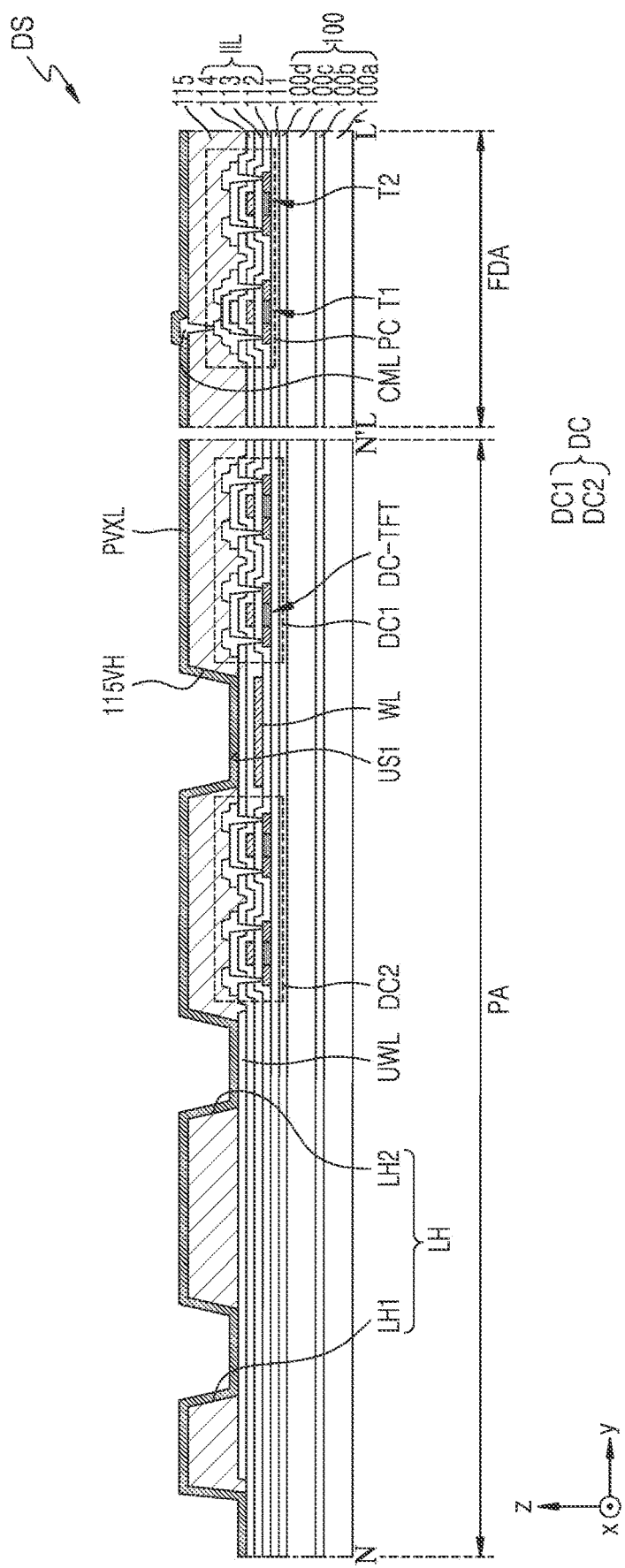

Referring to FIG. 20C, the inorganic layer PVXL may be formed. The inorganic layer PVXL may be formed on the surfaces (e.g., entire surfaces) of the peripheral area PA and the front display area FDA.

The inorganic layer PVXL may be formed on the lower organic insulating layer 115. The inorganic layer PVXL may overlap the lower organic insulating layer 115, the upper wiring UWL, the first upper surface US1 of the inorganic insulating layer IIL, and the connection electrode CML.

The inorganic layer PVXL may be formed on the first upper surface US1 of the inorganic insulating layer IIL. As the inorganic layer PVXL is formed on the surface (e.g., the entire surface) of the display substrate DS, the inorganic layer PVXL may be formed on the first upper surface US1 of the inorganic insulating layer IIL. The inorganic layer PVXL may extend from the first upper surface US1 of the inorganic insulating layer IIL to the upper surface of the lower organic insulating layer 115.

The inorganic layer PVXL may be in direct contact with the inorganic insulating layer IIL. In other words, an intervening element may not be provided between the inorganic layer PVXL and the inorganic insulating layer IIL.

Figure 20D:
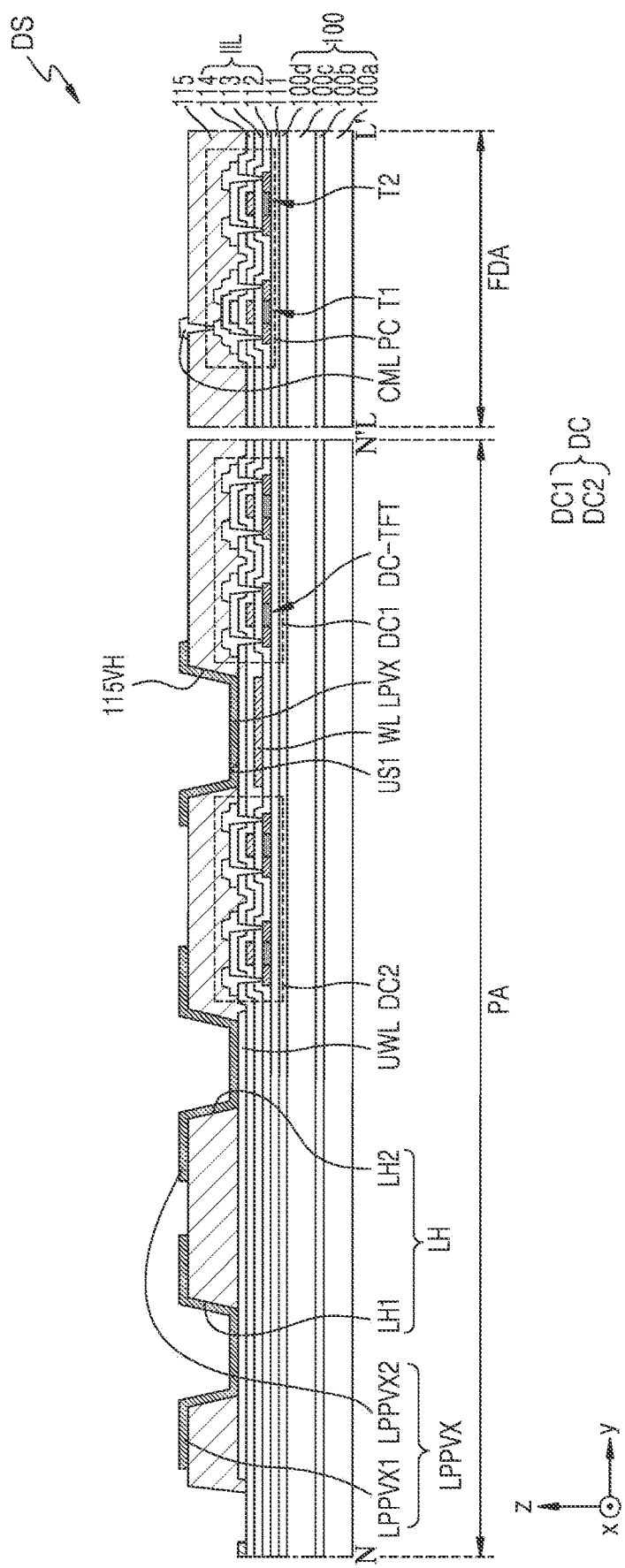

Referring to FIG. 20D, the lower inorganic pattern layer LPVX and the lower peripheral inorganic pattern layer LPPVX, both overlapping the peripheral area PA, may be formed by removing at least part of the inorganic layer PVXL. The lower inorganic pattern layer LPVX may overlap the first upper surface US1 of the inorganic insulating layer IIL. The lower peripheral inorganic pattern layer LPPVX may be disposed on the upper wiring UWL. In an embodiment, the inorganic layer PVXL may be all removed from the front display area FDA.

The lower inorganic pattern layer LPVX may be formed in the first valley hole 115VH. The lower inorganic pattern layer LPVX may overlap the first valley hole 115VH. For example, the lower inorganic pattern layer LPVX may be in contact with the first upper surface US1 of the inorganic insulating layer IIL. In an embodiment, the second inorganic pattern layer PVX2 may cover (e.g., may entirely cover) the first upper surface US1 of the inorganic insulating layer IIL. In an embodiment, the second inorganic pattern layer PVX2 may extend from the first upper surface US1 of the inorganic insulating layer IIL to the upper surface of the lower organic insulating layer 115. In another embodiment, the second inorganic pattern layer PVX2 may not extend from the first upper surface US1 of the inorganic insulating layer IIL to the upper surface of the lower organic insulating layer 115.

Figure 20E:
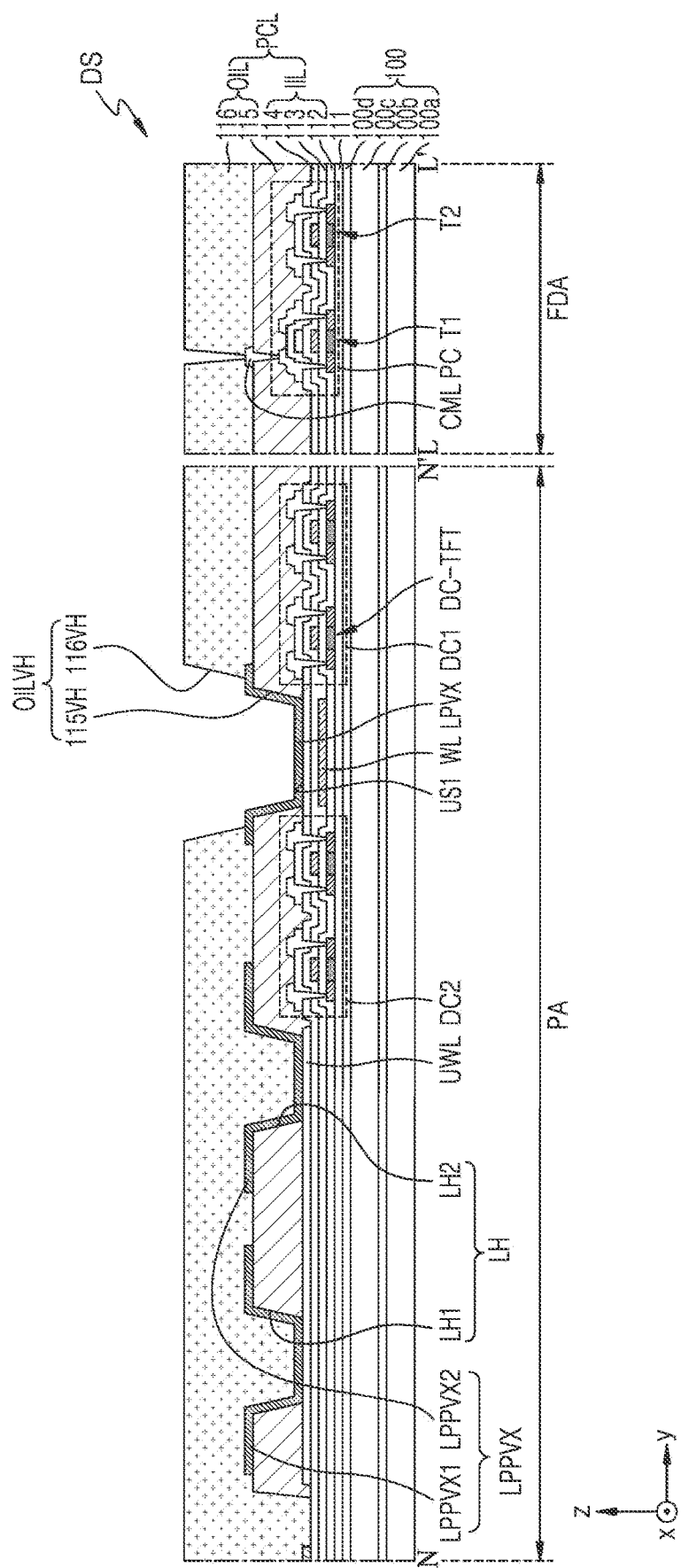

Referring to FIG. 20E, the upper organic insulating layer 116 may be formed. The upper organic insulating layer 116 may overlap the peripheral area PA and the front display area FDA. In an embodiment, the upper organic insulating layer 116 may include a contact hole exposing the connection electrode CML.

The upper organic insulating layer 116 may include the second valley hole 116VH overlapping the first valley hole 115VH. The second valley hole 116VH may expose the lower inorganic pattern layer LPVX. The first valley hole 115VH and the second valley hole 116VH may be the valley hole OILVH of the organic insulating layer OIL.

Figure 20F:
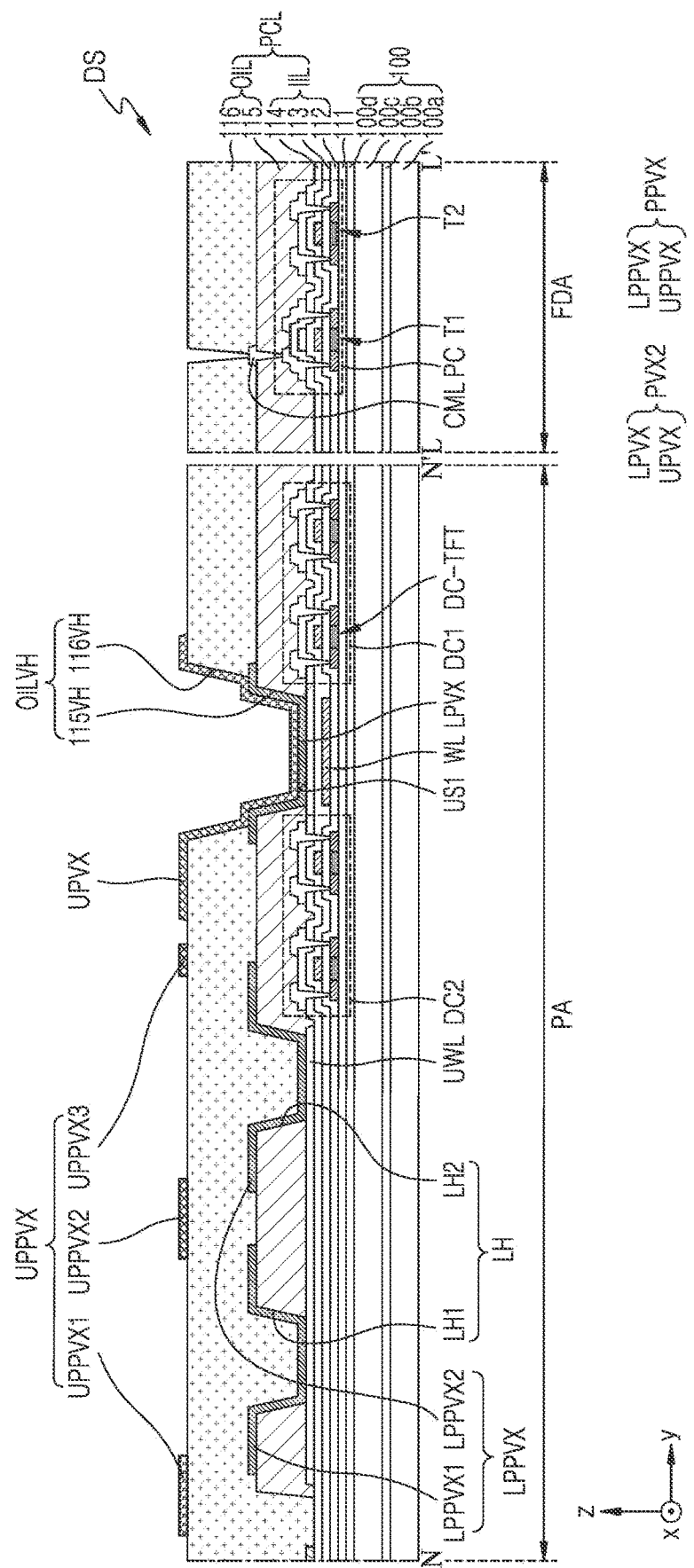

Referring to FIG. 20F, the upper inorganic pattern layer UPVX and the upper peripheral inorganic pattern layer UPPVX may be formed. A process of forming the upper inorganic pattern layer UPVX and the upper peripheral inorganic pattern layer UPPVX may be similar to a process of forming the lower inorganic pattern layer LPVX. For example, the upper inorganic pattern layer UPVX and the upper peripheral inorganic pattern layer UPPVX may be formed by forming an inorganic layer on the upper organic insulating layer 116 and then patterning the inorganic layer.

The upper inorganic pattern layer UPVX may be formed in the valley hole OILVH. In an embodiment, the upper inorganic pattern layer UPVX may be in contact with the lower inorganic pattern layer LPVX. The lower inorganic pattern layer LPVX and the upper inorganic pattern layer UPVX, both being disposed in the peripheral area PA, may be the second inorganic pattern layer PVX2.

The upper peripheral inorganic pattern layer UPPVX may include a plurality of upper peripheral inorganic pattern layers. For example, the upper peripheral inorganic pattern layer UPPVX may include the first upper peripheral inorganic pattern layer UPPVX1, the second upper peripheral inorganic pattern layer UPPVX2, and the third upper peripheral inorganic pattern layer UPPVX3. The plurality of upper peripheral inorganic pattern layers UPPVX may be spaced from one another. The lower peripheral inorganic pattern layer LPPVX and the upper peripheral inorganic pattern layer UPPVX may be the peripheral inorganic pattern layer PPVX.

The second inorganic pattern layer PVX2 may protect the inorganic insulating layer IIL and the wiring WL. In the present embodiment, the first inorganic pattern layer PVX1 described with reference to FIGS. 18A-18I may be formed in the first corner display area CDA1. Furthermore, the peripheral inorganic pattern layer PPVX may be formed in the peripheral area PA. The first inorganic pattern layer PVX1 and the peripheral inorganic pattern layer PPVX may be formed in the patterning process after an inorganic layer is formed on the surface (e.g., the entire surface) of the display substrate DS. In this case, when the first upper surface US1 of the inorganic insulating layer IIL is exposed, the inorganic insulating layer IIL and the wiring WL may be etched or damaged in the patterning process. In the present embodiment, as the second inorganic pattern layer PVX2 is formed on the first upper surface US1 of the inorganic insulating layer IIL in the patterning process, damage to the inorganic insulating layer IIL and the wiring WL may be prevented or reduced.

Figure 20G:
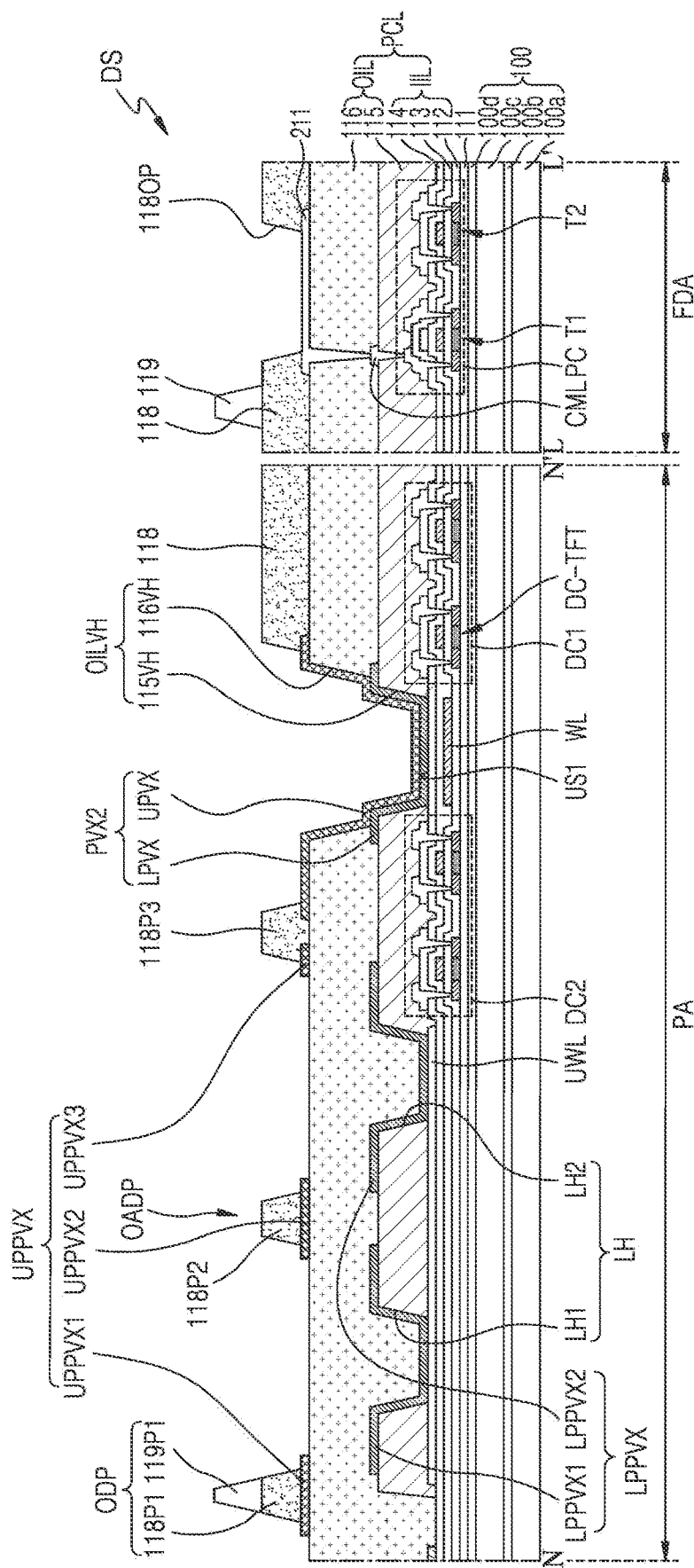

Referring to FIG. 20G, the pixel electrode 211 may be formed in the front display area FDA. Then, the pixel definition layer 118 may be formed. The pixel definition layer 118 may cover an edge of the pixel electrode 211. The pixel definition layer 118 may include the opening 118OP exposing the central portion of the pixel electrode 211.

The organic pattern layer 118P may be formed on the upper peripheral inorganic pattern layer UPPVX. The organic pattern layer 118P may be formed when the pixel definition layer 118 is formed. The organic pattern layer 118P may include the first organic pattern layer 118P1, the second organic pattern layer 118P2, and the third organic pattern layer 118P3, which are spaced from one another.

In an embodiment, the pixel definition layer 118 and the organic pattern layer 118P may be formed by entirely forming an organic layer in the front display area FDA and the peripheral area PA and then patterning the organic layer. In this case, the pixel definition layer 118 and the organic pattern layer 118P may include the same material.

The spacer 119 may be formed on the pixel definition layer 118. The first upper organic pattern layer 119P1 may be formed on the first organic pattern layer 118P1. The first upper organic pattern layer 119P1 and the spacer 119 may include the same material.

The first organic pattern layer 118P1 and the first upper organic pattern layer 119P1 may be the outer dam portion ODP. The second organic pattern layer 118P2 may be the outer auxiliary dam portion OADP.

Figure 20H:
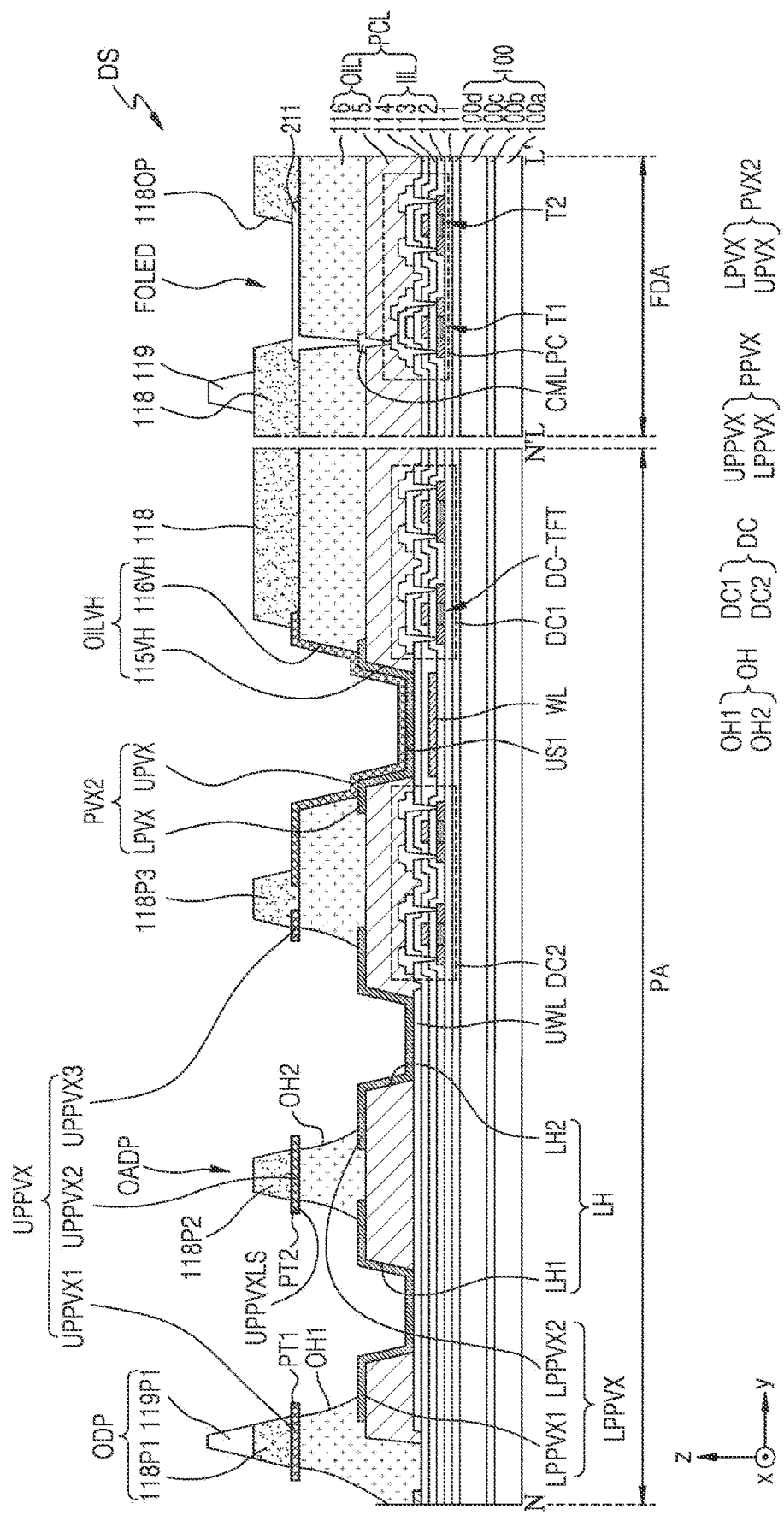

Referring to FIG. 20H, the outer through hole OH overlapping the peripheral area PA may be formed on the upper organic insulating layer 116. In an embodiment, the outer through hole OH of the upper organic insulating layer 116 may be formed through a dry etching process.

In an embodiment, the upper organic insulating layer 116 exposed between the first upper peripheral inorganic pattern layer UPPVX1 and the second upper peripheral inorganic pattern layer UPPVX2 may be etched. Accordingly, the first outer through hole OH1 of the upper organic insulating layer 116 may be formed. In an embodiment, the first outer through hole OH1 may overlap the first lower hole LH1.

In an embodiment, the upper organic insulating layer 116 exposed between the second upper peripheral inorganic pattern layer UPPVX2 and the third upper peripheral inorganic pattern layer UPPVX3 may be etched. Accordingly, the second outer through hole OH2 of the upper organic insulating layer 116 may be formed. The second outer through hole OH2 may overlap the second lower hole LH2.

The first outer through hole OH1 and the second outer through hole OH2 may expose the lower peripheral inorganic pattern layer LPPVX. In an embodiment, the first outer through hole OH1 and the second outer through hole OH2 may expose respective central portions of the lower peripheral inorganic pattern layer LPPVX. For example, the first outer through hole OH1 and the second outer through hole OH2 may expose a center portion of the first lower peripheral inorganic pattern layer LPPVX1 and a center portion of the second lower peripheral inorganic pattern layer LPPVX2 respectively. The lower peripheral inorganic pattern layer LPPVX may prevent or substantially prevent the upper wiring UWL under the lower peripheral inorganic pattern layer LPPVX from being overetched. Accordingly, the lower peripheral inorganic pattern layer LPPVX may prevent or reduce the overetching of the upper wiring UWL, which causes an increase in resistance of the upper wiring UWL.

The upper organic insulating layer 116 disposed under the upper peripheral inorganic pattern layer UPPVX may be overetched. Accordingly, the upper organic insulating layer 116 may have an undercut structure. The lower surface UPPVXLS of the upper peripheral inorganic pattern layer UPPVX may be exposed.

For example, the first upper peripheral inorganic pattern layer UPPVX1 may include the first protruding tip PT1 protruding in the direction toward the center of the first outer through hole OH1. The second upper peripheral inorganic pattern layer UPPVX2 may include the second protruding tip PT2 protruding in the direction toward the center of the first outer through hole OH1.

In an embodiment, when the outer through hole OH is formed, the outer dam portion ODP, the outer auxiliary dam portion OADP, the pixel electrode 211, and the pixel definition layer 118 may be protected by a protection layer. The protection layer may include IZO.

Figure 20I:
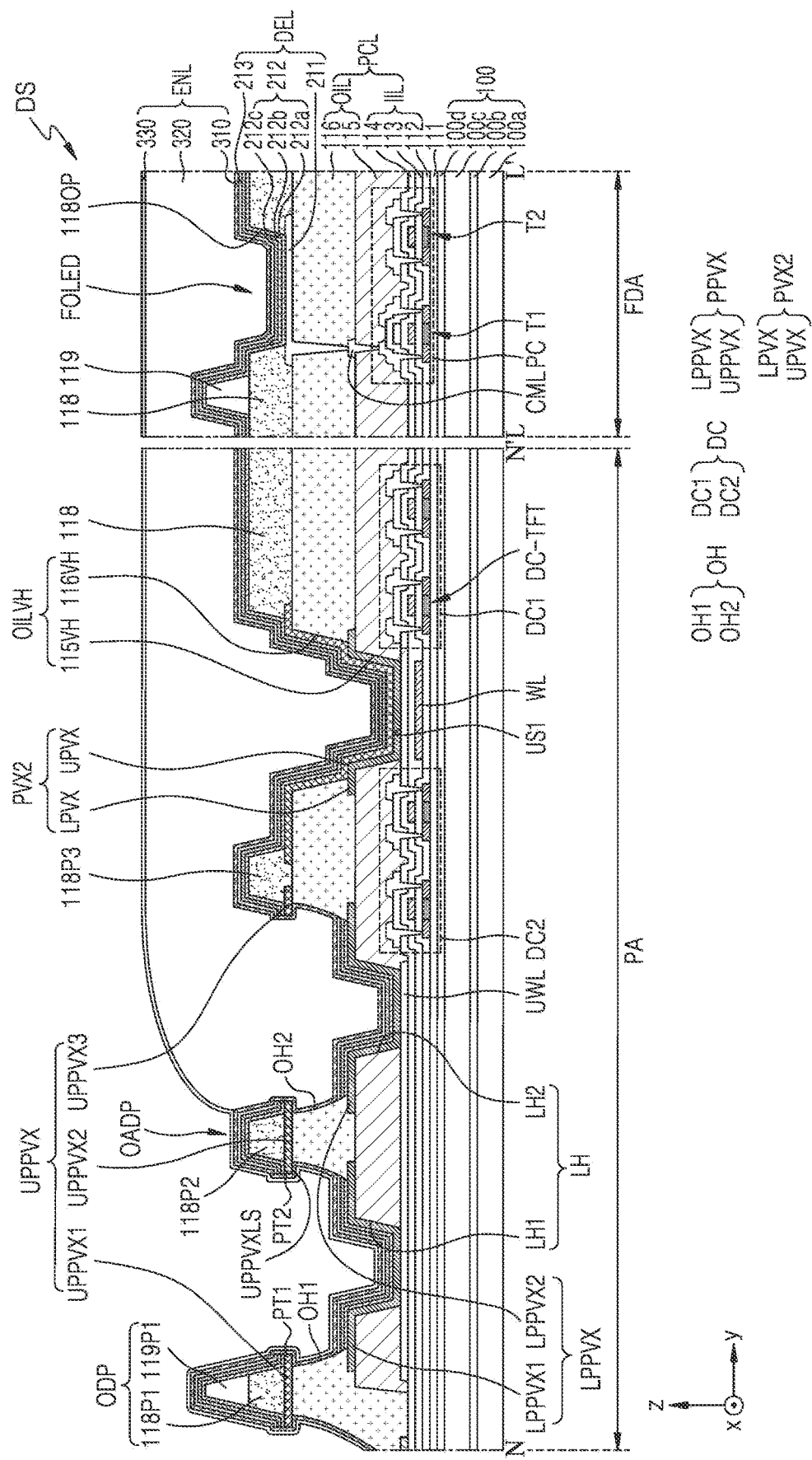

Referring to FIG. 20I, the display element layer DEL may be formed. In an embodiment, the front organic light-emitting diode FOLED may be formed as a display element at or overlapping the front display area FDA. The front organic light-emitting diode FOLED may include the pixel electrode 211, the intermediate layer 212, and the counter electrode 213.

As the upper peripheral inorganic pattern layer UPPVX includes a protruding tip protruding in the direction toward the center of the outer through hole OH, the first functional layer 212a, the second functional layer 212c, and the counter electrode 213 may be disconnected or discontinued with respect to or at the outer through hole OH.

The lower surface UPPVXLS of the upper peripheral inorganic pattern layer UPPVX (e.g., the lower surface UPPVXLS overlapping the outer through hole OH) may not be in contact with the first functional layer 212a, the second functional layer 212c, and the counter electrode 213. Accordingly, infiltration of external moisture and foreign material from the peripheral area PA to the front display area FDA through at least one of the first functional layer 212a or the second functional layer 212c may be prevented or reduced.

The encapsulation layer ENL may be formed on the front organic light-emitting diode FOLED. The encapsulation layer ENL may include at least one inorganic encapsulation layer and at least one organic encapsulation layer. For example, the encapsulation layer ENL may include the first inorganic encapsulation layer 310, the organic encapsulation layer 320, and the second inorganic encapsulation layer 330.

The first inorganic encapsulation layer 310 may be in contact with the lower surface UPPVXLS of the upper peripheral inorganic pattern layer UPPVX. For example, the first inorganic encapsulation layer 310 may be in contact with the first protruding tip PT1 of the first upper peripheral inorganic pattern layer UPPVX1 and the second protruding tip PT2 of the second upper peripheral inorganic pattern layer UPPVX2.

In an embodiment, the organic encapsulation layer 320 may extend to the outer auxiliary dam portion OADP. In another embodiment, the organic encapsulation layer 320 may extend to the third organic pattern layer 118P3. In another embodiment, the organic encapsulation layer 320 may extend to the outer dam portion ODP.

The second inorganic encapsulation layer 330 may be formed on the organic encapsulation layer 320. The second inorganic encapsulation layer 330 may be in contact with the first inorganic encapsulation layer 310 at or on at least one of the outer dam portion ODP or the outer auxiliary dam portion OADP.

Figure 21:
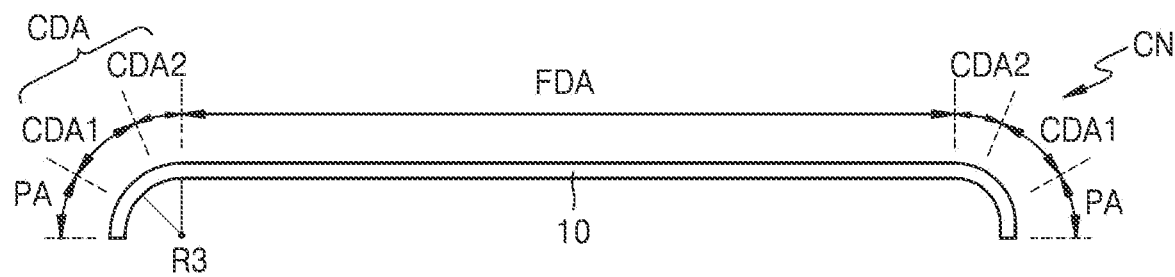
FIG. 21 and FIG. 22 are cross-sectional views of a method of manufacturing a display device according to an embodiment.
Figure 22:
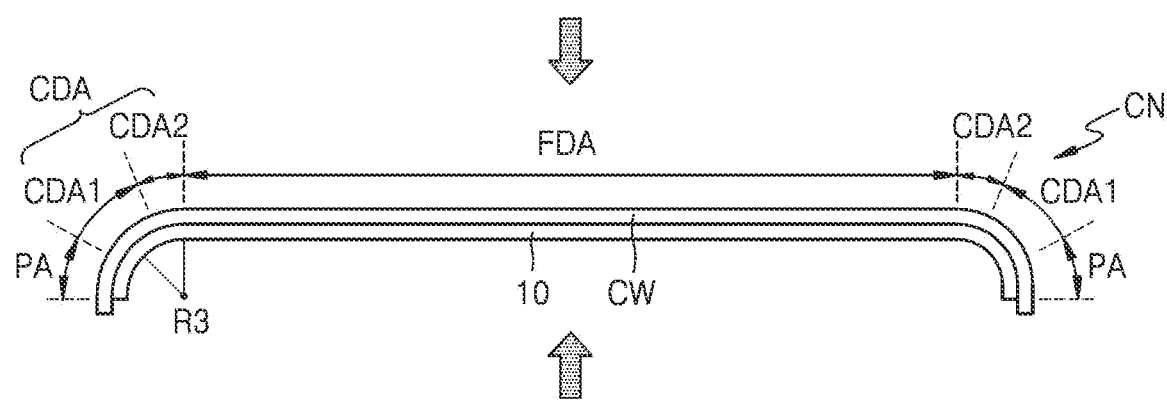

FIGS. 21 and 22 are cross-sectional views of a method of manufacturing a display device according to an embodiment. In FIG. 21 and FIG. 22, the same reference symbols as those of FIG. 6C denote the same members, and repetitive descriptions thereof may not be repeated.

Referring to FIG. 21, the display panel 10 may be bent. The display panel 10 may be the display substrate. In an embodiment, the corner display area CDA overlapping the corner CN of the display panel 10 may be bent. In an embodiment, the corner display area CDA may include the third radius R3 of curvature. In an embodiment, a guide film may be disposed under the display panel 10, and the corner display area CDA may be bent in a vacuum state. In an embodiment, the corner display area CDA may be bent according to a thermoforming method.

Referring to FIG. 22, the cover window CW may be disposed on the display panel 10 manufactured as above. The display panel 10 may be bonded to the cover window CW. In an embodiment, the display panel 10 and the cover window CW may be connected to each other by using an optically clear adhesive. The display panel 10 may be bonded to the cover window CW in a lamination process. Accordingly, the cover window CW may be disposed on the corner display area CDA of the display panel 10.

As described above, the display device according to an embodiment of the disclosure may include a second inorganic pattern layer in contact with a first upper surface of in inorganic insulating layer. Accordingly, as the second inorganic pattern layer protects the first upper surface of the inorganic insulating layer, the reliability of the display device may be improved.

Furthermore, in the method of manufacturing a display device according to an embodiment of the disclosure, a second inorganic pattern layer overlapping a first upper surface of an inorganic insulating layer may be formed by at least partially removing the inorganic layer. Accordingly, the second inorganic pattern layer may be formed without additional process.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:
1. A display device comprising:
  a substrate including a display area and a peripheral area outside the display area;
  an inorganic insulating layer on the substrate;
  an organic insulating layer on a part of the inorganic insulating layer to expose a first upper surface of the inorganic insulating layer, the first upper surface overlapping the peripheral area;
  a display element at the display area, the display element comprising a pixel electrode on the organic insulating layer;
  a pixel definition layer covering an edge of the pixel electrode, the pixel definition layer including an opening that overlaps a central portion of the pixel electrode;
  a first inorganic pattern layer between the organic insulating layer and the pixel definition layer; and
  a second inorganic pattern layer in contact with the first upper surface of the inorganic insulating layer
  wherein the first inorganic pattern layer and the second inorganic pattern layer comprise a same material, wherein the display area comprises a front display area, a first side surface display area extending in a first direction from the front display area, a second side surface display area extending in a second direction crossing the first direction from the front display area, and a corner display area between the first side surface display area and the second side surface display area, and wherein the first inorganic pattern layer is in the corner display area.

2. The display device of claim 1, wherein the inorganic insulating layer comprises a first inorganic insulating layer and a second inorganic insulating layer on the first inorganic insulating layer, and wherein the display device further comprises a wiring overlapping the second inorganic pattern layer, the wiring being between the first inorganic insulating layer and the second inorganic insulating layer.

3. The display device of claim 1, wherein the second inorganic pattern layer extends from the first upper surface of the inorganic insulating layer to an upper surface of the organic insulating layer.

4. The display device of claim 1, wherein the organic insulating layer is a lower organic insulating layer, wherein the display device further comprises an upper organic insulating layer on the lower organic insulating layer, the upper organic insulating layer having a hole overlapping the corner display area, and wherein the first inorganic pattern layer comprises an upper inorganic pattern layer on the upper organic insulating layer, the upper inorganic pattern layer including a protruding tip that protrudes in a direction toward a center of the hole.

5. The display device of claim 4, further comprising an encapsulation layer on the display element, the encapsulation layer comprising an inorganic encapsulation layer and an organic encapsulation layer, wherein the inorganic encapsulation layer is in contact with the protruding tip.

6. The display device of claim 4, wherein the first inorganic pattern layer further comprises a lower inorganic pattern layer between the lower organic insulating layer and the upper organic insulating layer, and wherein the lower inorganic pattern layer is exposed by the hole.

7. The display device of claim 1, further comprising a pad in the peripheral area, the pad comprising a pad electrode that is on the inorganic insulating layer, wherein the organic insulating layer includes a pad opening portion that overlaps the pad electrode, and wherein the inorganic insulating layer, in the peripheral area, is in contact with any one of the organic insulating layer, the pad electrode, and the second inorganic pattern layer.

8. The display device of claim 7, wherein the pad comprises a first pad and a second pad, and wherein the display device further comprises:
a display circuit board electrically connected to the first pad; and
a driving portion electrically connected to the second pad.

9. The display device of claim 7, further comprising a pad wiring electrically connected to the pad, the pad wiring extending to an edge of the peripheral area, wherein the second inorganic pattern layer overlaps the pad wiring and is on the edge of the peripheral area.

10. A display device comprising:
a substrate including a display area and a peripheral area outside the display area;
an inorganic insulating layer on the substrate;
an organic insulating layer on a part of the inorganic insulating layer to expose a first upper surface of the inorganic insulating layer, the first upper surface overlapping the peripheral area;
a display element at the display area, the display element comprising a pixel electrode on the organic insulating layer;
a pixel definition layer covering an edge of the pixel electrode, the pixel definition layer including an opening that overlaps a central portion of the pixel electrode;
a first inorganic pattern layer between the organic insulating layer and the pixel definition layer;
a second inorganic pattern layer in contact with the first upper surface of the inorganic insulating layer;
a driving circuit in the peripheral area and comprising a thin film transistor; and
an encapsulation layer on the display element, extending toward the peripheral area to overlap at least a part of the driving circuit, and comprising an inorganic encapsulation layer and an organic encapsulation layer,
wherein the organic insulating layer includes a valley hole that overlaps the second inorganic pattern layer,
wherein the organic encapsulation layer fills the valley hole, and
wherein the first inorganic pattern layer and the second inorganic pattern layer comprise a same material.

11. A display device comprising:
a substrate including a display area and a peripheral area outside the display area, the display area comprising a front display area, a first side surface display area extending in a first direction from the front display area, a second side surface display area extending in a second direction crossing the first direction from the front display area, and a corner display area between the first side surface display area and the second side surface display area;
an inorganic insulating layer on the substrate;
an organic insulating layer on a part of the inorganic insulating layer to expose a first upper surface of the inorganic insulating layer, the first upper surface overlapping the peripheral area;
a first inorganic pattern layer on the organic insulating layer;
a display element at the corner display area, the display element being on the first inorganic pattern layer; and
a second inorganic pattern layer in contact with the first upper surface of the inorganic insulating layer,
wherein the first inorganic pattern layer and the second inorganic pattern layer comprise a same material, and
wherein the first inorganic pattern layer is in the corner display area.

12. The display device of claim 11, wherein the inorganic insulating layer comprises a first inorganic insulating layer and a second inorganic insulating layer on the first inorganic insulating layer, and wherein the display device further comprises a wiring overlapping the second inorganic pattern layer, the wiring being between the first inorganic insulating layer and the second inorganic insulating layer.

13. The display device of claim 11, wherein the organic insulating layer is a lower organic insulating layer, wherein the display device further comprises an upper organic insulating layer on the lower organic insulating layer, the upper organic insulating layer including a hole that overlaps the corner display area, and wherein the first inorganic pattern layer comprises an upper inorganic pattern layer including a protruding tip that protrudes in a direction toward a center of the hole.

14. The display device of claim 13, further comprising an encapsulation layer on the display element, the encapsulation layer comprising an inorganic encapsulation layer and an organic encapsulation layer, wherein the inorganic encapsulation layer is in contact with the protruding tip.

15. The display device of claim 13, wherein the first inorganic pattern layer further comprises a lower inorganic pattern layer between the lower organic insulating layer and the upper organic insulating layer, and wherein the lower inorganic pattern layer is exposed by the hole.

16. The display device of claim 11, wherein the corner display area comprises a first corner display area and a second corner display area between the first corner display area and the front display area, wherein the display device further comprises a driving circuit that overlaps the second corner display area and the peripheral area, the driving circuit comprises a driving circuit thin film transistor, and wherein the display element overlaps the driving circuit.

17. The display device of claim 16, wherein the organic insulating layer includes a valley hole that overlaps the second inorganic pattern layer, and wherein the driving circuit comprises a first driving circuit and a second driving circuit that are spaced from each other with the valley hole therebetween.

18. The display device of claim 11, wherein the corner display area comprises a first corner display area and a second corner display area between the first corner display area and the front display area, wherein the substrate comprises a body portion that overlaps the front display area and the second corner display area and a plurality of extension portions that extends from the body portion, the plurality of extension portions overlapping the first corner display area, and wherein edges of the plurality of extension portions that neighbor each other are spaced from each other and face each other.

19. The display device of claim 11, wherein the first side surface display area, the second side surface display area, and the corner display area are bent.

20. The display device of claim 11, further comprising a pad that is in the peripheral area, the pad comprising a pad electrode on the inorganic insulating layer, wherein the organic insulating layer includes a pad opening portion that exposes the pad electrode, and wherein the inorganic insulating layer, in the peripheral area, is in contact with any one of the organic insulating layer, the pad electrode, and the second inorganic pattern layer.

21. The display device of claim 20, further comprising a pad wiring that is electrically connected to the pad, the pad wiring extending to an edge of the peripheral area, wherein the second inorganic pattern layer overlaps the pad wiring, the second inorganic pattern layer extending to the edge of the peripheral area.

* * * * *